US006587385B2

(12) United States Patent
Ooishi

(10) Patent No.: US 6,587,385 B2
(45) Date of Patent: *Jul. 1, 2003

(54) CLOCK SYNCHRONOUS SEMICONDUCTOR MEMORY DEVICE HAVING A REDUCED ACCESS TIME

(75) Inventor: Tsukasa Ooishi, Hyogo (JP)

(73) Assignee: Mitsubishi Denki Kabushiki Kaisha, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 09/843,689

(22) Filed: Apr. 30, 2001

(65) Prior Publication Data

US 2001/0019503 A1 Sep. 6, 2001

Related U.S. Application Data

(63) Continuation of application No. 09/467,914, filed on Dec. 21, 1999, now Pat. No. 6,246,614.

(30) Foreign Application Priority Data

Jun. 22, 1999 (JP) .......................................... 11-175309

(51) Int. Cl.[7] ................................................. G11C 7/00
(52) U.S. Cl. ...................................................... 365/191
(58) Field of Search ................................. 365/191, 205, 365/230.03, 230.06

(56) References Cited

U.S. PATENT DOCUMENTS

| 5,386,391 A | | 1/1995 | Watanabe |
| 5,426,606 A | | 6/1995 | Takai |
| 5,719,814 A | * | 2/1998 | Ishikawa ..................... 327/51 |
| 5,815,456 A | | 9/1998 | Rao |
| 5,841,717 A | | 11/1998 | Yamaguchi |
| 5,859,799 A | * | 1/1999 | Matsumoto et al. ... 365/189.09 |
| 6,301,173 B2 | * | 10/2001 | Fujioka et al. .............. 365/203 |

* cited by examiner

Primary Examiner—Hoai Ho
(74) Attorney, Agent, or Firm—McDermott, Will & Emery

(57) ABSTRACT

In successively executed operations modes in a synchronous semiconductor memory device, data access time after the application of a row access command is reduced by providing a plurality of control signal lines, such as a differential pair of sense amplifier enable lines, advantageously shorting the control lines, and then driving the control lines to a predetermined voltage level after the elapse of a prescribed time period.

10 Claims, 28 Drawing Sheets

CLOCK SYNCHRONOUS SEMICONDUCTOR MEMORY DEVICE HAVING A REDUCED ACCESS TIME

This application is a Continuation of application Ser. No. 09/467,914, U.S. Pat. No. 6,246,614 filed Dec. 21, 1999. Priority of Application Serial No. 11-175309, filed on Jun. 22, 1999 in Japan, is claimed under 35 USC 119. The certified priority document was filed in Ser. No. 09/467,914 on Dec. 21, 1999.

BACKGROUND OF THE INVENTION

1. Field of the Invention

The present invention relates to a semiconductor memory device, and particularly a semiconductor memory device in which sense amplifier circuits for sensing and amplifying memory cell data are provided corresponding to respective columns. More particularly, the invention relates to a structure for reducing an access time in a clock synchronous semiconductor memory device operating in synchronization with a clock signal.

2. Description of the Background Art

FIG. 40 schematically shows a structure of an array of a conventional semiconductor memory device. In FIG. 40, a memory cell MC is arranged corresponding to a crossing between a bit line pair BLP and a word line WL. Memory cells MC are arranged in rows and columns. Bit line pairs BLP are arranged corresponding to the memory cell columns, respectively. Word lines WL are arranged corresponding to the memory cell rows, respectively. FIG. 40 shows only one bit line pair BLP and one word line WL representatively. Bit line pair BLP includes bit lines BL and ZBL. In bit line pair BLP, only one of bit lines BL and ZBL is connected to memory cell MC. In FIG. 40, memory cell MC connected to bit line BL is shown representatively. Memory cell MC includes a memory cell capacitor MS for storing information and an access transistor MT turned on in response to a signal potential on word line WL for coupling the memory cell capacitor MS to corresponding bit line BL (or ZBL). Access transistor MT is formed of an n-channel MOS transistor (insulated gate field-effect transistor).

Bit line pair BLP is provided with a sense amplifier circuit SA which in turn is activated in response to a sense amplifier activating signal φSAE for differentially amplifying the potentials on bit lines BL and ZBL, and a column select gate YG for electrically coupling bit lines BL and ZBL to an internal data line pair IOP in accordance with a column select signal CSL. Internal data line pair IOP includes internal data lines I/O and ZI/O for transmitting complementary signals. Internal data line pair IOP is coupled to an input/output circuit NSK. Operation of the semiconductor memory device shown in FIG. 40 will now be described with reference to a signal waveform diagram of FIG. 41.

In a standby cycle, bit lines BL and ZBL are precharged and equalized to an intermediate voltage. Word line WL is in an unselected state, and access transistor MT in memory cell MC is in the off state. Column select signal CSL is at L-level of the unselected state, and column select gate YG is in the off state.

When a memory cycle starts, bit lines BL and ZBL are electrically floated at the precharge voltage. Then, word line WL corresponding to an addressed row is driven to a selected state in accordance with the address signal, and has the voltage level thereof raised. In accordance with this rising of potential on word line WL, access transistor MT included in memory cell MC is turned on and the information stored in memory cell capacitor MS is read onto corresponding bit line BL or ZBL. FIG. 41 shows by way of example a signal waveform in the case where the data at L-level is read onto bit line BL.

When bit line BL is connected to the memory cell, bit line ZBL does not receive the memory cell data, but maintains the precharge voltage level.

When the potential difference on bit line pair BLP sufficiently increases, sense amplifier activating signal φSAE is then activated so that sense amplifier circuit SA differentially amplifies the voltages on bit lines BL and ZBL. This sensing operation of sense amplifier circuit SA decides the voltages on bit lines BL and ZBL to H- and L-levels in accordance with the storage information of memory cell MC.

When sense amplifier circuit SA completes the sensing operation, a column selecting operation is then performed. In the column selecting operation, a column decoder (not shown) drives column select signal CSL corresponding to an addressed column to the H-level of the active state to turn on a column select gate YG, and bit line pair BLP arranged corresponding to the addressed column is electrically coupled to internal data line pair IOP. In accordance with the signals on the internal data lines, input/output circuit NSK produces read data DQ to be externally read. In the data write operation, input/output circuit NSK drives internal data line pair IOP to transmit the write data to bit line pair BLP via selected column select gate YG.

The semiconductor memory device with a memory cell MC of a one-transistor and one-capacitor structure described above is called a dynamic semiconductor memory device (referred to as a "DRAM" hereinafter), and is suitable for achieving high density and high integration because the memory cell occupies a small area.

In the DRAM, however, a capacitance value of memory cell capacitor MS is small, and the voltage difference produced on bit line pair BLP is small in the operation of reading memory cell data. Further, the storage data of a memory cell is destructed when the data is read from the memory cell. Therefore, it is necessary to use sense amplifier circuit SA for amplifying the read data and rewriting the original data into the memory cell.

If the column selection is performed before the bit line voltage becomes stable after sense amplifier circuit SA starts the sensing operation, connection between the internal data lines and the selected column causes variations in voltages on the bit line pair of the selected column. Accordingly, the sense amplifier circuit may malfunction, and the memory cell data may not be accurately read out. Therefore, a period from a time ta when the row selection is performed to a time when the column selection is enabled is usually called a "column interlock period", during which the column selecting operation is inhibited (see FIG. 41). In the DRAM, this period is referred to as a RAS-CAS delay time tRCD, and a finite time is required for the period from the time when a row access for the row selection is instructed to the time when a column access for the column selection is performed.

In the data write operation, a particular problem does not occur even if the memory cell data of a selected column is destructed (the write data is transmitted to the memory cell). However, for providing the same column access timing in both the data read operation and the data write operation, the column selecting operation can be performed only after completion of the operation of the sense amplifier circuit in both the data read mode and the data write mode. Therefore, an access time (RAS access time) tRAC between execution of the row access and subsequent actual external reading of the memory cell data cannot be reduced, and fast access cannot be performed.

Recently, clock synchronous semiconductor memory devices which perform writing and reading of data in synchronization with the clock signal have been in practical use. In this clock synchronous semiconductor memory device, the operation mode is designated by a command applied in synchronization with the clock signal. In this clock synchronous semiconductor memory device, writing and reading of data are performed in synchronization with the clock signal, but the structure of the memory cell array is substantially the same as a standard DRAM.

FIG. 42 shows an example of a command application sequence of the clock synchronous semiconductor memory device. In FIG. 42, a row access command RACT for activating the row selection and a column access command CACT of instructing the column selection and write/read of data are each applied at the rising edge of a clock signal CLK1. Column access command CACT can be applied after elapse of time tRCD from application of row access command RACT. In the clock synchronous semiconductor memory device operating in synchronization with clock signal CLK1, therefore, the time tRCD is equal to a period of two clock cycles.

In the case where the clock synchronous semiconductor memory device operates in synchronization with a fast clock signal CLK2, time tRCD is equal to a period of four clock cycles of clock signal CLK2. Accordingly, even if the operation is performed in synchronization with fast clock signal CLK2, time tRCD cannot be reduced so that fast access cannot be achieved.

SUMMARY OF THE INVENTION

An object of the invention is to provide a semiconductor memory device which allows reduction in access time.

Another object of the invention is to provide a semiconductor memory device which allows an earlier column access start timing.

Still another object of the invention is to provide a semiconductor memory device which can reduce a time between an instruction of start of row selection and an instruction of start of column selection.

Yet another object of the invention is to provide a clock synchronous semiconductor memory device which can reduce a time required between a row access command and a column access command.

A semiconductor memory device according to the invention includes an internal control signal generating circuit responsive to an operation mode instructing signal for generating an internal control pulse signal for performing an operation designated by the operation mode instructing signal. This internal control signal generating circuit includes a circuit for providing a difference in at least one of generation timing and pulse width between a first internal control pulse signal and a subsequent internal control pulse signal when the operation mode instructing signal is successively applied.

When the same operation mode is repeated, the first internal control pulse signal is different in at least one of generation timing and pulse width from the subsequent internal control pulse signal. Accordingly, the operation timing of internal circuits can be set such that the operation in the first operation mode starts at an optimum timing, and the fast operation can be achieved.

In particular, when the operation mode instructing signal is the column access instruction, the column access instruction can be applied at an advanced timing so that fast access can be achieved.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
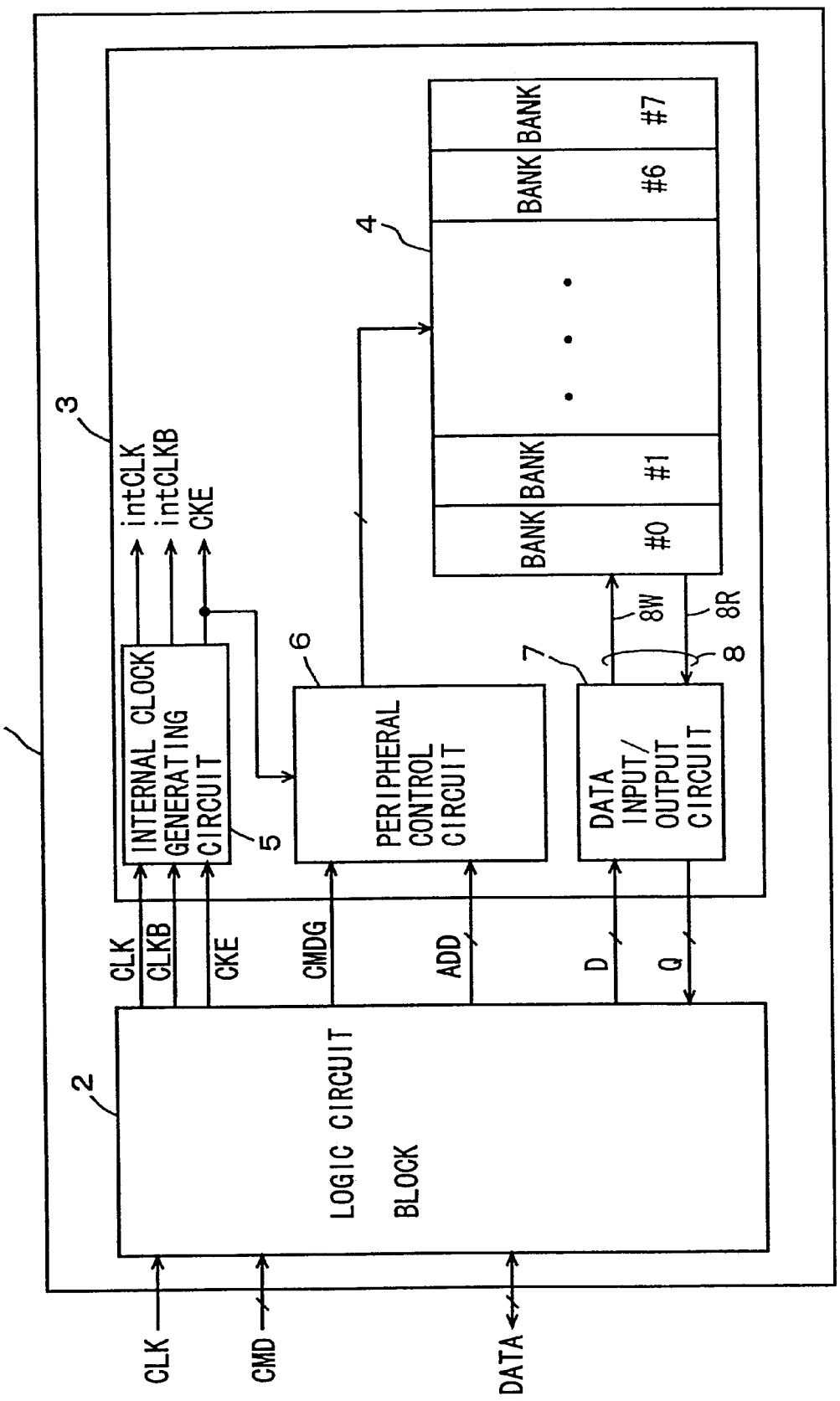
FIG. 1 schematically shows a whole structure of a semiconductor memory device according to a first embodiment of the invention.

FIG. 1 schematically shows a whole structure of a semiconductor integrated circuit device according to a first embodiment of the invention. In FIG. 1, a semiconductor integrated circuit device 1 according to the first embodiment of the invention includes a logic circuit block 2 which operates in accordance with an externally applied clock signal CLK to perform processing according to an applied command CMD as well as input/output of data, and a semiconductor memory device 3 which operates in accordance with complementary clock signals CLK and CLKB received from logic circuit block 2, to transmit write data D and read data Q to and from logic circuit block 2. More specifically, semiconductor integrated circuit device 1 shown in FIG. 1 is a system LSI (system-on chip) with the logic and the memory assembled mixedly.

Semiconductor memory device 3 includes a memory array 4 including banks #0–#7 each having a plurality of memory cells arranged in rows and columns and driven to the active state independently of the others, an internal clock generating circuit 5 producing complementary internal clock signals intCLK and intCLKB in accordance with complementary clock signals CLK and CLKB received from logic circuit block 2 and for producing an internal clock enable signal CKE in accordance with a clock enable signal CKE received from logic circuit block 2, a peripheral control circuit 6 for taking in a command signal group CMDG and an address signal group ADD applied from logic circuit block 2 in accordance with internal clock signals intCLK and intCLKB supplied from internal clock generating circuit 5 to produce signals required for an internal operation, and a data input/output circuit 7 operating in accordance with internal clock signals intCLK and intCLKB supplied from internal clock generating circuit 5 to transfer data between logic circuit block 2 and memory array 4. The data input/output circuit 7 is coupled to memory array 4 via a global data bus 8. Global data bus 8 is provided commonly to banks #0–#7 of memory array 4, and includes a write global data bus 8W for transmitting write data and a read global data bus 8R for transmitting read data.

Since write and read data buses 8W and 8R are provided independently of each other, confliction between the read data and the write data on the same bus does not occur, and fast data transfer can be achieved. It is also possible to write data into one of the banks while reading data from another bank.

FIG. 1 shows a logic circuit block 2 and a clock synchronous semiconductor memory device 3. However, semiconductor integrated circuit device 1 has a system on-chip structure, and includes components such as an SRAM (Static Random Access Memory), a gate array, an FPGA (Field Programmable Gate Array), a nonvolatile RAM (Random-Access Memory) and an ROM (Read-Only Memory).

Figure 2:
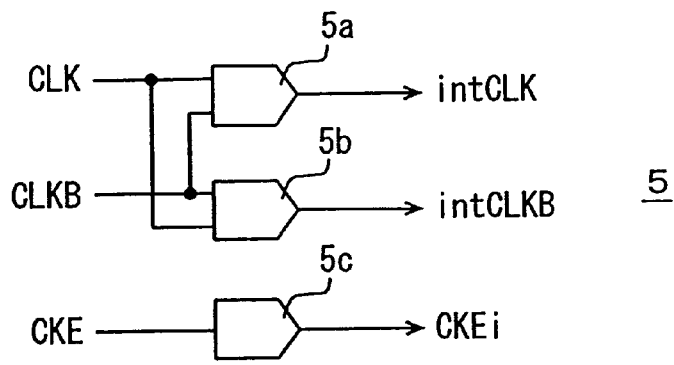
FIG. 2 schematically shows a structure of an internal clock generating circuit shown in FIG. 1.

FIG. 2 schematically shows a structure of internal clock generating circuit 5 shown in FIG. 1. In FIG. 2, internal clock generating circuit 5 includes a clock input buffer 5a for producing internal clock signal intCLK in accordance with clock signals CLK and CLKB received from logic circuit block 2, a clock input buffer 5b for producing internal clock signal intCLKB in accordance with complementary clock signals CLK and CLKB, and a clock input buffer 5c for buffering clock enable signal CKE received from logic circuit block 2 to produce internal clock enable signal CKE.

Clock input buffers 5a and 5b detect crossings between clock signals CLK and CLKB applied thereto, to produce internal clock signals intCLK and intCLKB, respectively. Each of clock input buffers 5a and 5b is formed of, e.g., a differential amplifier circuit. Since internal clock signals intCLK and intCLKB are produced by detecting the crossings between complementary clock signals CLK and CLKB, it is possible to produce internal clock signals intCLK and intCLKB accurately synchronized in phase with clock signals CLK and CLKB, respectively.

Figure 3:
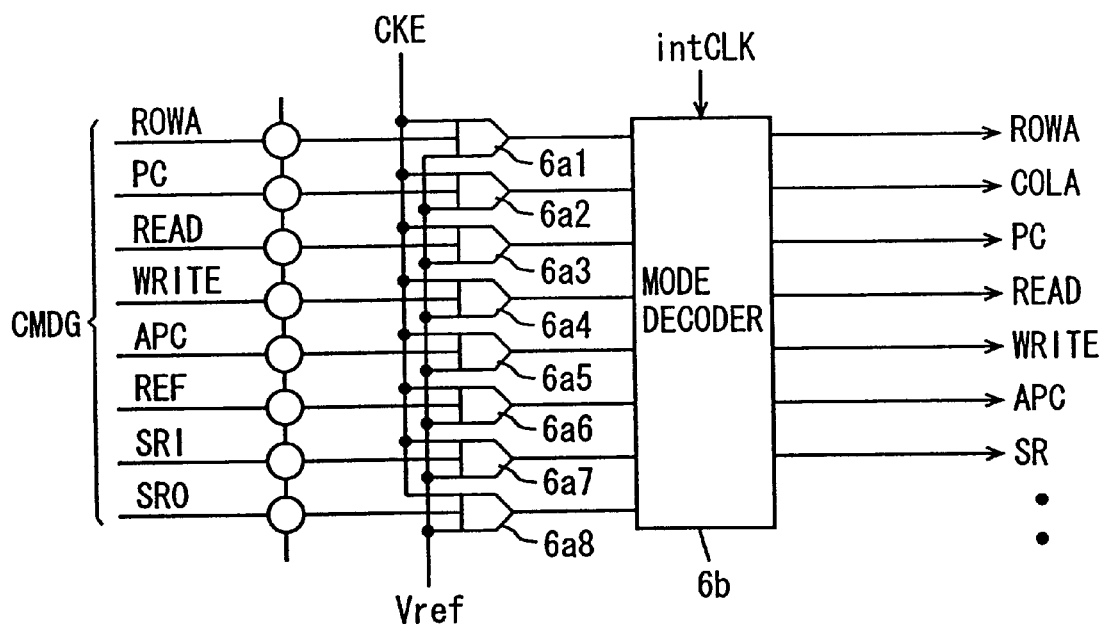
FIG. 3 schematically shows a structure of a peripheral control circuit shown in FIG. 1.

FIG. 3 schematically shows a structure of a portion provided for command signal group CMDG in peripheral control circuit 6 shown in FIG. 1. In FIG. 3, peripheral control circuit 6 includes input buffers 6a1–6a8 provided corresponding to command signals ROWA, PC, READ, WRITE, APC, REF, SRI and SRO, respectively. Each of input buffers 6a1–6a8 is enabled, when clock enable signal CKE is active, to compare a reference voltage Vref with a corresponding command signal to produce an internal command signal in accordance with the result of comparison. Signal ROWA is a row access instructing signal, which instructs an operation of driving a row to the selected state. Signal PC is a precharge instructing signal, which instructs an operation of returning an active array to the precharged state. Signal READ instructs the data read operation. Signal WRITE instructs the data write operation. Signal APC is an automatic precharge instructing signal for returning a selected array (bank) to the precharged state after completion of the data writing or reading. Signal REF instructs the refresh operation. Signal SRI instructs entry in the self refresh mode. Signal SRO instructs completion of the self refresh operation.

The peripheral control circuit 6 further includes a mode decoder 6b receiving the internal command signals from input buffers 6a1–6a8 to produce internal operation instructing signals ROWA, COLA, PC, READ, WRITE, APC and SR in synchronization with internal clock signal intCLK. The operation mode instructing signals generated from mode decoder 6b correspond to the command signals included in command signal group CMDG. Signal COLA is a column access instructing signal which instructs execution of the column selection. This column access instructing signal COLA is driven to the active state when one of read and write operation instruction command signals READ and WRITE is applied. Signal SR is a self refresh mode instructing signal, and is activated in response to activation of self-refresh-in command signal SRI and is reset in response to activation of self-refresh-out command signal SRO.

In semiconductor integrated circuit device 1, logic circuit block 2 and semiconductor memory device 3 are integrated on the same semiconductor chip. Accordingly, logic circuit block 2 can decode in advance a command designating an operation mode for application as the command signal to semiconductor memory device 3, whereby it is possible to reduce a circuit scale of semiconductor memory device 3 and a time required for decoding operation, and the internal operation start timing can be advanced.

Figure 4:
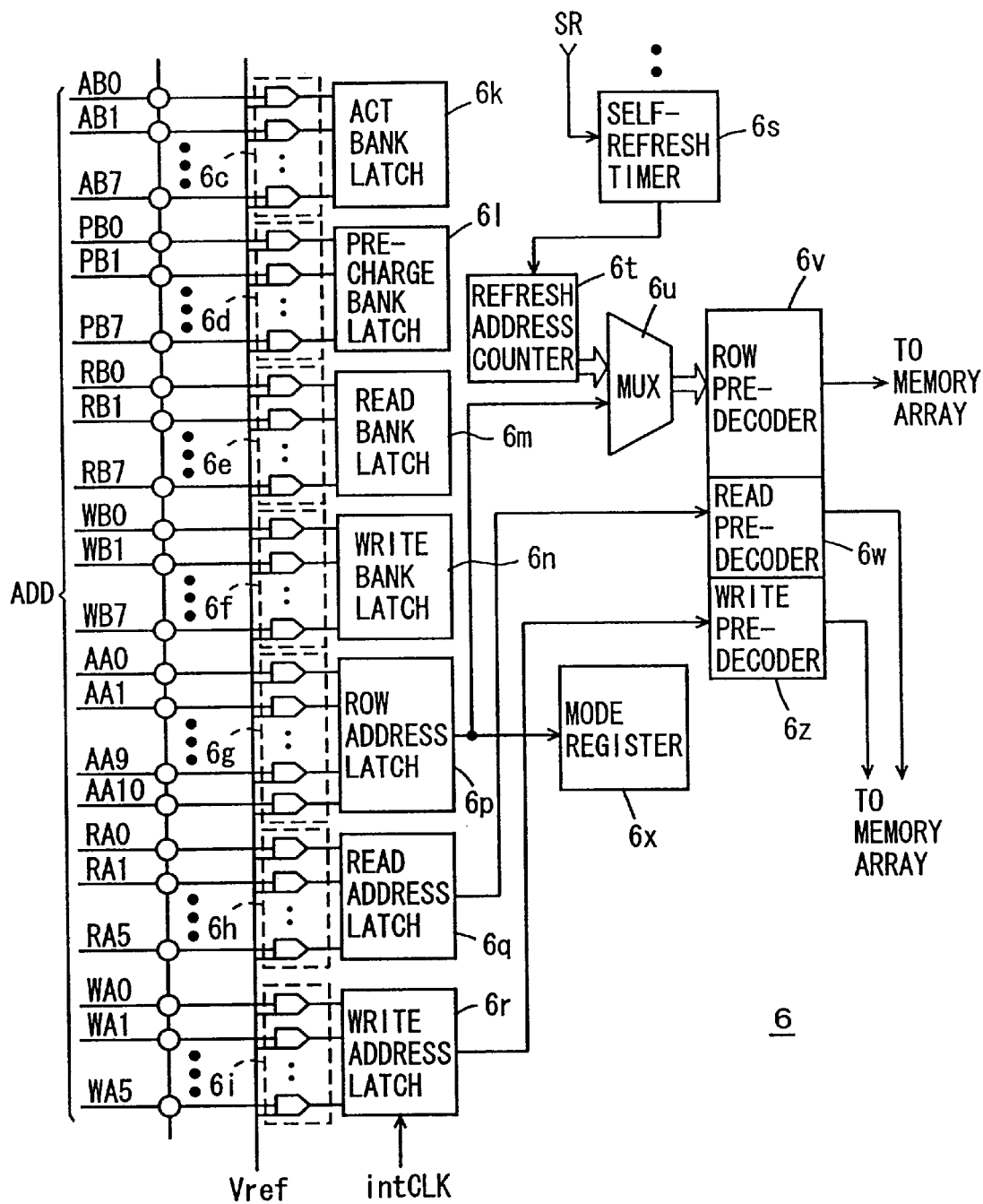
FIG. 4 schematically shows a structure of the peripheral control circuit shown in FIG. 1.

FIG. 4 schematically shows a structure of peripheral control circuit 6 shown in FIG. 1, and more specifically a portion related to address signal group ADD. Address signal group ADD includes act bank address signals AB0–AB7 designating a bank to be activated, precharge bank address signals PB0–PB7 designating a bank to be precharged, read bank address signals RB0–RB7 designating a bank from which data is to be read, write bank address signals WB0–WB7 designating a bank into which data is to be written, act address signals AA0–AA10 designating a row to be selected in a selected bank (i.e., a bank designated by the act bank address signals), read address signals RA0–RA5 designating a column for data reading in the bank designated by read bank address signals RB0–RB7, and write address signals WA0–WA5 designating a column for data writing in the bank designated by write bank address signals WB0–WB7.

As already described, logic circuit block 2 is integrated on the same chip as this semiconductor memory device 3. Accordingly, one of eight banks #0–#7 shown in FIG. 1 can be specified at an early timing by decoding and producing the bank designating signal in logic circuit block 2.

The peripheral control circuit 6 further includes an input buffer circuit 6c provided for act bank address signals AB0–AB7, an input buffer circuit 6d provided for precharge bank address signals PB0–PB7, an input buffer circuit 6e provided for read bank address signals RB0–RB7, an input buffer circuit 6f provided for write bank address signals WB0–WB7, an address input buffer circuit 6g provided for act address signals AA0–AA10, an address input buffer circuit 6h provided for read address signals RA0–RA5, and an address input buffer circuit 6i provided for write address signals WA0–WA5. Each of input buffer circuits 6c–6i includes a buffer (comparator circuit), which in turn compares a corresponding address signal with reference voltage Vref to produce an internal address signal.

Peripheral control circuit 6 further includes an act bank latch 6k receiving act bank address signals AB0–AB7 via input buffer circuit 6c, a precharge bank latch 6l receiving precharge bank address signals PB0–PB7 via input buffer circuit 6d, a read bank latch 6m receiving read bank address signals RB0–RB7 via input buffer circuit 6e, a write bank latch 6n receiving write bank address signals WB0–WB7 via input buffer circuit 6f, a row address latch 6p receiving act address signals AA0–AA10 via input buffer circuit 6g, a read address latch 6q receiving read address signals RA0–RA5 via input buffer circuit 6h, and a write address latch 6r receiving write address signals WA0–WA5 via input buffer circuit 6i.

These bank latches 6k–6n and address latches 6p–6r take in and latch the applied address signals in response to rising of internal clock signal intCLK. In accordance with a combination of the output signals of bank latches 6k–6r and an operation mode instructing signal applied from the mode decoder shown in FIG. 3, a designated operation is executed on a designated bank.

Peripheral control circuit 6 further includes a self refresh timer 6s performing a time counting operation in response to activation of self refresh instructing signal SR applied from the mode decoder shown in FIG. 3, a refresh address counter 6t performing counting in accordance with a refresh request signal applied from self refresh timer 6s to produce a refresh address, a multiplexer (MUX) 6u for selecting one of the output address signal of refresh address counter 6t and the address signal applied from row address latch 6p in accordance with self refresh mode instructing signal SR (not shown), a row predecoder 6v for predecoding the output address signal of multiplexer (MUX) 6u for application to the row decoder of the memory array, a read predecoder 6w for predecoding the address signal applied from read address latch 6q to apply the predecoded signal to a reading column decoder (not shown), a write predecoder 6z for predecoding the address signal applied from write address latch 6r to apply the predecoded signal to a write column decoder (not shown), and a mode register 6x activated upon reception of a set mode register command, to store a predetermined address signal applied from row address latch 6p.

Self refresh timer 6s generates a refresh request to refresh address counter 6t at predetermined intervals when self refresh instructing signal SR is active. Self refresh timer 6s in the active state counts, e.g., internal clock signals intCLK and intCLKB, to produce the refresh request at predetermined refresh intervals. Mode register 6x designates, e.g., an operation mode of the semiconductor memory device, such as a column latency required from designation of the column access to the output of valid data, and designation of either of a transparence mode or a register mode as the output mode of data. Mode register 6x may store data designating a data bit width.

Figure 5:
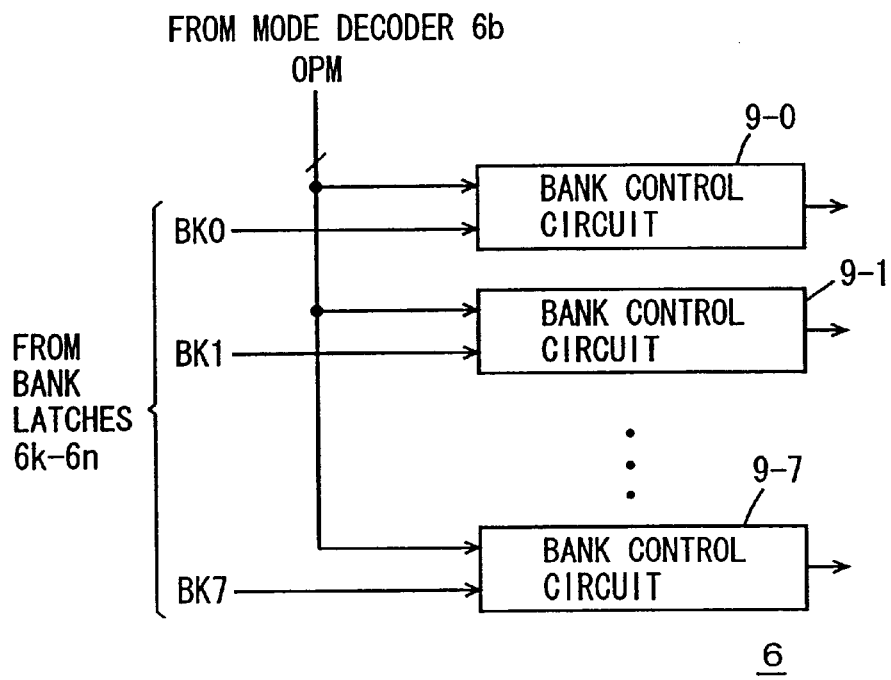
FIG. 5 schematically shows a structure of the peripheral control circuit shown in FIG. 1.

FIG. 5 schematically shows a structure of a portion included in peripheral control circuit 6 of the semiconductor memory device shown in FIG. 1. In FIG. 5, peripheral control circuit 6 includes bank control circuits 9-0–9-7 provided corresponding to banks #0–#7, respectively, and receiving an operation mode instructing signal OPM from mode decoder 6b and bank designating signals from bank latches 6k–6n. Bank control circuits 9-0–9-7 receive bank designating signals BK0–BK7 from corresponding bank latches 6k–6n, respectively. Bank designating signals BK0–BK7 each generically represent the act bank address signal, precharge bank address signal, read bank address signal and write bank address signal. Accordingly, in the bank designated by bank designating signals BK0–BK7, the operation designated by the operation mode instructing signal OPM (various operation mode designating signals ROWA, COLA and others) applied from mode decoder 6b is executed.

The operation mode instructing signal includes row access instructing signal ROWA related to row selection, precharge instructing signal PC, column access instructing signal COLA related to column selection, read operation instructing signal READ, data write instructing signal WRITE and auto-precharge instructing signal APC. For column selection, the data read bus and the data write bus are provided independently of each other. Therefore, four operation mode instructing signals ROWA, PC, READ and WRITE can be applied, in parallel, to four different banks. These completely independent operations of the four banks are achieved owing to provision of bank control circuits 9-0–9-7 corresponding to banks #0–#7, respectively. Accordingly, logic circuit block 2 can transfer necessary data without interruption.

Figure 6:
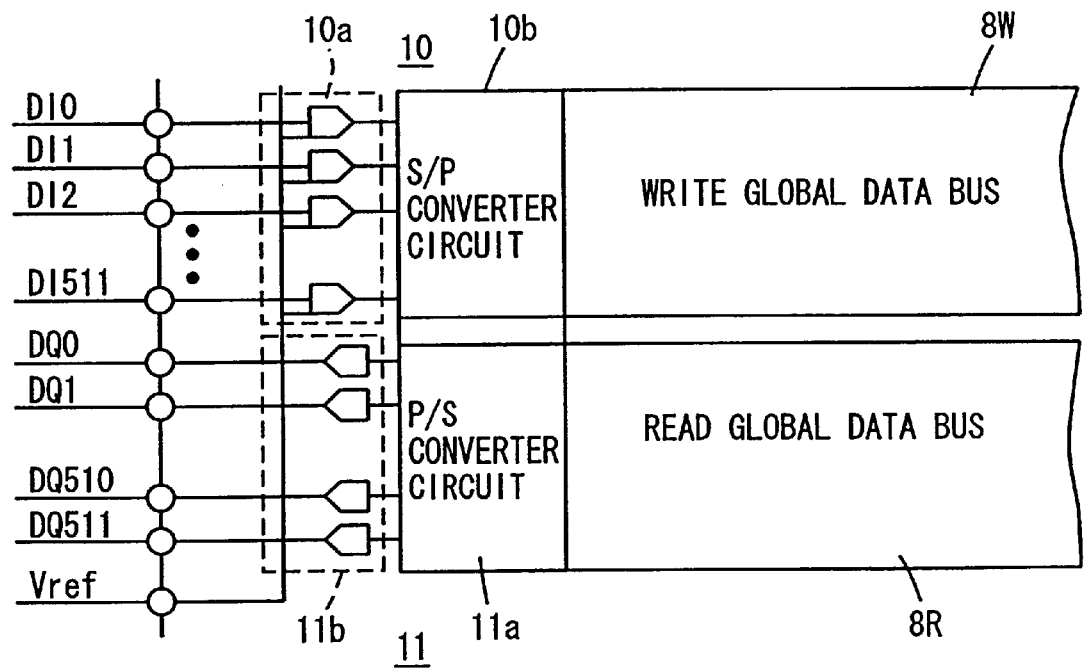
FIG. 6 schematically shows a structure of a data input/output circuit shown in FIG. 1.

FIG. 6 schematically shows a structure of data input/output circuit 7 shown in FIG. 1. In FIG. 6, data input/output circuit 7 includes a write circuit 10 provided for write global data bus 8W, and a read circuit 11 provided for read global data bus 8R. Write circuit 10 includes an input buffer circuit 10a receiving write data DI0–DI511 of 512 bits applied from logic circuit block 2, and a serial/parallel converter circuit 10b for performing serial to parallel conversion of data applied from input buffer circuit 10a, for transmission onto write global data bus 8W. Serial/parallel converter circuit 10b receives the write data at the rising and falling edges of the fast clock signal, and converts the received write data into parallel write data for transmission onto write global data bus 8W. Thereby, the transfer speed of the write data in the semiconductor memory device can be half the transfer speed of input data DI0–DI511, so that the internal operation margin can be made sufficiently large.

Read circuit 11 includes a parallel/serial converter circuit 11a for converting the data applied via read global data bus 8R into serial data, and an output buffer circuit 11b for buffering the data received from parallel/serial converter circuit 11a to produce output data DQ0–DQ511. Parallel/serial converter circuit 11a adjusts the data transfer speed by successively outputting the read data, which is transmitted via read global data bus 8R, at the rising and falling edges of the clock signal. These serial/parallel converter circuit 10b and parallel/serial converter circuit 11a executes the serial to parallel conversion and the parallel to serial conversion when the data transfer speed outside the semiconductor memory device is faster than the operation speed inside the semiconductor memory device.

As shown in FIG. 6, input/output of data is executed 512 bits at a time. Logic circuit block 2 and semiconductor memory device 3 are integrated on the same semiconductor chip, and the data bus between logic circuit block 2 and semiconductor memory device 3 can be arranged with a width merely determined by the minimum size of the interconnection lines, without any influence by the pitch of pin terminals. Accordingly, the data bus having a large bit width can be arranged, and data of 512 bits can be transferred in one transfer cycle, and the fast data transfer can be achieved.

Figure 7:
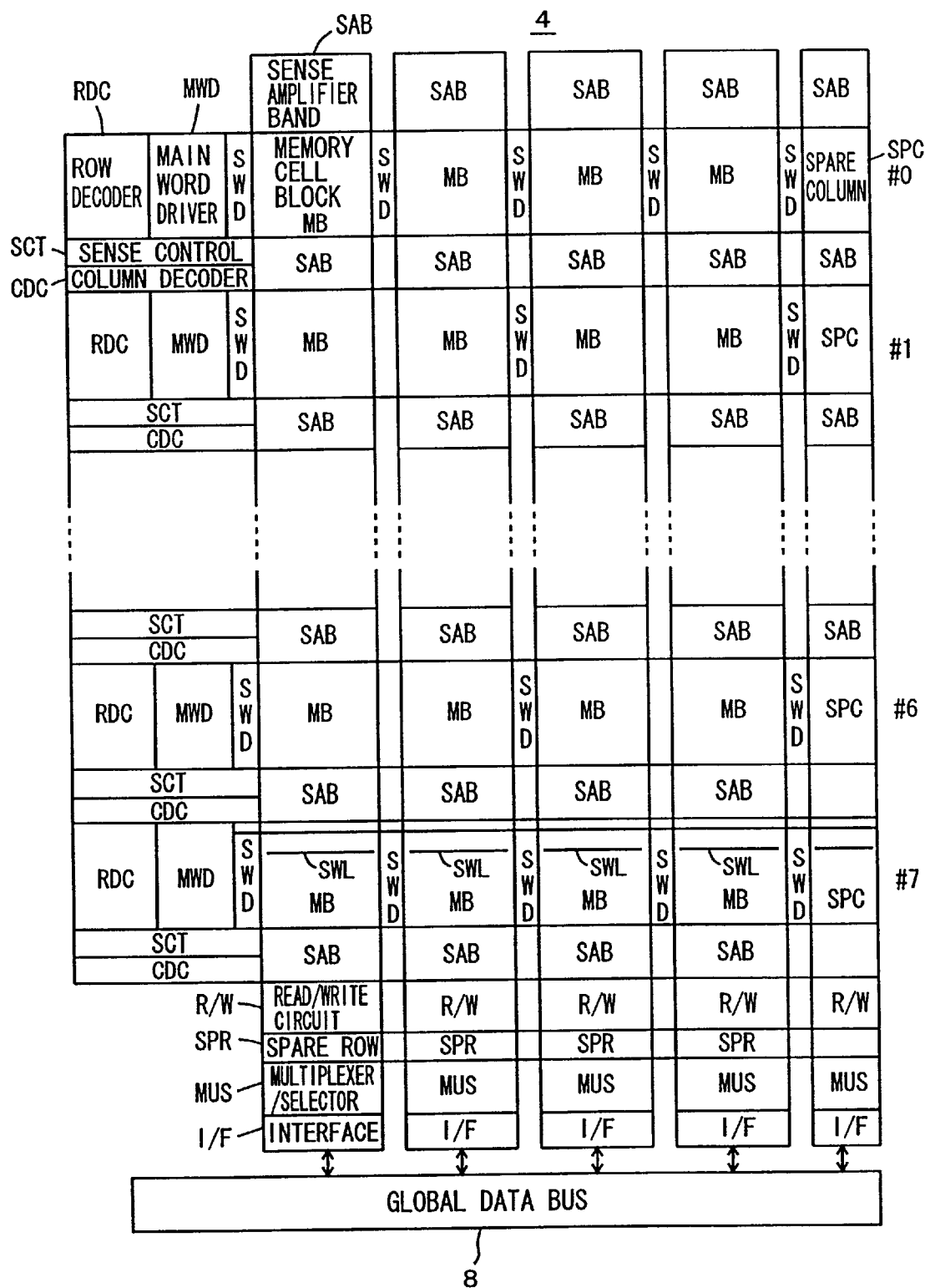
FIG. 7 schematically shows a structure of a memory array shown in FIG. 1.

FIG. 7 schematically shows a structure of memory array 4 shown in FIG. 1. As shown in FIG. 7, memory array 4 is divided into eight memory banks #0–#7. These banks #0–#7 have the same structure. Each of memory banks #0–#7 includes memory cell blocks MB each having a plurality of memory cells arranged in rows and columns, and a spare column circuit SPC for repairing a defective column. Spare column circuit SPC repairs a defective column(s) on a bank basis.

Each of memory banks #0–#7 includes main word lines MWL provided commonly to memory cell blocks MB aligned in the row direction, and sub-word lines SWL arranged in each of memory cell blocks MB and connected to memory cell rows in corresponding memory cell blocks. Sub-word lines SWL are driven by sub-word line drive circuits included in sub-word line driver bands SWD arranged between the memory cell blocks. Each of memory banks #0–#7 includes a row decoder RDC for decoding the row predecode signal applied from row predecoder 6v shown in FIG. 4, and a main word driver MWD for driving a main word line MWL to the selected state in accordance with the output signal of row decoder RDC.

Sense amplifier bands SAB are arranged on the opposite sides in the column direction of memory cell block MB. Sense amplifier band SAB includes sense amplifier circuits provided corresponding to the columns in a corresponding memory cell block, and column select gates for selecting a sense amplifier in accordance with the column select signal applied from column decoder CDC. Column decoder CDC is supplied with the predecode signals from read predecoder 6w and write predecoder 6z shown in FIG. 4 separately. As will be described later in greater detail, memory array 4 is provided with separated read and write data buses extending in the column direction over memory array 4 for transmitting the read data and the write data, respectively. Electrical connection between the write data bus and the sense amplifier circuits is performed independently of electrical connection between the read data bus and the sense amplifier circuits.

For driving the sense amplifier band SAB on a bank basis, a sense control circuit SCT is provided in each of memory banks #0–#7. The arrangement of the sense amplifiers shown in FIG. 7 is a shared sense amplifier structure (more precisely, an alternately arranged, shared sense amplifier structure, in which each sense amplifier band SAB is commonly used by memory cell blocks MB on the opposite sides thereof in the column direction). The operations of these row decoder RDC, column decoder CDC and sense control circuit SCT are controlled on a bank basis by bank control circuits 9-0–9-7 shown in FIG. 5. Since the sense amplifier band SAB is commonly used by different banks, appropriate arbitration such as saving of memory cell data is performed for activation of the memory bank adjacent to a selected memory bank when the banks are activated.

In each of memory banks #0–#7, column decoder CDC selects a column select gate included in sense amplifier band SAB and, at the same time, selects the corresponding spare column circuit SPC. Upon repairing a defective column, it is not determined whether the defective column is addressed or not, and a corresponding spare column in the corresponding spare column circuit SPC is selected at the same time as selection of the defective column in memory cell block MB.

Since the column selection can be performed without waiting the determination of whether the defective column address is designated or not, the column selecting operation can be performed fast because the column selection start timing can be made advanced.

Memory array 4 further includes a read/write circuit R/W for transmitting the write data and read data to and from the read data bus and the write data bus extending in the column direction, a spare row circuit SPR for repairing a defective row, a multiplexer/selector MUS for selecting the read data bus and the write data bus, and an interface circuit I/F for transmitting data between global data bus 8 and multiplexer/selector MUS.

Spare row circuit SPR is provided commonly to memory banks #0–#7. Although not clearly shown in FIG. 7, spare row circuit SPR is provided commonly to memory banks #0–#7, and spare row circuit SPR also includes the sense amplifier circuits and the column select gates. In spare row circuit SPR, repairing of the defective row may be executed a sub-word line SWL at a time or a main word line MWL at a time.

Multiplexer/selector MUS, a specific structure of which will be described later, executes selection of the read and write data buses as well as repairing of a defective write data bus by shifting (shift redundancy). By repairing a defective bit through the shift redundancy of the data bus, isolation of the defective data bus and connection of the spare data bus to the global data bus can be performed by the shift operation in parallel with the column selecting operation, so that fast data access can be performed.

Figure 8:
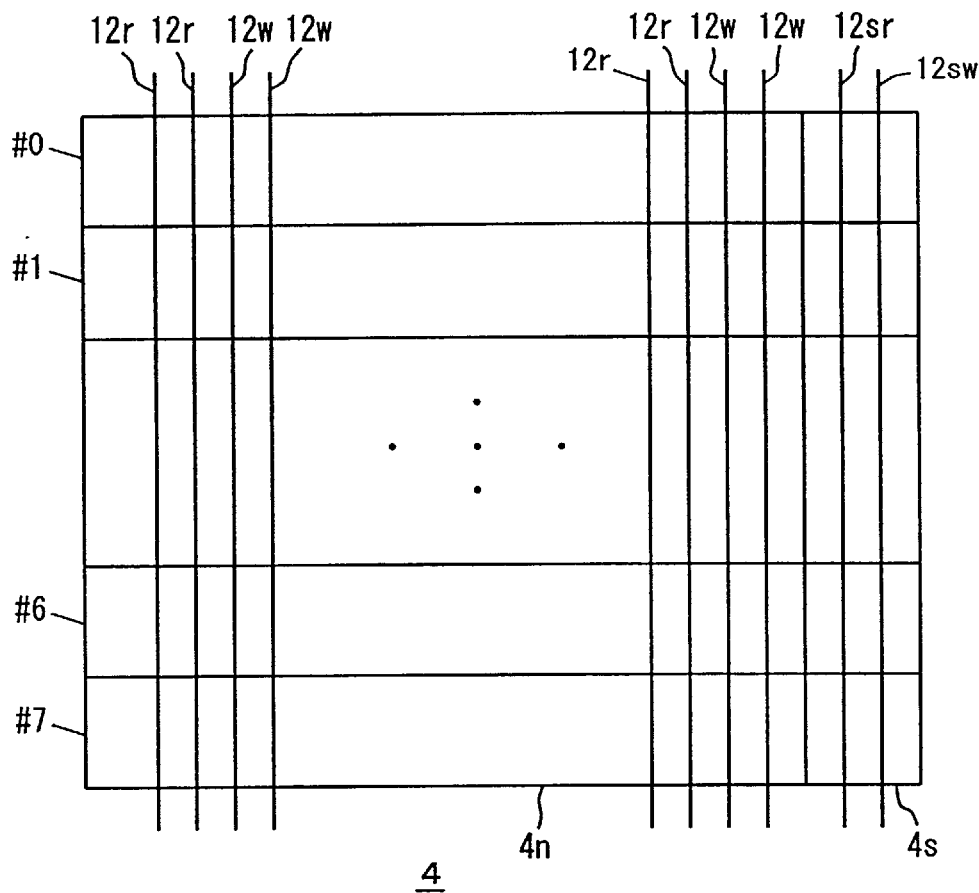
FIG. 8 schematically shows an arrangement of internal data buses of the memory array shown in FIG. 1.

FIG. 8 shows the arrangement of the write and read data buses above memory array 4. As shown in FIG. 8, read data line pairs 12r and write data line pairs 12w extend in the column direction over memory array 4, and can transmit the write and read data for memory banks #0–#7. In spare column region 4s, a spare read data line pair 12sr and a spare write data line pair 12sw are arranged.

In the data read operation, data are read simultaneously onto read data line pair 12r in normal memory array 4n and spare read data line pair 12sr in spare array region 4s. In the data write operation, multiplexer/selector MUS performs the defective bit repairing. When the defective bit does not exist, the write data is not transmitted onto spare write data line pair 12sw.

As shown in FIG. 8, read data line pairs 12r and write data line pairs 12w extending in the column direction are arranged on normal memory array region 4n. Accordingly, the read and write data buses each can have a large bus width, so that read global data bus 8R and write global data bus 8W of global data bus 8 each can have a large bit width.

Figure 9:
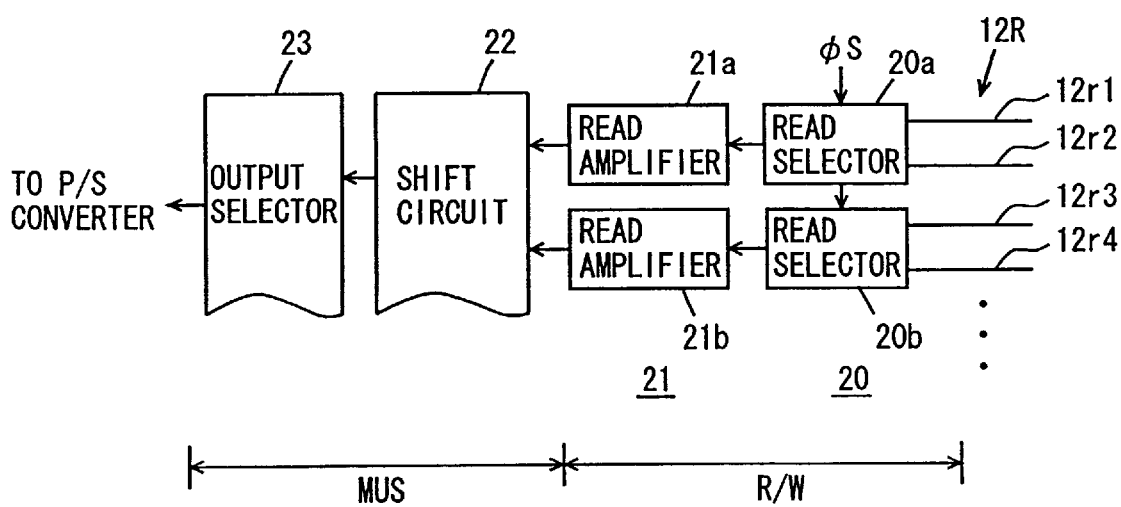
FIG. 9 schematically shows structures of a read/write circuit and a multiplexer/selector shown in FIG. 7.

FIG. 9 schematically shows a structure of read/write circuit R/W and multiplexer/selector MUS shown in FIG. 7. FIG. 9 shows a structure of a data read portion. As read data bus 12R, four read data line pairs 12r1–12r4 are shown representatively.

Read/write circuit R/W includes a read select circuit 20 provided for read data bus 12R for selecting a half of the read data line pairs in accordance with a select signal φS, and a read amplifier circuit 21 for amplifying data on the read data line pairs selected by read select circuit 20. FIG. 9 representatively shows read selector 20a provided for read data line pairs 12r1 and 12r2, read selector 20b provided for read data line pairs 12r3 and 12r4, a read amplifier 21a provided for read selector 20a and a read amplifier 21b provided for read selector 20b.

Column decoder CDC shown in FIG. 7 performs four-to-one selection. Accordingly, in the case where one row in a memory bank is formed of 4 Kbits, for example, column decoder CDC selects the memory cells of 1 Kbits. From read data bus 12R of 1 Kbits, read select circuit 20 selects the data of 512 bits. By reducing the number of bits of the column address signal applied to column decoder CDC, the speed of column address decoding is increased. Select signal φS applied to read select circuit 20 is produced in accordance with the column address signal.

Multiplexer/selector MUS includes a shift circuit 22 for repairing the data of a defective bit in the output data of read amplifier circuit 21 through the shift operation, and an output selector 23 for selecting the data of a desired bit width from the read data generated from shift circuit 22. Output selector 23 can select the data bit width in a range from 512 bits to 64 bits. Output selector 23 determines validity/invalidity of lowest bits of the column address signal in accordance with the output data bit width. For example, output selector 23 does not perform the selection and outputs the data bits received from shift circuit 22, when the output data is 512 bit data. When the output data is 64 bit data, 3 bits of the column address signal are decoded to select the data of 64 bits from data of 512 bits.

Figure 10:
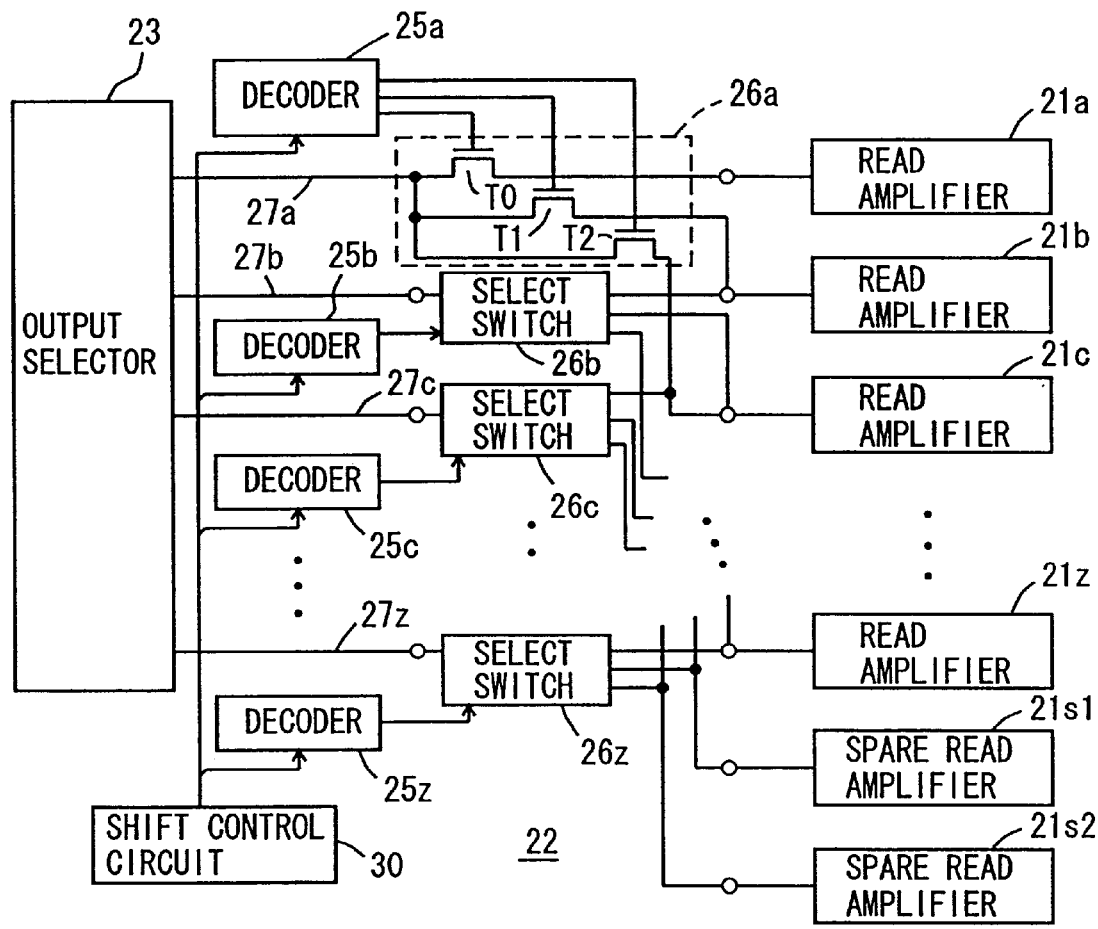
FIG. 10 shows a specific structure of a shift circuit shown in FIG. 9.

FIG. 10 schematically shows a structure of shift circuit 22 shown in FIG. 9. In FIG. 10, shift circuit 22 includes selector switches 26a–26z provided corresponding to input nodes 27a–27z of output selector 23, respectively. Each of selector switches 26a–26z includes three transfer gates T0–T2, and couples a corresponding input node 27 of output selector 23 to one of the three read amplifiers. Input nodes 27a–27z of output selector 23 correspond to read amplifiers 21a–21z, respectively.

For selecting the data on a spare read data line pair under control of shift control circuit 30, there are provided spare read amplifiers 21s1 and 21s2. Spare read amplifier 21s1 is connected to one of adjacent two input nodes 27y and 27z of output selector 23 via the selector switch upon repairing a faulty bit. Spare read amplifier 21s2 is selectively connected to input nodes 27z and 27y of output selector 23 via selector switch 26z. Read amplifiers 21a–21z can be connected to one of the three adjacent adjacent input nodes of output selector 23.

Decoders 25a–25z, which generate a select signal in accordance with the shift control signal applied from shift control circuit 30, are provided corresponding to selector switches 26a–26z, respectively. Each of decoders 25a–25z decodes the shift control signal applied from shift control circuit 30, and selectively turns on the three transfer gates T0–T2 included in the corresponding selector switch.

For example, when data of a defective bit is read to read amplifier 21a, transfer gates T0 and T2 of each of selector switches 26a–26z are turned off, and transfer gate T1 is turned on, so that read amplifiers 21b–21z are connected to input nodes 27a–27z (not shown) of output selector 23, respectively. Input node 27z of output selector 23 is supplied with the output signal of spare read amplifier 21s1 or 21s2 via selector switch 26z. Thereby, the defective bit read to read amplifier 2 1a is replaced with the read data applied from spare read amplifier 21s1 or 21s2, and the defective bit is repaired. One read amplifier can be connected to three input nodes of output selector 23. Therefore, the defect of two bits applied from the read amplifiers can be repaired. One read data line pair transmits the data read from one of the four sense amplifiers. Accordingly, defective columns of 2 bits can be repaired (for one bit defect, four columns are collectively replaced as one set).

Figure 11:
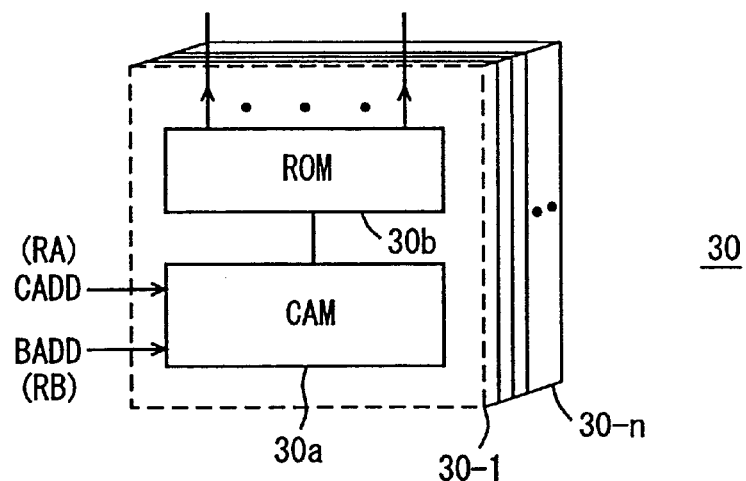
FIG. 11 schematically shows a structure of a shift control circuit shown in FIG. 10.

FIG. 11 schematically shows a structure of shift control circuit 30 shown in FIG. 10. In FIG. 11, shift control circuit 30 includes spare determining circuits 30-1–30-n provided corresponding to the redundant circuits (spare column circuits), respectively. Each of spare determining circuits 30-1–30-n includes a content addressable memory (CAM) 30a for receiving a column address signal CADD and a bank address signal BADD to determine match/mismatch with a defective address stored therein, and a read only memory (ROM) 30b for generating the control signal stored therein in accordance with the match detecting signal applied from content addressable memory 30a. Read only memory 30b applies the control signal designating the connection path to corresponding spare determining circuits 30-1-30-n. The output signals of spare determining circuits 30-1–30-n are wired-connected. Thereby, a connection path can be individually established in each of selector switches 26a–26z, and a defective bit is isolated from output selector 23.

Shift control circuit 30 performs the spare determining operation in parallel with the column selecting operation, and merely required to establish the connection paths of selector switches 26a–26z when a defective bit is read out from read amplifier 21a–21z. Accordingly, the defective bit can be repaired without adversely affecting the column selecting operation.

Repairing of the defective row is performed by using the spare row circuit(s). Such a structure is employed that a spare row and a defective row are simultaneously selected. The defective row is programmed with fuses to be held in the unselected state, so that no problem arises. Meanwhile, the spare row circuit is commonly used by the plurality of banks, and the arbitrating procedure (e.g., saving of selected memory cell data to an appropriate position) is required when different banks simultaneously use the spare row.

Figure 12A:
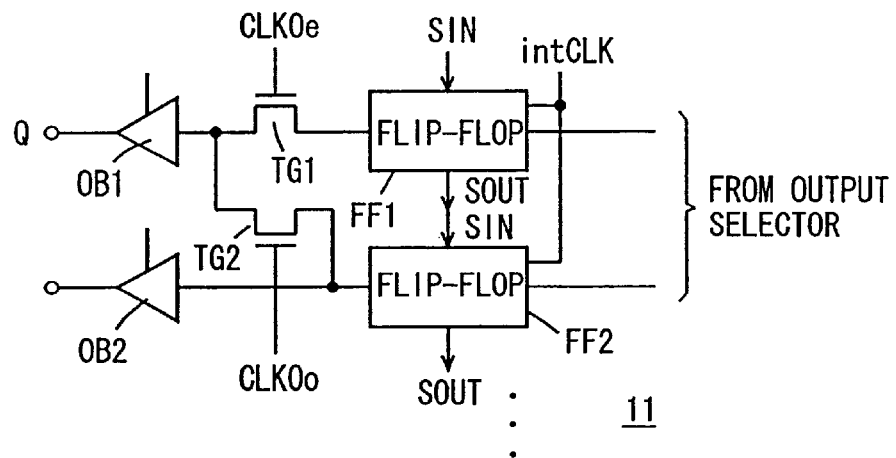
FIG. 12A schematically shows a structure of the data output circuit shown in FIG. 6.

FIG. 12A schematically shows a structure of the parallel/serial converter circuit shown in FIG. 6. In FIG. 12A, parallel/serial converter circuit 11 includes flip-flops FF1, FF2, . . . taking in data applied from the output selector in accordance with internal clock signal intCLK, a transfer gate TG1 turned on to transfer the latched data of flip-flop FF1 in accordance with a clock signal CLKOe, a transfer gate TG2 turned on to transfer the latched data of flip-flop FF2 in accordance with an output clock signal CLKOo, an output buffer circuit OB1 operating under the control of a control circuit (not shown) and buffering the signals transmitted from transfer gates TG1 and TG2 for external output, and an output buffer OB2 attaining the output high-impedance state under the control of a control circuit (not shown).

Figure 12B:
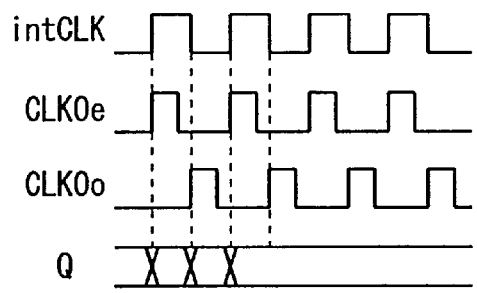
FIG. 12B is a signal waveform diagram representing an operation of the circuit shown in FIG. 12A.

In parallel/serial converter circuit 11, the parallel to serial conversion is performed in the case where the internal read speeds is lower than the speed of the clock signal determining the external data transfer speed. The data read in parallel from the output selector are transmitted to flip-flops FF1, FF2, . . . . As shown in FIG. 12B, output clock signals CLKOe and CLKOo attain H-level in synchronization with the rising edge and the falling edge of internal clock signal intCLK, respectively. Accordingly, these transfer gates TG1 and TG2 are turned on to transfer the latched data of flip-flops FF1 and FF2 at the rising and falling edges of internal clock signal intCLK, respectively. Output buffer OB1 operates in synchronization with output clock signals CLKOe and CLKOo, output data Q is output at the rising and falling edges of output clock signal CLKO.

When the parallel to serial conversion is performed, output buffer OB2 is not required to transmit the output data of flip-flop FF2, and is set to the output high-impedance state. When the parallel to serial conversion is not performed, transfer gate TG2 is kept off so that the latched data of flip-flop FF2 is output via output buffer OB2. Owing to this parallel to serial conversion, the data transfer time, which is inherently determined in accordance with the distance from the output selector to the sense amplifier, can be apparently reduced, and the data can be output in successive cycles, so that the data can be output in synchronization with the clock signal faster than internal clock signal intCLK (therefore, the function of the parallel/serial converter circuit is not particularly restricted to DDR (Double Data Rate) mode operation).

Figure 13:
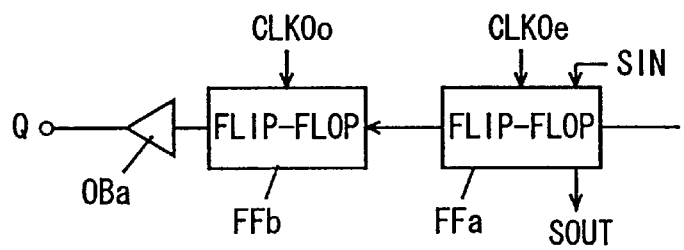
FIG. 13 schematically shows another structure of the data output circuit shown in FIG. 6.

If the parallel to serial conversion is not performed in the output circuit, such a structure may be employed that two flip-flops FFa and FFb are merely cascaded and these flip-flops perform the data transfer in accordance with output clock signals CLKOe and CLKOo as shown in FIG. 13. In this case, the data output is performed in synchronization with internal clock signal intCLK.

Serial-in data SIN and serial-out data SOUT are input/output to from flip-flops FF1 and FF2 for covering the test (JTAG (Joint Test Action Group) test) for detecting an internal defect by forming the scan path via these flip-flops FF1, FF2, . . . to construct the boundary scan register.

Figure 14:
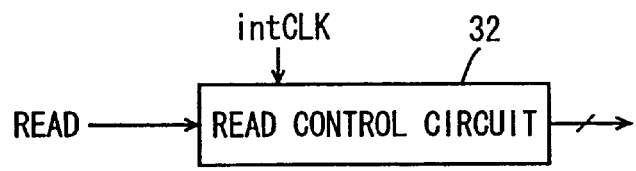
FIG. 14 schematically shows a structure of a read operation control portion included in the peripheral control circuit shown in FIG. 1.

The operation of the circuit portions arranged from read/write circuit R/W to interface circuit I/F is common to memory banks #0–#7. Therefore, the operation of the data read portion is controlled by a read control circuit 32 operating in synchronization with internal clock signal intCLK according to read operation instructing signal READ shown in FIG. 14. Read operation instructing signal READ is generated from mode decoder 6b shown in FIG. 3.

Figure 15:
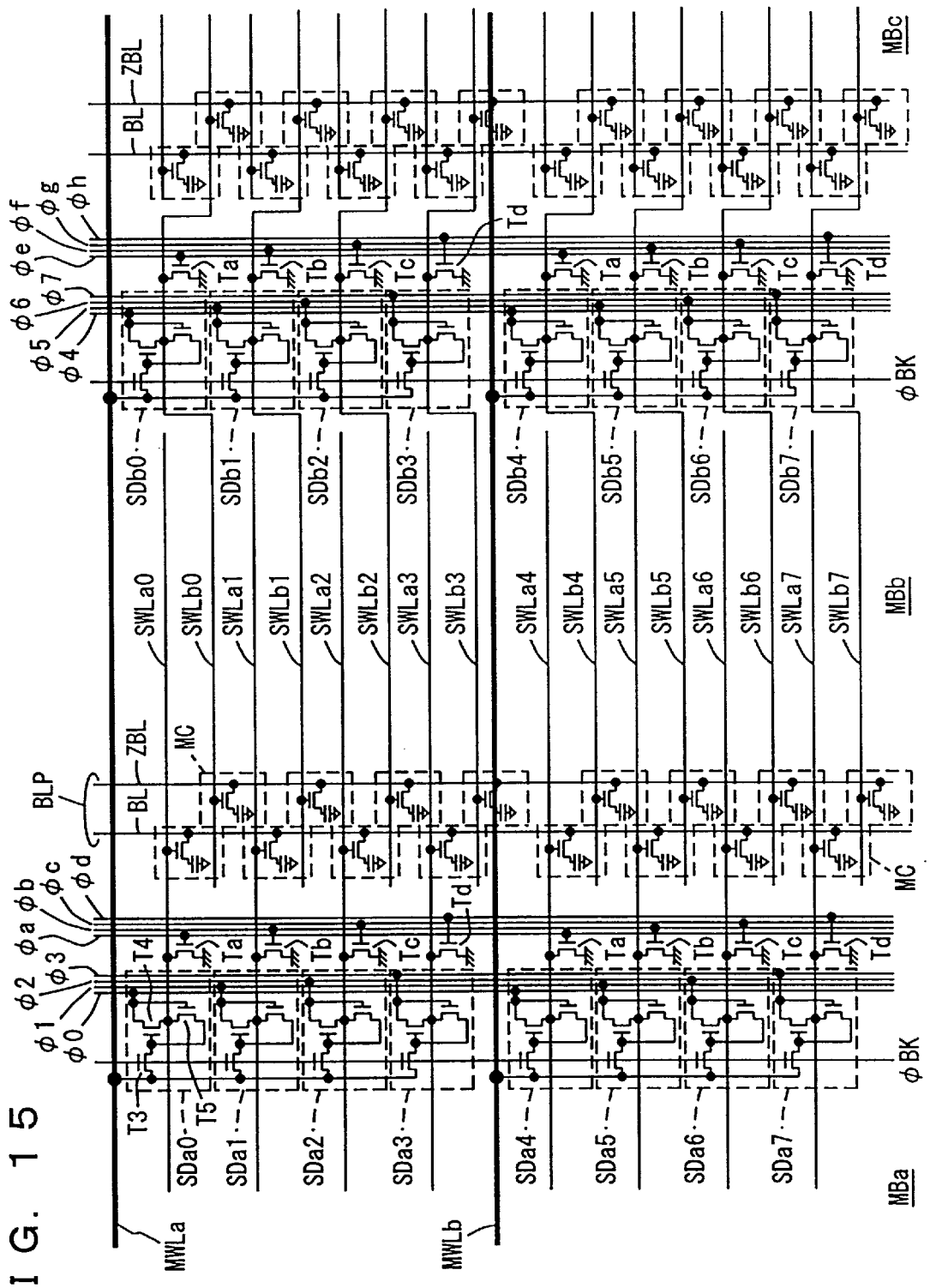
FIG. 15 shows structures of memory banks and their peripheral circuits.

FIG. 15 schematically shows a structure of the memory cell block. In FIG. 15, main word lines MWLa, MWLb, . . . are arranged commonly to memory cell blocks MBa–MBc. In memory cell block MBb, eight sub-word lines SWL are arranged for one main word line MWL. More specifically, sub-word lines SWLa0 and SWLb0–SWLa3 and SWLb3 are arranged for main word line MWLa, and sub-word lines SWLa4 and SWLb4–SWLa7 and SWLb7 are arranged for main word line MWLb. Memory cells MC are arranged at the crossings between sub-word lines SWLa0 and SWLb0–SWLa7 and SWLb7 and bit line pairs BLP, respectively. In FIG. 15, memory cells MC are arranged at the crossings between sub-word lines SWLa0–SWLa7 and bit line BL, respectively, and memory cells MC are arranged corresponding to the crossings between sub-word lines SWLB0–SWLb7 and bit lines ZBL, respectively. The sub-word line drivers for driving the sub-word lines to the selected state are arranged on either side of memory block MBb. On one side of memory cell block MBb, sub-word line drivers SDa0–SDa3 are arranged corresponding to main word line MWLa, and sub-word line drivers SDa4–SDa7 are arranged corresponding to main word line MWLb. On the other side of memory cell block MBb, sub-word line drivers SDb0–SDb3 are arranged corresponding to main word line MWLa, and sub-word line drivers SDb4–SDb7 are arranged corresponding to main word line MWLb.

Sub-word line drivers SDa0–SDa3 drive the corresponding sub-word lines SWLa0–SWLa3 to the selected state in accordance with the signal on main word line MWLa and sub-word line select signals φ0–φ3 applied from the row decoder, respectively. Sub-word line drivers SDa4–SDa7 drive the corresponding sub-word lines SWLa4–SWLa7 to the selected state in accordance with the signal on main word line MWLb and sub-word line select signals φ0–φ3, respectively. Sub-word line select signals φ0–φ3 specify one of the four sub-word lines.

Sub-word line drivers SDb0–SDb3 drive the sub-word lines SWLb0–SWLb3 to the selected state in accordance with the signal on main word line MWLa and sub-word line select signals $\phi4$–$\phi7$, respectively. Sub-word line drivers SDb4–SDb7 drive the sub-word lines SWLb4–SWLb7 to the selected state in accordance with the signal potential on main word line MWLb and sub-word line select signals $\phi4$–$\phi4$, respectively. Sub-word line select signals $\phi4$–$\phi7$ specify one of the four sub-word lines. Each of sub-word line drivers SDa0–SDa7 and SDb0–SDb7 drives two memory cell blocks to the selected state at the same time. Owing to alternate arrangement of the sub-word line drivers on the opposite sides of the memory cell block, the pitch conditions of the sub-word line drivers can be relaxed, and the sub-word lines can be arranged at high density.

Each of sub-word line drivers SDa0–SDa7 and SDb0–SDb7 includes a transfer gate T3 turned on, in response to bank select signal $\phi BK$, to transmit the signal potential on corresponding main word line MWL (MWLa or MWLb), a transfer gate T4 transmitting the corresponding sub-word line select signal $\phi i$ (i=0–7) when turned on, and a transfer gate T5 turned on, in response to corresponding sub-word line select signal $\phi i$, to transmit the signal transmitted through transfer gate T3 onto the corresponding sub-word line.

Sub-word lines SWLa0–SWLa3 are provided with transfer gates Ta–Td turned on, in response to reset signals $\phi a$–$\phi d$ applied from the row decoder, to hold the corresponding sub-word lines in the unselected state, respectively. Likewise, sub-word lines SWLa4–SWLa7 are provided with transfer gates Ta–Td turned on, in response to reset signals $\phi a$–$\phi d$ applied from the row decoder, to hold the corresponding sub-word lines in the unselected state, respectively.

For sub-word lines SWLb0–SWLb3 and SWLb4–SWLb7, there are likewise arranged transfer gates Ta–Td turned on, in response to reset signals $\phi e$–$\phi h$, to hold the corresponding sub-word lines in the unselected state. Memory cell MC includes a capacitor and a transistor.

In operation, the main word line MWL corresponding to an addressed row is driven to the selected state. Description is now given on the operation in which sub-word line SWLa0 is driven to the selected state. In this case, bank select signal $\phi BK$ is in the selected state at H-level. All transfer gates T3 in sub-word line drivers SDa0–SDa7 and SDb0–SDb7 are on, and the signal potential on main word line MWL is taken into each sub-word line driver. When main word line MWLa is driven to the selected state, transfer gates T4 in sub-word line drivers SDa0–SDa3 are turned on to transmit sub-word line signals $\phi 0$–$\phi 3$ onto corresponding sub-word lines SWLa0–SWLa3, respectively. When sub-word line SWLa0 is to be selected, sub-word line select signal $\phi 0$ is in the selected state at H-level, and the other sub-word line select signals $\phi 1$–$\phi 3$ maintain the L-level. Accordingly, sub-word line select signal $\phi 0$ at H-level is transmitted onto the sub-word line via transfer gate T4. Also, transfer gate T5 is turned on, and the transfer gate T4 is reliably maintained in the on state. In other sub-word line drivers SDa1–SDa3, sub-word line select signals $\phi 1$–$\phi 3$ are at L-level, and the signals at L-level are transmitted onto the corresponding sub-word lines via transfer gates T4. Also, transfer gate T5 maintains the off state.

Among reset signals $\phi a$–$\phi d$, all reset signals $\phi b$–$\phi d$ other than reset signal $\phi a$ attain H-level, and the unselected sub-word lines are held at the ground voltage level by transfer gates Tb–Td, respectively. The reset signals $\phi a$–$\phi d$ are used for the following reasons.

If sub-word lines $\phi 1$–$\phi 3$ are at L-level while main word line MWLb is at L-level, both transfer gates T4 and T5 may be off in sub-word line drivers SDa5–SDa7, and the sub-word lines may be electrically floated. For preventing this situation, resetting transfer gates Tb–Td are turned on for preventing the unselected sub-word lines from being electrically floated.

In sub-word line drivers SDb0–SDb3, even when main word line MWLa is driven to the selected state, all sub-word line select signals $\phi 4$–$\phi 7$ are in the unselected state of L-level, and sub-word lines SWLb0–SWLb3 maintain the unselected state.

Thereby, one sub-word line driver drives the sub-word lines in the two memory cell blocks.

Bank select signal $\phi BK$ is produced in accordance with the act address signal. Sub-word line select signals $\phi 0$–$\phi 7$ and reset signals $\phi a$–$\phi h$ are produced in accordance with the predecode signal applied from the row predecoder.

Figure 16:
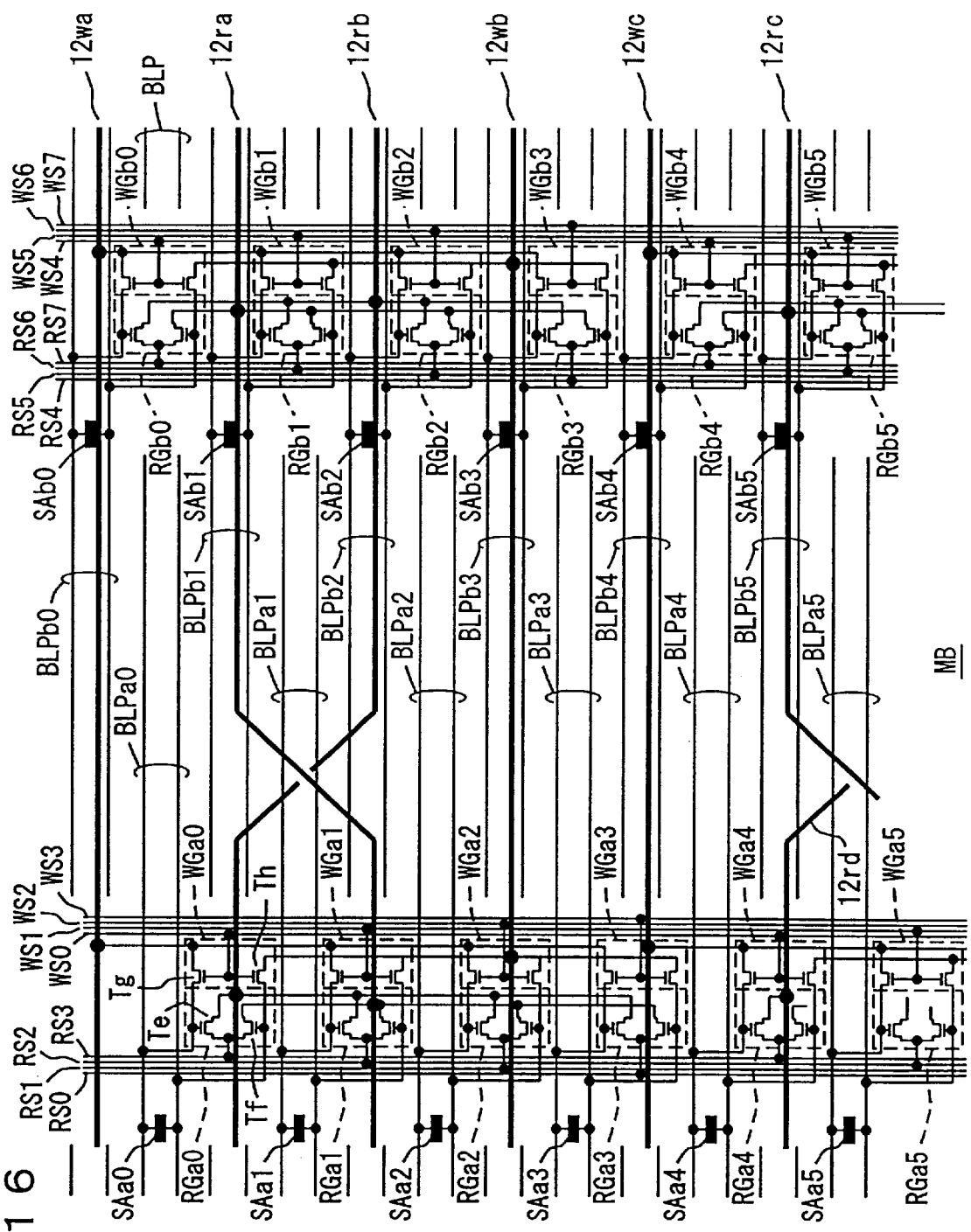
FIG. 16 schematically shows a structure of a portion related to column selection in the memory bank shown in FIG. 7.

FIG. 16 shows structures of the read data buses, write data buses and sense amplifier bands. In FIG. 16, read data line pairs 12*ra* and 12*rb* as well as write data line pairs 12*wa* and 12*wb* are arranged for bit line pairs BLPa0–BLPa3 and BLPb0–BLPb4 of memory block MB. Read data is formed of a signal of a small amplitude, and read data line pairs 12*ra* and 12*rb* have a twist structure for preventing an influence by noises.

For bit line pairs BLPa0–BLPa4, sense amplifier circuits SAa0–SAa4 are arranged respectively on one side of memory block MB. For bit line pairs BLPb0–BLPb4, sense amplifier circuits SAb0–SAb3 are arranged on the other side of memory block MB. These bit line pairs BLP ("BLP" generically indicates the bit lines) are shown being shared between adjacent blocks. However, the bit line pairs BLP are isolated by bit line isolating gates for each respective block, as will be described later. The alternately arranged, shared sense amplifier structure in which the sense amplifiers are alternately arranged on the opposite sides of the bit line pairs BLP of one memory block MB, is employed. In FIG. 16, bit line isolating gates for isolating the bit line pairs in adjacent memory blocks are not shown for simplicity reason. When the memory block MB is selected, the bit line isolating gates (not shown) isolate the bit line pair of the selected memory block MB from the bit line pairs of the memory blocks on both sides of the selected memory block MB.

For bit line pairs BLPa0–BLPa3, there are arranged read gate amplifiers RGa0–RGa3 selectively activated in response to read source select signals RS0–RS3, respectively. Likewise, read gate amplifiers selectively activated in accordance with read source select line signals RS3 and RS2 are provided for bit line pairs BLPa4 and BLPa5, respectively.

Neighboring to read gate amplifiers RGa0–RGa3, there are arranged write column select gates WGa0–WGa3 selectively turned on in response to write source select signals WS0–WS3. Likewise, write column select gates WGa4 and WGa5 selectively turned on in response to write source select signals WS0 and WS1 are provided for bit line pairs BLPa4 and BLPa5, respectively.

Read gate amplifiers RGb0–RGb5 selectively activated in accordance with read source select signals RS4–RS7 are provided for sense amplifier circuits SAb0–SAb5, respectively. Also, write column select gates WGb0–WGb5 selectively turned on in response to write source select signals WS4–WS7 are provided. Read gate amplifiers RGb0–RGb3 are provided for read data lines 12*ra* and 12*rb*, and read gate amplifiers RGb4 and RGb5 are provided corresponding to read data line 12rc and read data line 12rd (not shown). Likewise, read gate amplifiers RGa0–RGa3 are provided for read data lines 12ra and 12rb, and read gate amplifiers RGa4 and RGa5 are provided corresponding to read data lines 12rc and 12rd.

Each of read gate amplifiers RGa0–RGa5 and RGb0–RGb5 includes MOS transistors Te and Tf which form a differential amplifier MOS transistors Te and Tf each has a gate connected to the corresponding bit line pair, a source receiving the corresponding read source select signal and a drain connected to the corresponding read data bus line. In accordance with the latching data of the corresponding sense amplifier circuit, the corresponding read data line precharged to the power supply voltage level is discharged.

Write column select gate WG has transfer gates Tg and Th turned on to connect the corresponding sense amplifier circuit to the corresponding write data lines in accordance with the corresponding select signal WS (WS0–WS7), respectively.

In the alternately arranged, shared sense amplifier structure shown in FIG. 16, the sense amplifier circuits in one of the sense amplifier bands located on the opposite sides of the memory block MB is selected. More specifically, in the data read operation, one of read source select signals RS0–RS7 is driven to the selected state at L-level so that one read gate amplifier in the set of four read gate amplifiers is activated. In the data write operation, one of write source select signals WS0–WS7 is driven to the selected state at H-level, and one write column select gate in the set of four write column select gates is turned on. Accordingly, after the main word line is driven to the selected state in one memory bank, one-eighth of the memory cells in the selected one row are electrically coupled to the read data bus or write data bus. If the memory cells in one row are formed of, e.g., 4 Kbits, each of the read and write data buses, therefore, has the bus width of 512 bits.

Write source select signals WS0–WS7 are produced by combination of write bank address signals WA0–WA7 and three bits of write address signal bits WAA0–WAA5. One of read source select signals RS0–RS7 is driven to the selected state by combination of the read bank address signal and the read address signal.

Figure 17:
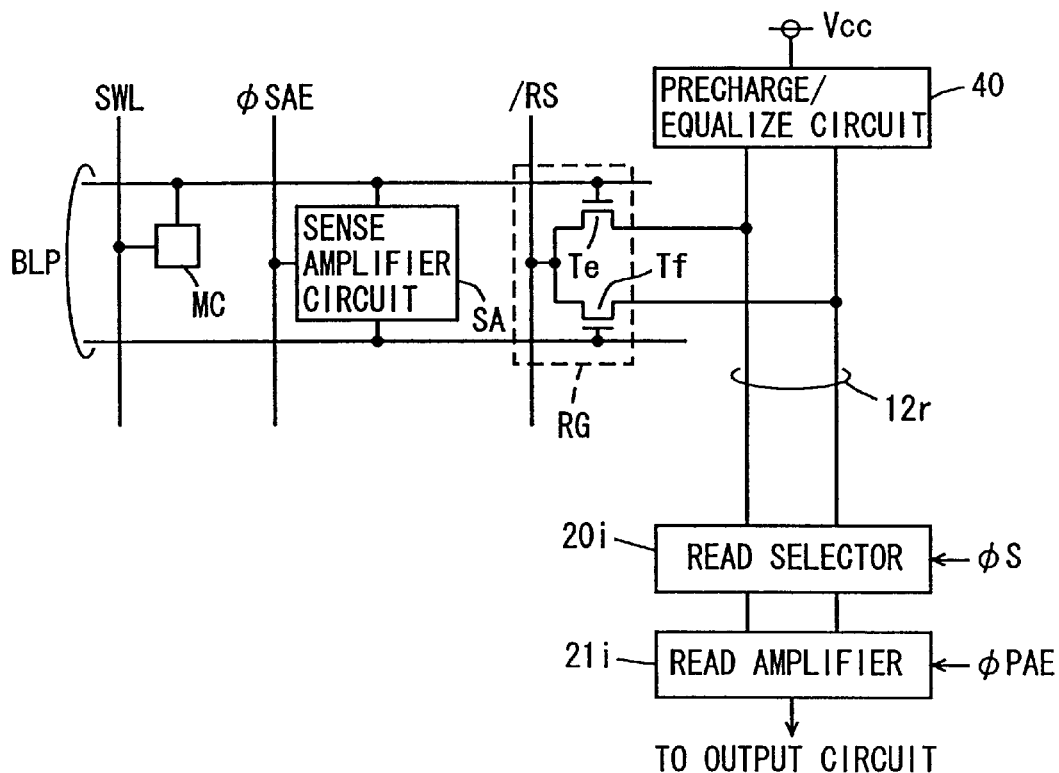
FIG. 17 schematically shows a structure of a data reading portion in the semiconductor memory device according to the first embodiment of the invention.

FIG. 17 schematically shows a data read path of a semiconductor memory device according to the first embodiment of the invention. Memory cell MC is arranged corresponding to the crossing between bit line pair BLP and sub-word line SWL, and sense amplifier circuit SA is coupled to bit line pair BLP. Bit line pair BLP is coupled to read data line pair 12r via read gate amplifier RG. Read data line pair 12r is coupled to a read amplifier 21i via a read selector 20i receiving select signal φS. Read amplifier 21i performs the amplification in response to activation of a preamplifier activating signal φPAE, and transmit the amplified signal to the parallel/serial converter circuit in the output stage via the multiplexer/selector in the next stage.

Read gate amplifier RG has a pair of differential transistors Te and Tf. Read data line pair 12r is connected to a precharge/equalize circuit 40 for precharging and equalizing the potentials on read data line pair 12r to power supply voltage Vcc level. Precharge/equalize circuit 40 has a function of restricting the amplitude of read data line pair 12r in the data read operation, and prevents increase in amplitude of read data line pair 12r during data reading.

Figure 18:
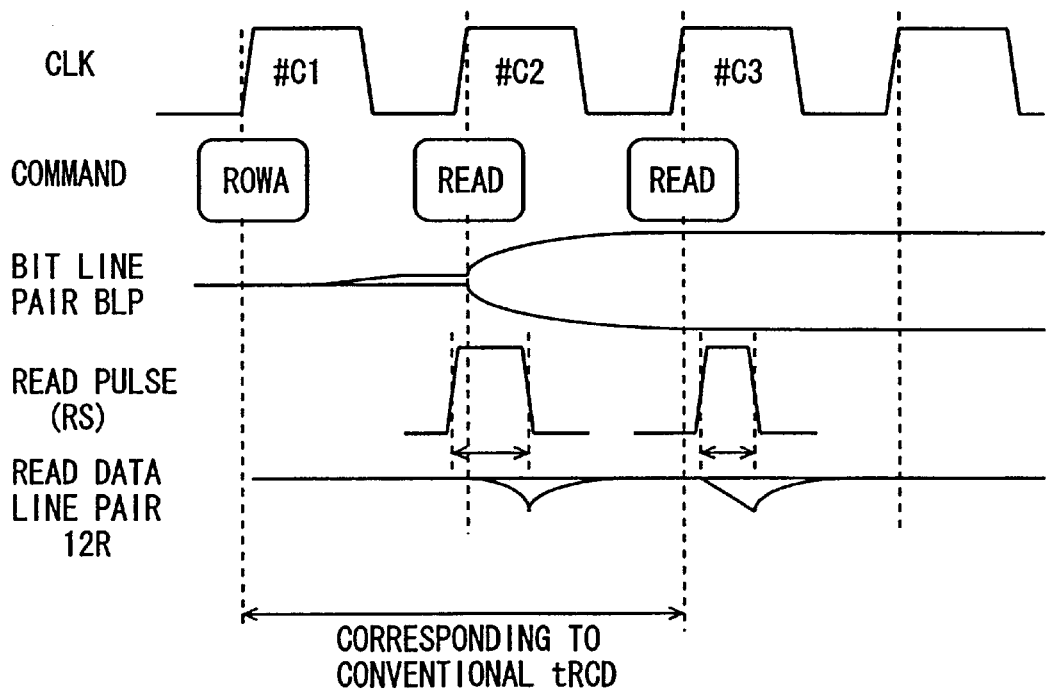
FIG. 18 is a timing chart representing an operation of the semiconductor memory device shown in FIG. 17.

FIG. 18 is a timing chart representing the operation of the semiconductor memory device according to the first embodiment of the invention in data reading. In synchronization with clock signal CLK, the commands are applied. Description will now be given on the state where row access command ROWA is applied in cycle #C1. Selection of a memory block as well as selection of a main word line and a sub-word line are performed in accordance with act bank address signals AB0–AB7 and act address signal bits AA0–AA10 applied simultaneously with row access command ROWA. Then, sense amplifier circuit SA is activated by sense amplifier activating signal φSAE. Sense amplifier circuit SA differentially amplifies the potentials on corresponding bit line pair BLP when made active. FIG. 18 shows signal waveforms in the case where data at H-level is read onto bit line pair BLP. Sense amplifier circuit SA usually drives bit lines BL and ZBL of bit line pair BLP to power supply voltage Vcc level and the ground voltage level, respectively, and then latches the drive voltage.

Application of the column access command is allowed after the voltage levels of bit line pair BLP are made definite subsequently to completion of the sensing operation by sense amplifier circuit SA. In FIG. 18, application of read command READ instructing data reading is allowed in clock cycle #C3. In the first embodiment, however, application of read command READ instructing data reading is allowed during the sensing operation of sense amplifier circuit SA. For the read command applied subsequently to row access command ROWA, the read pulse is activated at a timing earlier than in normal cycles, and responsively read source select signal RS for read gate amplifier RG is driven to the selected state. Read gate amplifier RG is formed of differential transistor pair Te and Tf, and the gates of these MOS transistors Te and Tf are coupled to the bit lines of bit line pair BLP, respectively. Therefore, even if read gate amplifier RG is activated during the sensing operation of sense amplifier circuit SA, read data line pair 12r and bit line pair BLP are electrically and physically isolated from each other, and the voltage on read data line pair 12r merely changes in accordance with the voltage on bit line pair BLP. Thus, the sensing operation of sense amplifier circuit SA is not adversely affected. By sufficiently increasing the pulse width of the read pulse which determines the active period of read gate amplifier RG, the voltage on read data line pair 12r can be sufficiently changed even while the voltage difference between the gates of MOS transistors Te and Tf is relatively small. Therefore, by activating preamplifier activating signal φPAE for read amplifier 211 in the state where the voltage level of read data line pair 12r is sufficiently changed, memory cell data can be read out without any adverse effect on the memory data even if read command READ is applied in clock cycle #C2.

After the sensing operation of the sense amplifier is completed, the read pulse is generated in accordance with read command READ applied in synchronization with clock signal CLK, and read gate amplifier RG is activated in accordance with the internal clock signal. In this operation, even if the pulse width of read pulse is short, the voltage levels on bit line pair BLP are in the definite state, and the voltages on read data line pair 12r are sufficiently driven by read gate amplifier RG.

In clock cycle #C3, activation of read amplifier 21i is executed, for example, at a timing similar to the conventional timing, and activation of read gate amplifier RG is executed, e.g., at a timing similar to the conventional timing. In clock cycle #C2, however, read gate amplifier RG is activated at the timing earlier than the conventional timing, and is kept active for a period longer than the conventional period. Read amplifier 21i is activated at the same timing in clock cycles #C2 and #C3, and preamplifier activating signal φPAE is activated at the time when a sufficiently large voltage difference occurs on read data line pair 12r.

Figure 19:
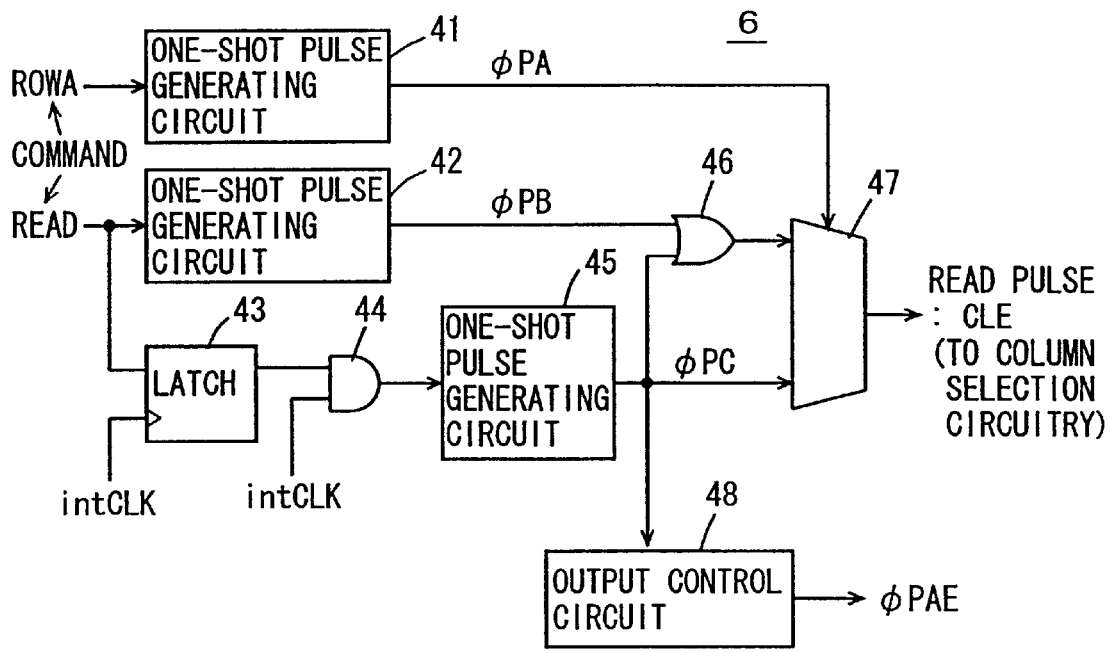
FIG. 19 schematically shows a structure of a read pulse generating portion shown in FIG. 18.

FIG. 19 schematically shows a structure of a controller for generating the read pulse in the first embodiment of the invention. The controller shown in FIG. 19 is included in peripheral control circuit 6, and more specifically is included in mode decoder 6b shown in FIG. 3.

In FIG. 19, the control signal generating portion includes a one-shot pulse generating circuit 41 producing a pulse signal φPA of one shot in accordance with row access command ROWA, a one-shot pulse generating circuit 42 operating asynchronously to internal clock signal intCLK, to generate a pulse signal φPB of one shot upon reception of read command READ, a latch circuit 43 for taking in read command in accordance with internal clock signal intCLK, an AND circuit 44 for passing the output signal of latch circuit 43 therethrough in response to the rising of internal clock signal intCLK, a one-shot pulse generating circuit 45 for generating a pulse signal φPC of one shot in response to the rising of output signal of AND circuit 44, an OR circuit 46 receiving pulse signals φPB and φPC generated respectively from one-shot pulse generating circuits 42 and 45, and a multiplexer 47 for selecting one of the output signal of OR circuit 46 and pulse signal φPC generated from one-shot pulse generating circuit 45 in accordance with pulse signal φPA generated from one-shot pulse generating circuit 41, to produce a read pulse.

Pulse signal φPA generated from one-shot pulse generating circuit 41 becomes active for a period required from application of row access command ROWA to sufficient development in potential difference on the bit line pair owing to operation of the sense amplifier. One-shot pulse generating circuit 41 may or may not operate in synchronization with internal clock signal intCLK (because such a situation does not occur that the row access command and the read command are applied to the same bank in the same cycle). Multiplexer 47 passes the output signal of OR circuit 46 when one-shot pulse signal φPA is active.

Figure 20:
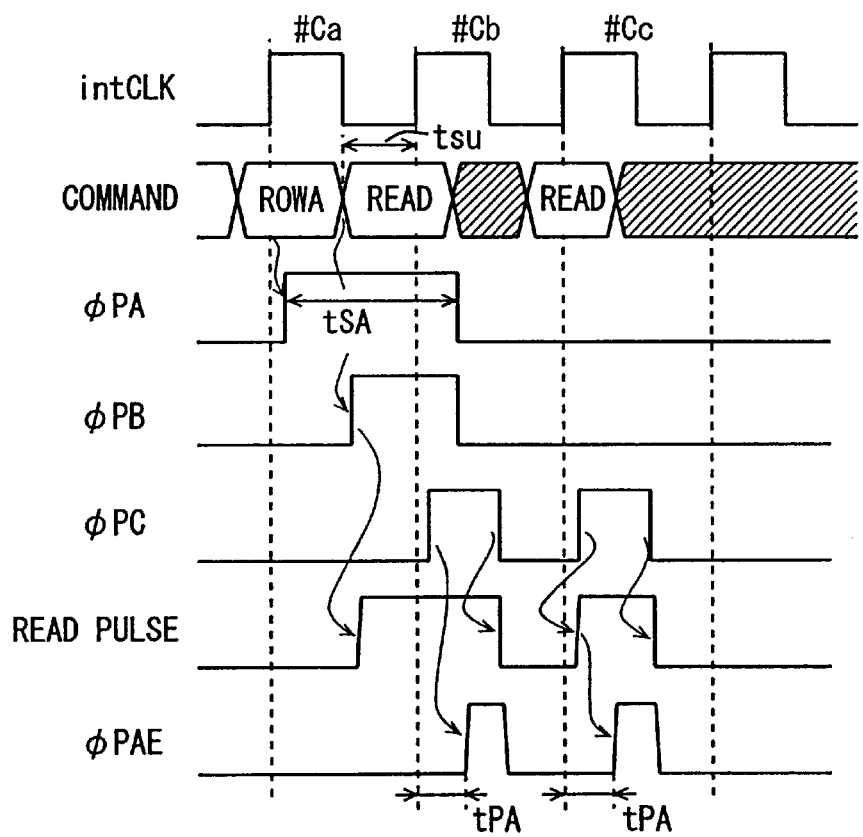
FIG. 20 is a timing chart representing an operation of the read pulse generating portion shown in FIG. 19.

The read pulse from multiplexer 47 is combined, with the address signal into column decoder enable signal CLE by the bank control circuit, and is applied to the column decoder. Pulse signal φPC generated from one-shot pulse generating circuit 45 is applied also to output control circuit 48 generating preamplifier activating signal φPAE and others. Output control circuit 48 commonly controls the data read operations of the respective banks. The read pulse determines the column selection period on a bank basis. Output control circuit 48 also controls the shift operation of the shift circuit, the bus selection of the read data bus and the data output operation in parallel/serial converter circuit. Now, the operation of the control signal generating portion shown in FIG. 19 will now be described with reference to a timing chart of FIG. 20.

In a cycle #Ca of clock signal intCLK, when row access command ROWA is applied, one-shot pulse generating circuit 41 generates pulse signal φPA having a pulse width of a time tSA. In accordance with row access command ROWA, the row selection instructing signal (ROWA) is internally produced so that selection of a word line (main word line and sub-word line) and activation of the sense amplifier are performed. Pulse signal φPA is at H-level for a period (tSA) during which the sense amplifier operates to develop a sufficiently increased voltage difference on the bit line pair.

Read command READ is applied in clock cycle #Ca. Read command READ has a set-up time tsu relative to clock signal intCLK. In accordance with read command READ, one-shot pulse generating circuit 42 generates pulse signal φPB of one shot asynchronously to clock signal intCLK. Multiplexer 47 selects the output signal of OR circuit 46 and produces the read pulse while pulse signal φPA generated from one-shot pulse generating circuit 41 is active. Therefore, the read pulse becomes active within clock cycle #Ca of clock signal intCLK, and the column selection is executed. In the above operation, the bank address signal and the read address signal have similar set-up times, respectively. The logic circuit block issues the command together with address signal at the same timing for easy control of the signal output timing.

In accordance with this read pulse, the circuits (address latch, column predecoder and column decoder) related to the column selection operate, and the column selecting operation starts in clock cycle #Ca before start of clock cycle #Cb.

When internal clock signal intCLK rises to H-level in clock cycle #Cb, latch 43 and AND circuit 44 take in read command READ, and one-shot pulse generating circuit 45 generates pulse signal φPC of one shot in accordance with read command READ. OR circuit 46 carries out the logical OR between pulse signals φPB and φPC. Accordingly, even if one-shot pulse signal φPB lowers to L-level, the read pulse still maintains H-level so that the column selection is performed, and the memory cell data on the bit lines is read onto the read data bus.

In accordance with pulse signal φPC generated from one-shot pulse generating circuit 45, output control circuit 48 activates preamplifier activating signal φPAE so that the read amplifier is activated to amplify the memory cell data read onto the read data bus. It is now assumed that the number (column latency) of clock cycle(s) required from application of the read command to output of valid data is 1. In this case, the valid data is outputted starting at clock cycle #Cc.

When a predetermined period elapses after application of row access command ROWA, pulse signal φPA generated from one-shot pulse generating circuit 41 falls to L-level, and multiplexer 47 is set to the state of selecting the output signal of one-shot pulse generating circuit 45.

In clock cycle #Cc, read command READ is applied again. Responsively, both one-shot pulse generating circuits 42 and 45 generate pulse signals φPB and φPC, respectively. However, multiplexer 47 selects pulse signal φPC generated from one-shot pulse generating circuit 45 to produce the read pulse in accordance with pulse signal φPA applied from one-shot pulse generating circuit 41. In clock cycle φCc, therefore, the column selection is executed in accordance with internal clock signal intCLK. When a predetermined period tPA elapses after activation of pulse signal φPC, preamplifier activating signal φPAE is activated. In clock cycles #Cb and #Cc, therefore, preamplifier activating signal φPAE is activated at the same timing relative to internal clock signal intCLK. In the cycle next to the cycle in which the row access command is applied, the read pulse has a leading edge advanced by an extent corresponding to the set-up time of the read command, and also has a trailing edge (deactivation) appearing at the same timing in both clock cycles #Cb and #Cc (pulse signal φPC determines the trailing edge). Therefore, the active period of preamplifier activating signal φPAE can be made constant independently of the read command application cycle.

Figure 21:
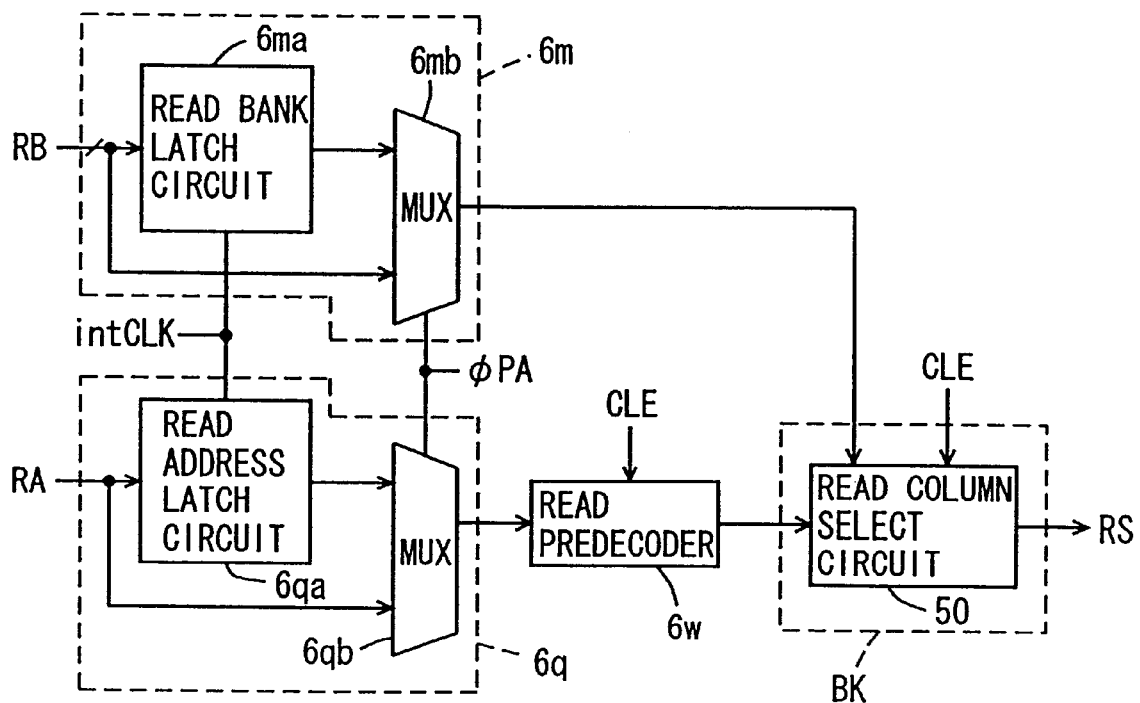
FIG. 21 schematically shows a structure of a data read control portion of the first embodiment of the invention.

FIG. 21 schematically shows a structure related to the column selection. In FIG. 21, read bank latch 6m shown in FIG. 4 includes a read bank latch circuit 6ma taking in read bank address signal RB in synchronization with internal clock signal intCLK, and a multiplexer (MUX) 6 mb for selecting one of read bank signal RB and the output signal of read bank latch circuit 6*ma* in accordance with pulse signal φPA.

Read address latch 6*q* includes a read address latch circuit 6*qa* taking in and latching read address signal RA in accordance with internal clock signal intCLK, and a multiplexer 6*qb* for selecting one of read address signal RA and the output signal of read address latch circuit 6*qa* in accordance with pulse signal φPA. The output signal of read address latch 6*q* is applied to read predecoder 6*w*. The read bank address signal from read bank latch 6*m* and the predecode signal from read predecoder 6*w* are applied to a read column select circuit 50 included in a bank BK. Read column select circuit 50 includes both the column select control circuit and the column decoder.

Read predecoder 6*w* is activated, in accordance with the read pulse (or column enable signal CLE), to predecode the read address signal received from read address latch 6*q*. Read column select circuit 50 is activated, in accordance with the read bank address signal received from read bank latch 6*m* and the read pulse (or column enable signal CLE), to decode the column predecode signal received from read predecoder 6*w* for producing read source select signal RS.

Owing to provision of multiplexers 6 mb and 6*qb* in latches 6*m* and 6*q*, respectively, the internal address signal in the cycle next to the cycle in which the row access command is applied, can be made different from those in the cycles following the next cycle. Thereby, the column selection can be performed in accordance with the read pulse (or column enable signal). The read pulse determines the active period of the read source select signals.

In the structure shown in FIG. 21, read predecoder 6*w* and read column select circuit 50 receive the same column enable signal CLE. However, for providing a difference in activation timing between read predecoder 6*w* and read column select circuit 50, the column enable signal may be applied to read predecoder 6*w* and to read column select circuit 50 at different timings.

In the above description, the read command is applied in each clock cycle. However, the invention can likewise be applied to a semiconductor memory device performing the burst mode operation in which the column addresses (burst addresses) are internally and automatically produced for successively reading the data when one read command is applied, provided that a read gate amplifier is provided as a column select gate in the semiconductor memory device. As for the internal data buses, the read and write data buses may be provided separately from each other, or an I/O common data bus for transmitting read and write data may be employed.

According to the first embodiment of the invention, as described above, the column selection responsive to the first read command applied within a predetermined period after application of the row access command starts at a timing different from that for the column selection responsive to the subsequent read commands. Therefore, the time required after application of the row access command to the output of valid data can be reduced so that fast access can be achieved.

[Second Embodiment]

Figure 22:
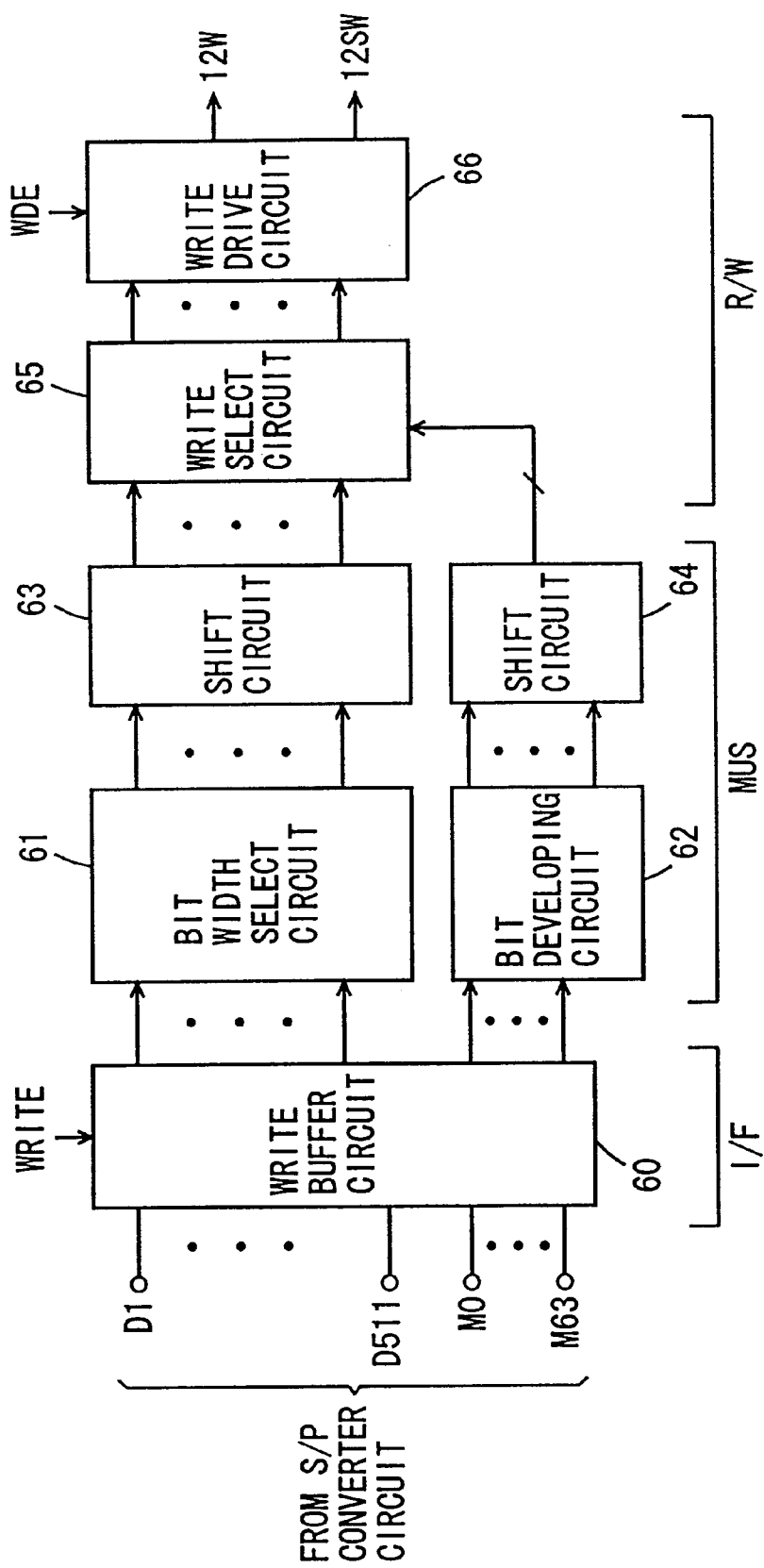
FIG. 22 schematically shows a structure of a main portion of a semiconductor memory device according to a second embodiment of the invention.

FIG. 22 schematically shows a structure of the data write portion of the semiconductor memory device according to a second embodiment of the invention. In FIG. 22, a data write portion includes a write buffer circuit 60 taking in write data D0–D511 and mask data M0–M63 applied from a serial/parallel (S/P) converter circuit in accordance with write instructing signal WRITE, a bit width select circuit 61 for selecting a bit width of internal write data applied from write buffer circuit 60, a bit developing circuit 62 for expanding the bit width of the mask data applied from write buffer circuit 60, a shift circuit 63 for transferring the internal write data applied from bit width select circuit 61 with a defective memory cell (bit) avoided through shifting operation, a shift circuit 64 for shifting the mask data applied from bit line developing circuit 62 so as to isolate the defective bit, a write select circuit 65 for selecting the write data applied from shift circuit 63 for selective output in accordance with the mask data received from shift circuit 64, and a write drive circuit 66 activated, in response to activation of write driver enable signal WDE, to drive a write data bus 12W (and spare write data bus 12SW) in accordance with the write data received from write select circuit 65.

Write buffer 60 corresponds to interface circuit I/F shown in FIG. 7, and bit width select circuit 61, bit developing circuit 62 and shift circuits 63 and 64 correspond to multiplexer/selector MUS shown in FIG. 7. Write select circuit 65 and write drive circuit 66 correspond to read/write circuit R/W shown in FIG. 7. Each of mask data M0–M63 instructs whether one byte of write data is to be masked (writing is to be inhibited) or not.

Figure 23:
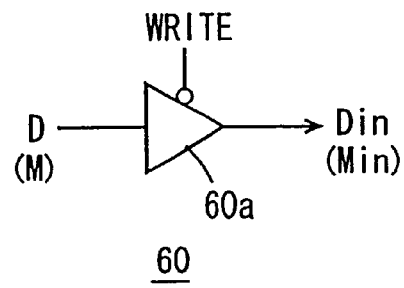
FIG. 23 schematically shows a structure of a buffer circuit included in a write buffer circuit shown in FIG. 22.

FIG. 23 schematically shows a structure of a write buffer included in write buffer circuit 60 shown in FIG. 22. In FIG. 23, write buffer circuit 60 includes a write buffer 60*a* receiving write data D (or mask data M) and attaining the output high-impedance state to take in write data D (or mask data M) when write operation instructing signal WRITE is active. Within the set-up time of write data D (or mask data M), write buffer 60*a* is operated to produce internal write data Din (or internal mask data Min).

Bit width select circuit 61 selects the write data received from write buffer circuit 60 in accordance with the bit width of the write data.

Figure 24:
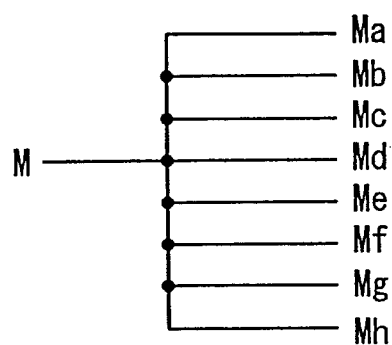
FIG. 24 schematically shows a structure of a bit developing circuit shown in FIG. 22.

FIG. 24 shows a structure of bit developing circuit 62 shown in FIG. 22. In FIG. 24, bit developing circuit 62 expands mask data M of one bit to mask data Ma–Mh of eight bits. This bit width expansion is achieved merely by interconnection lines. Each of mask data Ma–Mh corresponds to one bit of the write data, and individually masks the writing of data into a memory cell.

Shift circuits 63 and 64 each have the structure similar to that of shift circuit 22 shown in FIG. 10, and a defective bit is isolated from the outputs of bit width select circuit 61 and bit developing circuit 62 by switching the connection paths of shift circuits 63 and 64. For the mask data, the shift operation is performed similarly to write data, whereby the write data can be accurately masked.

Figure 25:
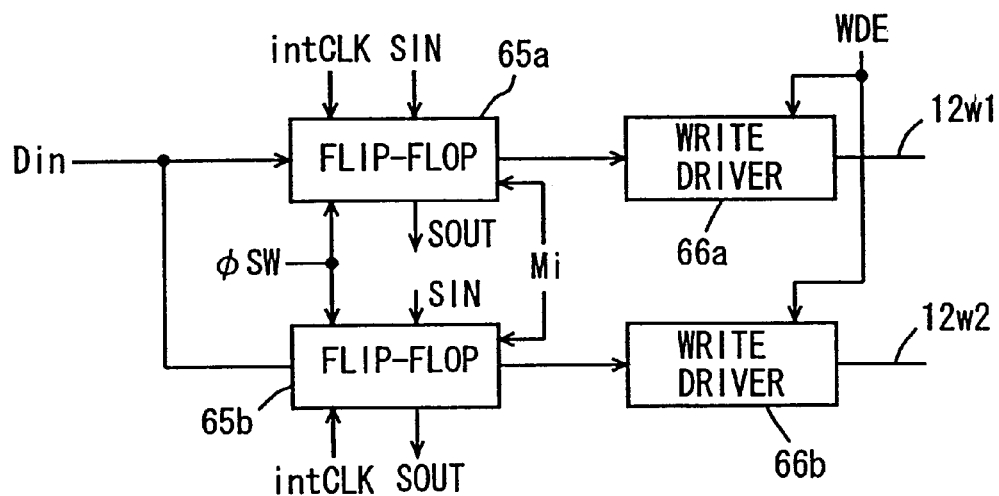
FIG. 25 schematically shows structures of a write select circuit and a write drive circuit shown in FIG. 22.

FIG. 25 schematically shows structures of write select circuit 65 and write drive circuit 66 shown in FIG. 22. In FIG. 25, write select circuit 65 includes two flip-flops 65*a* and 65*b* provided for write data Din applied from shift circuit 63. One of flip-flops 65*a* and 65*b* is selected by a select signal φSW. Each of flip-flops 65*a* and 65*b* has a serial-in input SIN and a serial-out output SOUT forming a scan path for data transfer. Flip-flops 65*a* and 65*b* take in mask data Mi in accordance with the clock signal intCLK. Flip-flops 65*a* and 65*b* may be so configured as to place write drivers 66*a* and 66*b* in the output high-impedance state when mask data Mi is valid to instruct the masking of data writing.

In the above structure, flip-flops 65*a* and 65*b* are supplied with common mask data Mi. This is because the number of bits of write data Din is half the number of internal write data line pairs 12*w*.

Write drivers 66a and 66b activated to drive write data line pairs 12wa and 12wb in response to activation of write driver enable signal WDE are provided for flip-flops 65a and 65b, respectively. Write drivers 66a and 66b included in write drive circuit 66 are in the output high-impedance state when corresponding flip-flops 65a and 65b are not selected, or the data mask is set.

In the structure shown in FIG. 25, mask data Mi is applied to write select circuit 65. Mask data Mi is applied from the flip-flop to write drive circuit 66, and the write driver is controlled to be activated or deactivated in accordance with mask data Mi.

Figure 26:
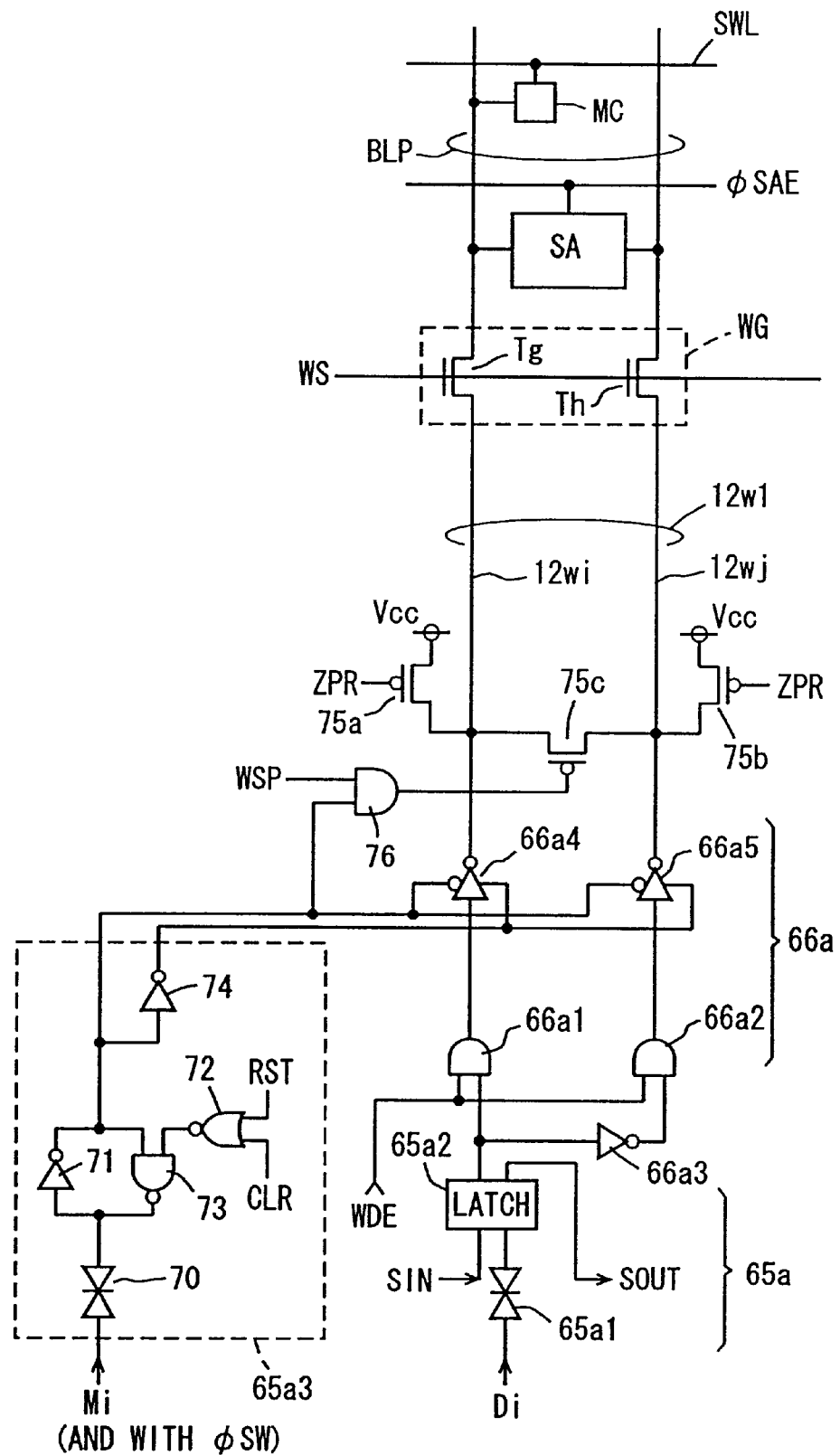
FIG. 26 schematically shows a structure of a data write portion according to the second embodiment of the invention.

FIG. 26 shows a data write path to memory cell MC. In FIG. 26, the write data transfer path of one bit is shown representatively.

In FIG. 26, flip-flop 65a includes a transmission gate 65a1 for passing internal write data Di in accordance with the internal clock signal, a latch circuit 65a2 for latching the write data passed through transmission gate 65a1, and a mask control circuit 65a3 taking in mask data Mi in synchronization with the internal clock signal, to produce the write control signal for write driver 66a. Latch circuit 65a2 also has serial input SIN and serial output SOUT for forming a serial scan path, and can transfer data between adjacent latches.

Mask control circuit 65a3 includes a transmission gate 70 for transferring write mask data Mi in synchronization with internal clock signal, an inverter 71 for inverting the mask data received through transmission gate 70, an NOR circuit 72 receiving a reset pulse RST and a clear pulse CLR, an NAND circuit 73 receiving the output signal of NOR circuit 72 and the output signal of inverter 71 for transmission to the input portion of inverter 71, and an inverter 74 inverting the output signal of inverter 71. Reset pulse RST is held at H-level for a predetermined period when the semiconductor memory device is initialized. Clear pulse CLR is driven to the active state at H-level for a predetermined period, in response to deactivation of the write pulse after completion of the write operation, for initializing the mask data already set.

Write driver 66a includes AND circuits 66a1 and 66a2 each receiving write driver enable signal WDE and the output signal of latch circuit 65a2, an inverter 66a3 inverting the output signal of latch circuit 65a2, a tristate inverter buffer 66a4 selectively activated, in accordance with a mask signal generated from mask control circuit 65a3, to drive a write data line 12wi in accordance with the output signal of AND circuit 66a1, an NAND circuit 66a2 receiving the output signal of inverter 66a3 and write driver enable signal WDE, and a tristate inverter buffer 66a5 selectively activated, in accordance with the mask signal generated from mask control circuit 65a3, to drive a write data line 12wj in accordance with the internal write data outputted from inverter 66a3.

Tristate inverter buffers 66a4 and 66a5 become active when mask data Mi is at H-level, and attain the output high-impedance state when mask data Mi is at L-level to instruct inhibition of data writing. In mask control circuit 65a, a mask-released state is set in accordance with clear pulse signal CLR after completion of the writing, and tristate inverter buffers 66a4 and 66a5 are activated to drive write data lines 12wi and 12wj to the power supply voltage Vcc level in accordance with the output signals of AND circuits 66a1 and 66a2, respectively. The mask data and write driver enable signal WDE may be logically combined to keep the write driver in the output high-impedance state when inactive (data writing is inhibited).

Write data lines 12wi and 12wj are provided with p-channel MOS transistors 75a and 75b turned on to precharge write data lines 12wi and 12wj to power supply voltage Vcc level when a precharge instructing signal ZPR is active, and a p-channel MOS transistor 75c for electrically short-circuiting write data lines 12wi and 12wj in accordance with the output signal of AND circuit 76 receiving write pulse signal WSP and the mask signal generated from mask control circuit 65a3. Precharge instructing signal ZPR is driven to the inactive state at H-level when write pulse signal WSP is active.

Write data line pair 12w1 is connected to bit line pair BLP via write column select gate WG. For bit line pair BLP, there are arranged sense amplifier circuit SA activated in response to sense amplifier activating signal φSAE as well as memory cell MC. Memory cell MC is arranged corresponding to the crossing between sub-word line SWL and bit line pair BLP.

Figure 27:
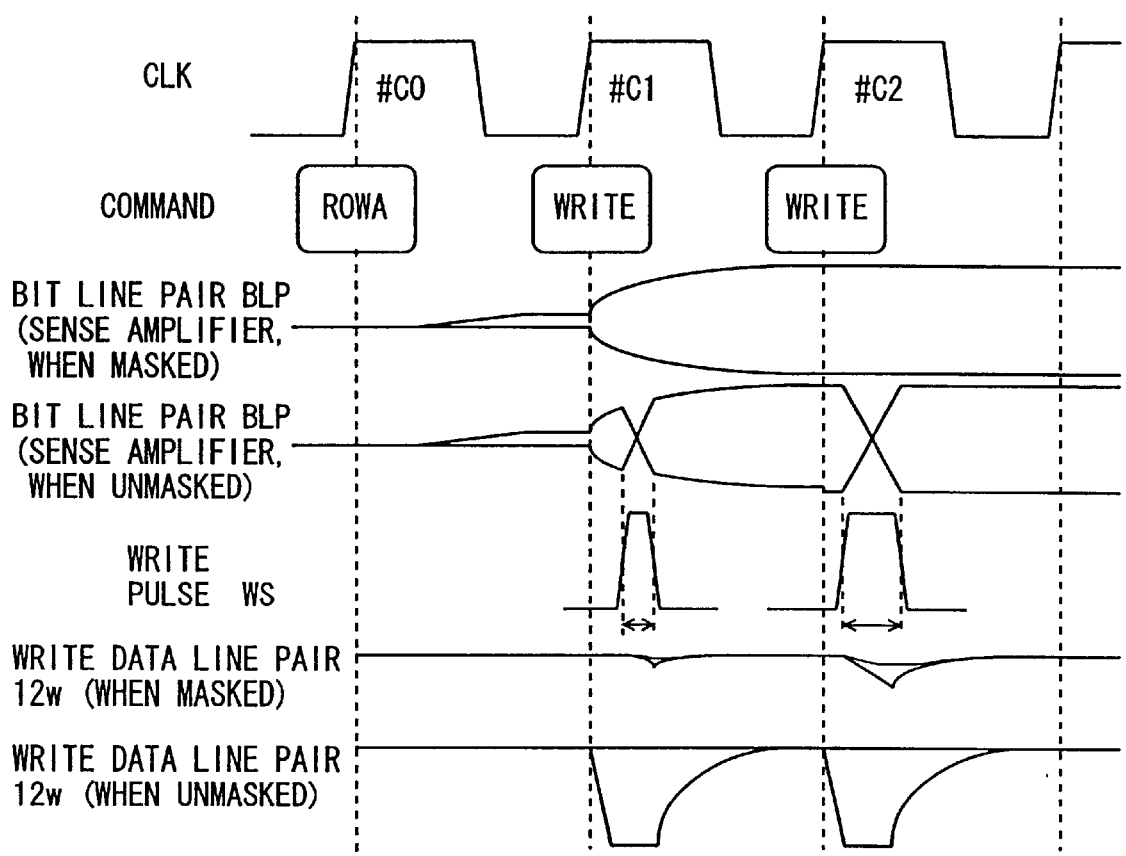
FIG. 27 is a timing chart representing operation of the data write portion shown in FIG. 26.

Write column select gate WG includes transmission gates Tg and Th turned on in response to write source select signal WS. Now, the operation of the write path shown in FIG. 26 will be described with reference to a signal waveform diagram of FIG. 27.

In clock cycle #C0, row access command ROWA is applied, and the row selection is executed in the designated bank. Then, memory cell data in the selected row is read onto bit line pair BLP. FIG. 25 shows by way of example a state where data at H-level is read.

In a subsequent clock cycle #C1, write command WRITE is applied, and column selection and data writing are executed. This write operation is executed in such a state that the sensing operation of sense amplifier circuit SA is not completed and the amplitude of bit line pair BLP is insufficient. In the data write operation, precharge instructing signal ZPR attains H-level, and precharging MOS transistors 75a and 75b are turned off. When mask instructing signal Mi is in the state instructing the masking against data writing, the output signal of AND circuit 76 is at L-level, and equalizing MOS transistor 75c maintains the on state so that write data lines 12wi and 12wj are short-circuited.

Before completion of the sensing operation of the sense amplifier circuit, write source select signal WS is driven to the selected state in accordance with the write pulse, and the write column select gate WG is turned on so that bit line pair BLP is electrically coupled to write data line pair 12w1. In the state where the data writing is masked, precharged charges on write data line pair 12w1 are merely transmitted onto bit line pair BLP, and sense amplifier circuit SA can perform the fast sensing operation because the potential on the bit line at a higher potential further rises. The bit line at the lower potential is discharged fast to the ground potential level because the n-channel MOS transistor included in sense amplifier circuit SA has a large driving capability. Since the equalizing MOS transistor 75c is on, write data lines 12wi and 12wj are discharged in the sensing operation to lower in voltage level. Charging and discharging of the sense amplifier circuit causes the potential difference between write data lines 12wi and 12wj due to the interconnection line resistance.

When mask data Mi is at H-level instructing data writing, tristate inverter buffers 66a4 and 66a5 are active. When write driver enable signal WDE is driven to the active state at H-level, AND circuits 66a1 and 66a2 transmit the write data, and tristate inverter buffers 66a4 and 66a5 transmit the write data to write data lines 12wi and 12wj, respectively. For writing the transmitted data, the output signal of AND circuit 76 attains H-level, and equalizing MOS transistor 75c is turned off. The drive capabilities of tristate inverter buffers 66a4 and 66a5 are much larger than the driving capability of sense amplifier circuit SA, and the sense data has a small amplitude so that the sense data of the sense amplifier circuit changes depending on the write data.

When the write operation is completed, the signal from mask control circuit 65a3 attains the write instructing state in accordance with clear pulse CLR, and the output signal of AND circuit 76 attains L-level. In addition, precharge instructing signal ZPR attains L-level. Accordingly, write data lines 12wi and 12wj are precharged and equalized to power supply voltage Vcc level. In this precharge/equalize operation, write column select gate WG is turned off, and bit line pair BLP is isolated from write data line pair 12w1. Upon completion of this write operation, sense amplifier circuit SA further performs the amplification to drive the voltages on bit line pair BLP to power supply voltage Vcc level (i.e., H-level) and ground potential GND level (i.e., L-level).

In clock cycle #C2, write command WRITE is applied again. In clock cycle #C2, sense amplifier circuit SA has already completed the sensing operation, and the voltages on bit line pair BLP are fixed at H- and L-levels.

In cycle #C2, mask data Mi and write data Di are applied in accordance with write command WRITE. Then, AND circuits 66a1 and 66a2 produce internal write data in accordance with write driver enable signal WDE. In accordance with the logical value of mask data Mi, tristate inverter buffers 66a4 and 66a5 are set to either output high-impedance state or the operable state. Further, equalizing MOS transistor 75c is selectively set to the off or on state in accordance with the mask data. Precharging MOS transistors 75a and 75b are off in the write operation. Sense amplifier circuit SA has completed the sensing operation, and the voltage amplitude of bit line pair BLP is sufficiently large and a sufficiently large voltage difference is present between bit line pair BLP. Accordingly, the pulse width of write pulse WS is set larger than that in clock cycle #C1 because the voltages on bit line pair BLP are set in accordance with the write data. Thereby, the voltages on bit line pair BLP change in accordance with the write data on write data line pair 12w1 in the data write operation.

When data write mask is applied, equalizing MOS transistor 75c is on, while tristate inverter buffers 66a4 and 66a5 are in the output high-impedance state. In this state, write source select signal WS is driven to the selected state in accordance with the write pulse, and the bit line pair BLP and write data line pair 12w1 are electrically coupled together. Charges moves between bit line pair BLP and write data line pair 12w1. In sense amplifier circuit SA, the discharging capability is larger than the charging capability, and thus the voltage levels on write data line pair 12w1 lower. However, sense amplifier circuit SA stably holds the voltage levels on bit line pair BLP to H- and L-levels without an influence by lowering of the voltages on write data line pair 12w1.

In the above operation, equalizing MOS transistor 75c is kept on during the data write masking. This is done for the following reason. If write data lines 12wi and 12wj were completely, electrically floated, noises of the opposite phases might occur on bit line pair BLP, when bit line pair BLP and write data line pair 12w1 are connected, to cause malfunction of sense amplifier circuit SA. For causing the noises of the same phase on the sense nodes of sense amplifier circuit SA when noises occur, equalizing MOS transistor 75c is kept on as described above. Even if the voltage amplitude of bit line pair BLP is small in the sensing operation of sense amplifier circuit SA, this signal of the small amplitude can be rapidly inverted in accordance with the write data owing to the on-state equalizing MOS transistor 75c. Further, a disadvantageous effect on the operation of sense amplifier circuit in the masking can be prevented.

Figure 28A:
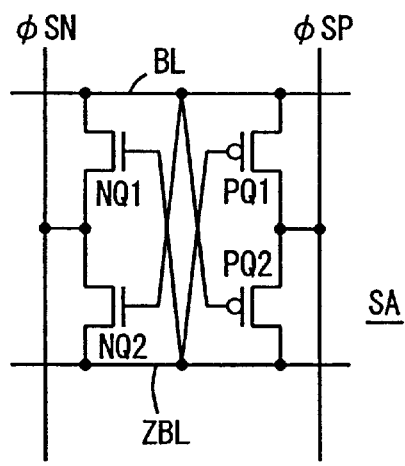
FIG. 28A shows a structure of a sense amplifier circuit.

FIG. 28A schematically shows a structure of sense amplifier circuit SA. Sense amplifier circuit SA includes an N-sense amplifier formed of n-channel MOS transistors NQ1 and NQ2, and a P-sense amplifier formed of p-channel MOS transistors PQ1 and PQ2. MOS transistors NQ1 and NQ2 are supplied on their source nodes with a sense amplifier activating signal φSN, and p-channel MOS transistors PQ1 and PQ2 are supplied on their source nodes with a sense amplifier activating signal φSP. Sense amplifier circuit SA differentially amplifies the voltages on bit lines BL and ZBL. During the sensing operation, bit lines BL and ZBL are coupled to write data lines 12wi and 12wj, respectively.

Figure 28B:
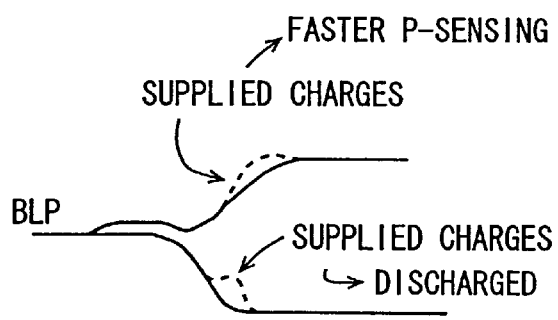
FIG. 28B shows an effect of write data line equalization.

During the data write masking, charges are supplied from the write data line to the bit line at a higher potential as shown in FIG. 28B so that the voltage level on the bit line rises, and the sensing operation of the P-sense amplifier is accelerated. Meanwhile, the charges supplied to the bit line at a lower potential are discharged by the N-sense amplifier, and the potential on the bit line at the lower potential is once raised and then driven to the ground potential level again. Since the N-sense amplifier has a large driving capability, the rise of the voltage level on the bit line at the lower potential caused by the supplied charges does not cause a problem. A period for which the bit line pair and the write data line pair are coupled together in the sensing operation is shortened, and the activation timing of write source select signal WS in this case is delayed, so that the bit line pair and the write data line pair are electrically coupled in the state where the voltage difference on the bit line pair is relatively large. Accordingly, even if the active period of write pulse WS is short, the active period is in the sensing operation period and the sense data of the sense amplifier circuit can be sufficiently set to the state corresponding to the write data.

Figure 29:
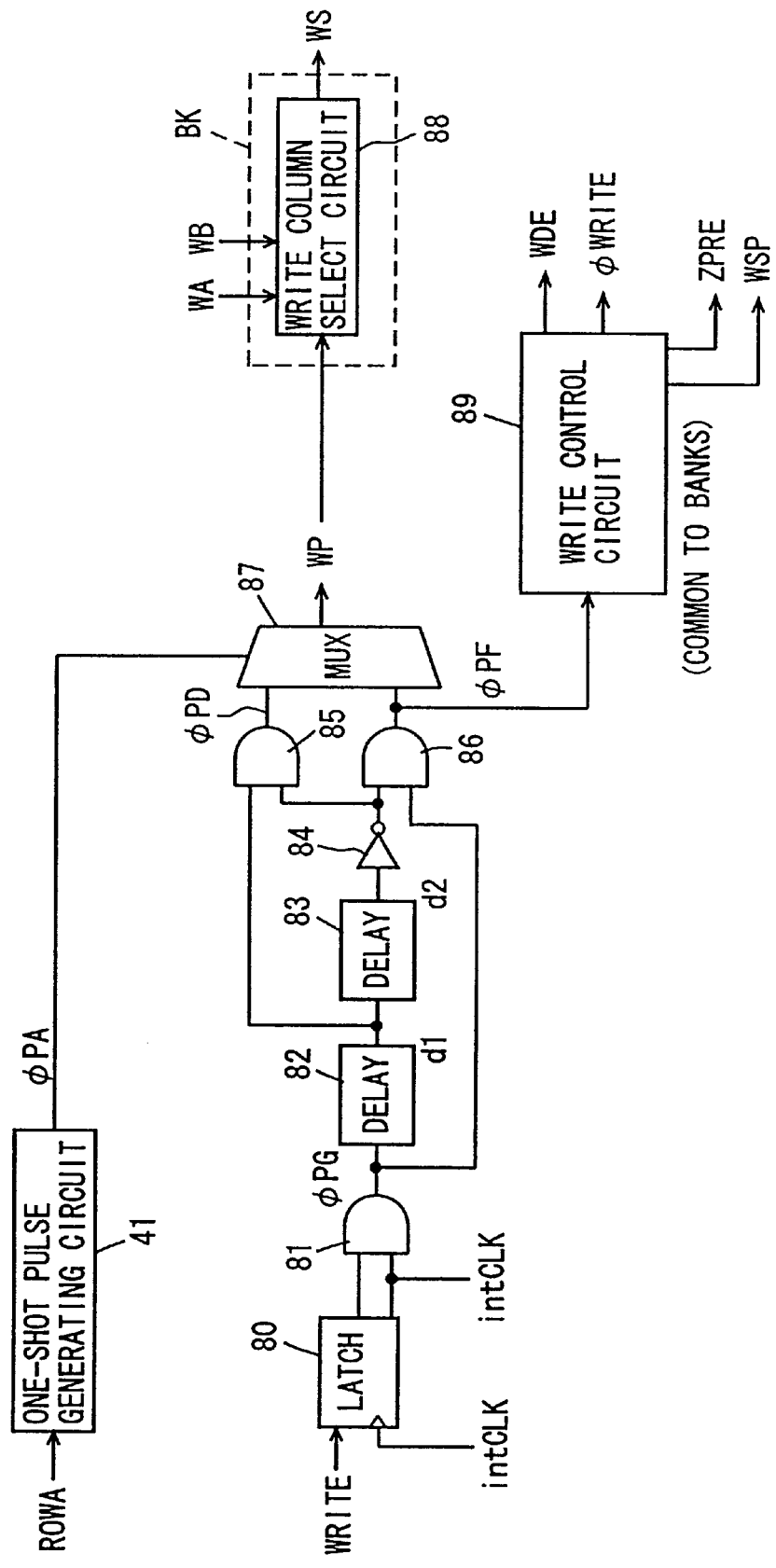
FIG. 29 schematically shows a structure of a data write control portion according to the second embodiment of the invention.

FIG. 29 schematically shows a structure of a portion generating the control signals related to the data writing. In FIG. 29, the write control signal generating portion includes one-shot pulse generating circuit 41 for generating pulse signal φPA of one shot in accordance with row access command ROWA, a latch 80 taking in write command WRITE in accordance with internal clock signal intCLK, an AND circuit 81 receiving the output signal of latch 80 in accordance with internal clock signal intCLK, to produce a pulse signal φPG, a delay circuit 82 for delaying output signal φPG of AND circuit 81 by a time d1, a delay circuit 83 for delaying the output signal of delay circuit 82 by a time d2, an inverter 84 inverting the output signal of delay circuit 83, an AND circuit 85 receiving the output signals of delay circuit 82 and inverter 84, to produce a pulse signal φPD, an AND circuit 86 receiving output signal φPG of AND circuit 81 and the output signal of inverter 84, to produce a pulse signal φPF, and a multiplexer (MUX) 87 for selecting one of output pulse signal φPD of AND circuit 85 and output pulse signal φPF of AND circuit 86 in accordance with pulse signal φPA applied from one-shot pulse generating circuit 41, to produce a write pulse WP.

One-shot pulse generating circuit 41 has a structure similar to that of one-shot pulse generating circuit 41 previously described and shown in FIG. 19, and is set, e.g., to the state at H-level for a period after row access command ROWA is applied and before the sense amplifier circuit internally operates to perform the sensing operation for developing the voltage difference on the bit line pair to a sufficiently large value.

Write pulse WP from multiplexer 87 is applied to a write column select circuit 88 included in each of banks BK. Write column select circuit 88 includes a column selection control circuit and a column decoder, and is selectively activated, in accordance with write bank address signal WB and write address signal WA, to perform the column selection and produce write source select signal WS. The active period of write source select signal WS is determined by write pulse WP.

Figure 30:
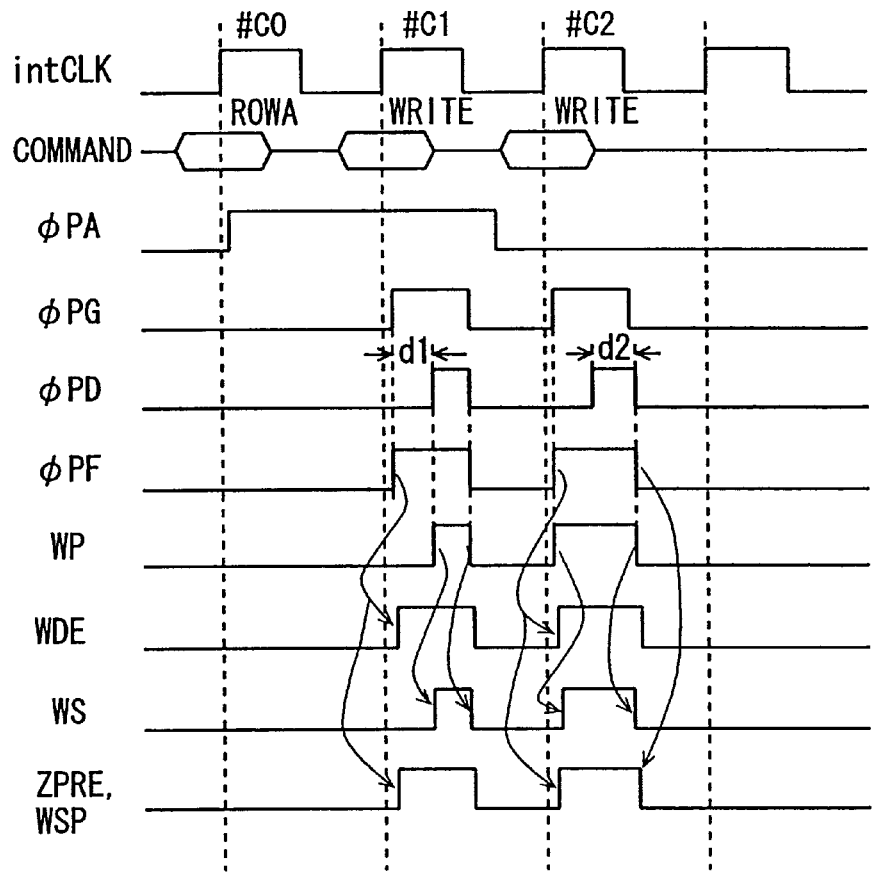
FIG. 30 is a timing chart representing an operation of the circuit shown in FIG. 29.

Pulse signal φPF from AND circuit 86 is applied to a write control circuit 89 provided commonly to the banks. Write control circuit 89 produces write driver enable signal WDE, precharge instructing signal ZPRE, write data line equalize instructing signal (write pulse) WSP and write operation instructing signal WRITE. Write operation instructing signal WRITE controls the operation of the write buffer for taking in the externally applied write data, the operation of the defective column determining circuit for setting the connection path of the shift circuit provided in the data write path and the operation of the write select circuit for selecting write data line, for example. Now, the operation of the write control signal generating portion shown in FIG. 29 will be described below with reference to a timing chart of FIG. 30.

In cycle #C0 of internal clock signal intCLK, row access command ROWA is applied. In accordance with row access command ROWA, one-shot pulse generating circuit 41 generates pulse signal φPA of one shot, which in turn becomes active (first logical value state) for a predetermined period. In accordance with activation of pulse signal φPA, multiplexer 87 is set to the state of selecting the output pulse signal of AND circuit 85.

Then, write command WRITE is applied in the next cycle #C1. Write command WRITE is taken into latch circuit 80 at the rising of internal clock signal intCLK. AND circuit 81 operates as a buffer in accordance with the rising of internal clock signal intCLK, and holds pulse signal φPG at H-level for a period equal to half the cycle of internal clock signal intCLK.

Delay circuits 82 and 83 have delay times d1 and d2, respectively. Accordingly, pulse signal φPD from AND circuit 85 attains H-level upon elapsing of delay time d1 after pulse signal φPG from AND circuit 81 rises to H-level. The period for which pulse signal φPD is at H-level is equal to delay time d2 of delay circuit 83. Meanwhile, pulse signal φPF attains H-level in response to rising of pulse signal φPG from AND circuit 81, and falls to L-level when the output signal of delay circuit 83 rises to H-level. Accordingly, the period for which pulse signal φPF is at H-level is equal to a sum (d1+d2) of delay times d1 and d2. Pulse signals φPD and φPF fall to L-level at the same timing.

In clock cycle #C1, multiplexer 87 selects pulse signal φPD applied from AND circuit 86 so that write pulse WP is produced in accordance with this pulse signal φPD. Write column select circuit 88 performs the column selection in accordance with write pulse WP, and drives write source select signal WS to the selected state. Therefore, write source select signal WS attains H-level after delay time d1 elapses from rising of pulse signal φPG to H-level. When pulse signal PD attains L-level, write pulse signal WP is driven to L-level.

Write control circuit 89 operates in accordance with pulse signal φPF, and therefore the operation required for transmitting the write data onto the write data lines is performed in response to the rising of pulse signal φPG. More specifically, write driver enable signal WDE is driven to the active state in accordance with activation of pulse signal φPF, precharge instructing signal ZPRE is driven to the inactive state at H-level, and write data line equalize instructing signal WSP is driven to H-level. In cycle #C1, the write driver drives the write data line pair to transmit the write data. Thereafter, the write data line pair and the selected bit line pair are electrically coupled in accordance with write source select signal WS.

In clock cycle #C2, write command WRITE is applied again. In clock cycle #C2, pulse signal φPA is already lowered to L-level, and multiplexer 87 is set to the state of selecting pulse signal φPF applied from AND circuit 86. In accordance with write command WRITE, pulse signals φPD and φPF are produced similarly to the preceding cycle C1. Since multiplexer 87 selects the pulse signal φPF, write pulse WP changes in accordance with pulse signal φPF. Write column select circuit 88 starts the column selection in accordance with activation of write pulse WP. In cycle #C2, write source select signal WS is activated in response to rising of pulse signal φPF, and therefore is driven to the active state at a timing earlier than that in cycle #C1.

Write control circuit 89 controls writing of data onto write data line pair in accordance with pulse signal φPF, similarly to cycle #C1. In cycle #C2, sense amplifier circuit has completed the sensing operation, and the voltages on the bit line pair are fixed to H- and L-level. For a relatively long period, a selected bit line pair and the write data line pair are connected together, and the latching data of the sense amplifier circuit is set to the state corresponding to the write data. In cycles #C1 and #C2, write source select signal WS is driven to the inactive state at the same timing. There is a difference only in the timing for starting the column selection. When viewed externally, therefore, the times required for data writing are equal to each other.

In the structure of the write driver shown in FIG. 26, drivers 66a1 and 66a2 produce the write data in accordance with the write data applied from latch 65a2. Write data line pairs are subjected to two-to-one selection, and the write data is not transmitted to the unselected write data line pair. In this case, therefore, the signal obtained by the logical product (AND) of mask data Mi and select signal φSW is applied to mask control circuit 65a3, so that the writed drivers provided for the unselected write data line pair can be set to the output high-impedance state. Thus, write drivers provided for an unselected write data line pair can be reliably set to the output high-impedance state.

[Modification]

Figure 31:
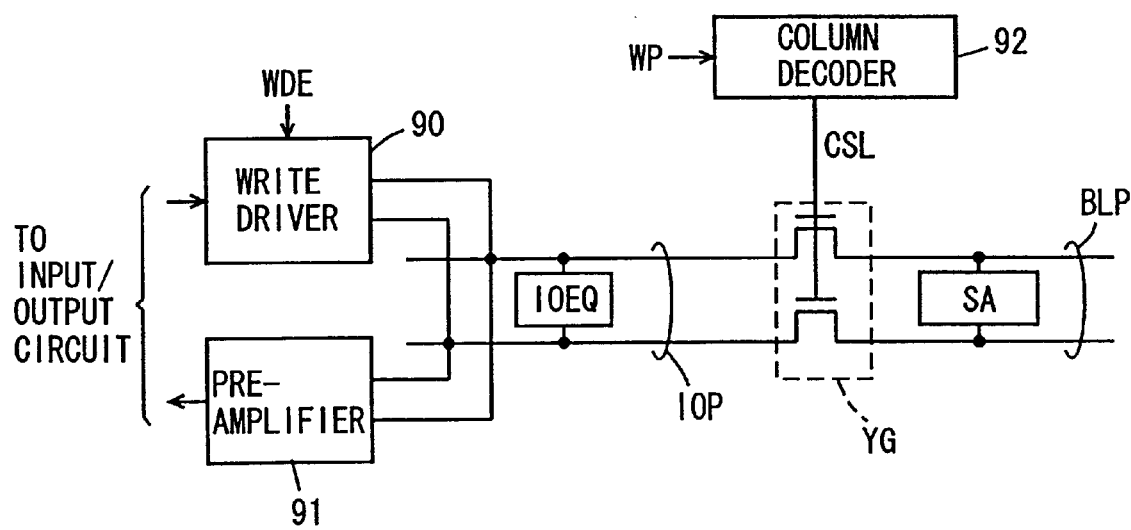
FIG. 31 schematically shows a structure of a modification of the second embodiment of the invention.

FIG. 31 schematically shows a structure of a modification of the second embodiment of the invention. In FIG. 31, a write driver 90 and a preamplifier 91 are commonly coupled to an internal data line pair IOP. Internal data line pair IOP transmits both the read data and the write data. Internal data line pair IOP is electrically coupled to bit line pair BLP via a column select gate YG. Column select gate YG is driven to the selected state in accordance with a column select signal CSL applied from a column decoder 92. Bit line pair BLP is coupled to sense amplifier circuit SA, and internal data line pair IOP is connected to an I/O equalize/precharge circuit IOEQ. The write driver 92 is supplied with write driver enable signal WDE, and column decoder 92 is supplied with write pulse WP.

Insofar as the data writing is concerned, in the structure shown in FIG. 31 the writing of external data can be performed at an early timing after application of a row select instruction. The operations of write driver 90 and column decoder 92 are the same as those already described. When a write instruction is applied within a predetermined time period after application of a row select instruction, column decoder 92 is activated at a delayed timing, and the active period of column select signal CSL is shortened (according to write pulse WP).

As the write instruction is applied, write driver 90 drives the internal data line pair IOP in accordance with write driver enable signal WDE.

In the structure shown in FIG. 31, preamplifier 91 is activated always at the same timing when the read instruction is applied. Insofar as the data writing is concerned, therefore, the external data writing can be performed at an early timing even in the structure in which the read data and the write data are transmitted through internal data line pair IOP.

Write driver 90 and preamplifier 91 are coupled to an input/output circuit. This input/output circuit may perform the data input/output of data via the same data node, or may perform the data input and the data output via different data nodes.

According to the second embodiment of the invention, when the data write instruction is applied within a predetermined period after application of the row select instruction, data writing to a selected memory cell is performed at a slower timing than that in the subsequent data write cycles, and the column select time is reduced. Therefore, the data writing can be performed before completion of the sensing operation of the sense amplifier, and fast access can be achieved.

[Third Embodiment]

Figure 32:
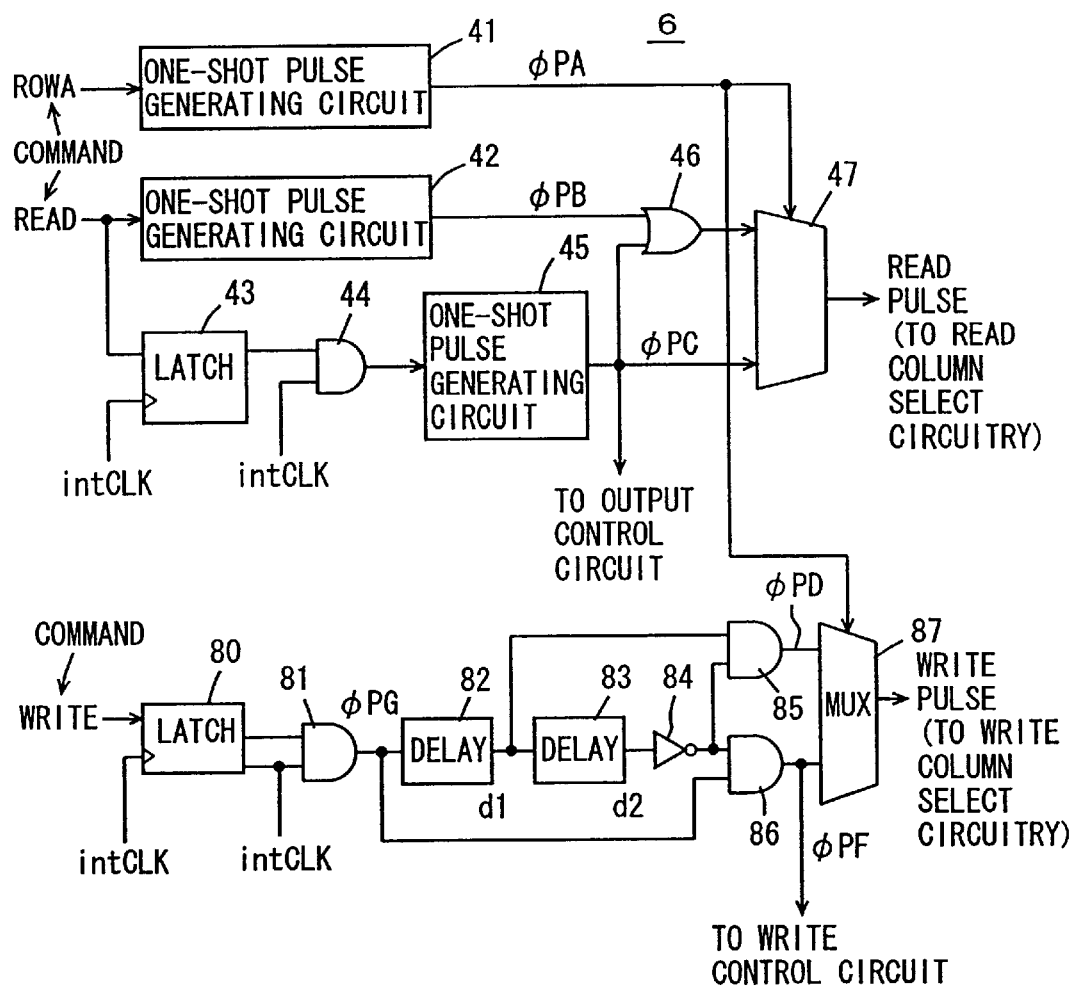
FIG. 32 schematically shows a structure of a main portion of a semiconductor memory device according to a third embodiment of the invention.

FIG. 32 shows a structure of a main portion of a semiconductor memory device according to a third embodiment of the invention. FIG. 32 shows a structure of a control signal generating circuit generating the read and write pulses. The control signal generating circuit shown in FIG. 32 corresponds to a combination of the read pulse generating circuit of the first embodiment shown in FIG. 19 and the write pulse generating circuit shown in FIG. 29. By utilizing the control signal generating circuit shown in FIG. 32, the read column selection start timing is advanced, and the period for the read column selection is increased when read command READ is applied within a predetermined period after application of a row access instruction. When write command WRITE is applied within a predetermined period after application of row access command ROWA, the write column selection start timing is delayed, and the period for the column selection is reduced. The read gate amplifier for the read column selection includes an MOS transistor having a gate connected to a bit line. Meanwhile, the write column select gate is merely formed of a transfer gate. Therefore, the read operation start timing can be advanced without destructing memory cell data in the data read operation. In the write operation, memory cell data is changed by the write data even if the memory cell data is destructed and the external data write timing can be advanced. Thus, both the writing and reading can be performed at early timings after application of a row access command, and the semiconductor memory device allowing fast access is achieved.

The semiconductor memory device according to the third embodiment may be of any type of dynamic semiconductor memory devices, provided that the read column select gate and the write column select gate are provided individually, and the read column select gate differentially amplifies the data on a bit line pair for transmission onto the read data line pair.

According to the third embodiment of the invention, the timing and period of an internal operation related to a column access command applied within a predetermined period after application of a row access command are different from those related to the subsequent column access command. Therefore, data read/write can be performed at an early timing, and semiconductor memory device allowing fast access is achieved.

[Fourth Embodiment]

Figure 33:
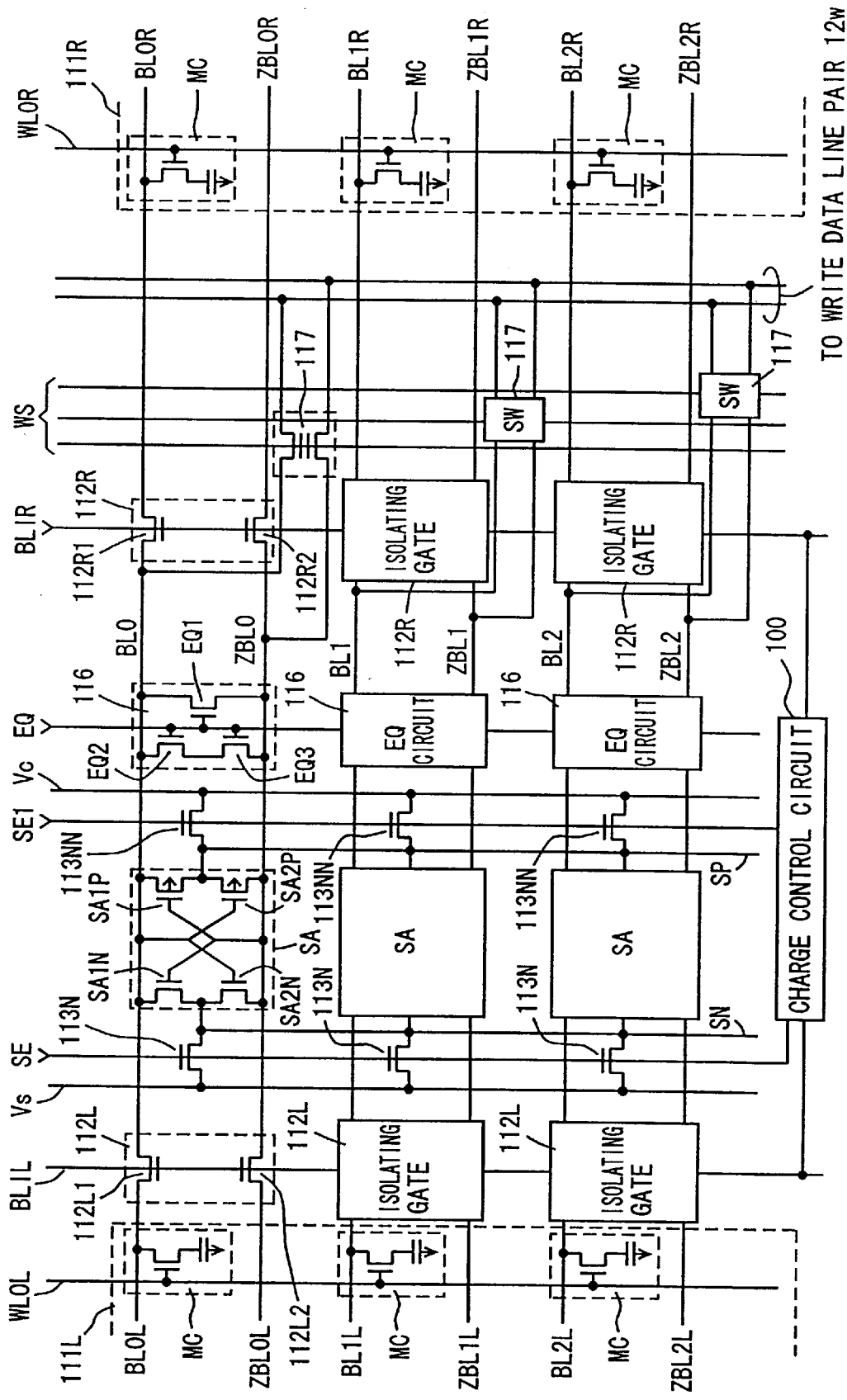
FIG. 33 schematically shows a structure of a sense amplifier band in a semiconductor memory device according to a fourth embodiment of the invention.

FIG. 33 shows a structure of a main portion of a semiconductor memory device according to a fourth embodiment of the invention. FIG. 33 shows a structure of memory blocks 111L and 111R adjacent to each other in the column direction as well as a sense amplifier band arranged between them. In the structure of memory array shown in FIG. 33, the sense amplifier circuits are arranged in an alternately arranged shared sense amplifier structure. In the alternately arranged, shared sense amplifier structure, sense amplifiers SA are arranged corresponding to bit line pairs in alternate columns. FIG. 33 shows the bit line pairs arranged corresponding to the sense amplifier band, and does not show the bit line pairs which are always isolated from the sense amplifier band shown in FIG. 33. Memory blocks 111L and 111R correspond to memory cell blocks adjacent to each other in the column direction as in the first embodiment.

Memory block 111L includes bit line pairs BL0L and ZBL0L, BL1L and ZBL1L, and BL2L and ZBL2L provided corresponding to memory cell columns. In memory block 111L, word line WL0L is shown representatively. Memory cell MC is arranged corresponding to the crossing between word line WL0L and one of paired bit lines. In FIG. 33, memory cells MC are arranged corresponding to the crossings between word line WL0L and bit lines BL0L, BL1L and BL2L, respectively.

In memory block 111R, bit lines BL0R, ZBL0R, BL1R, ZBL1R, BL2R and ZBL2R are likewise arranged corresponding to the columns of memory cells MC. The bit line pairs in memory block 111L are arranged corresponding to the bit line pairs in memory block 111R, respectively.

For these memory blocks 111L and 111R, common bit lines BL0, ZBL0, BL1, ZBL1, BL2 and ZBL2 are arranged. Sense amplifier circuits SA are arranged for common bit lines BL0 and ZBL0–BL2 and ZBL2. Sense amplifier circuit SA includes n-channel MOS transistors SA1N and SA2N having gates and drains cross-coupled, and p-channel MOS transistors SA1P and SA2P having gates and drains cross-coupled. MOS transistor SA1N has a drain coupled to common bit line BL (BL0), a gate connected to common bit line ZBL (ZBL0) and a source connected to an N-common source node SN. MOS transistor SA2N has a drain and a gate connected to common bit lines BL and ZBL, respectively, and a source connected to N-common source node SN.

MOS transistor SA1P has a gate and a drain connected to common bit lines ZBL and BL, respectively, and also has a source connected to a P-common source node SP. MOS transistor SA2P has a gate and drain connected to common bit lines BL and ZBL, respectively, and also has a source connected to P-common source node SP. P-source node of each sense amplifier circuit SA is commonly connected together every predetermined number of sense amplifiers (or P-source nodes of all sense amplifier circuits SA may be commonly connected to P-common source node SP). Likewise, N-common source node SN is commonly connected to the N-source nodes of the predetermined number of sense amplifier circuits.

Further, there arranged a power supply line Vs for commonly transmitting ground potential Vss to these sense amplifier circuits SA, and sense amplifier drive transistors 113N turned on, in response to a sense amplifier drive signal SE, to connect the N-source nodes of the corresponding sense amplifiers to power supply line Vs. There are further arranged a power supply line Vc for commonly transmitting power supply potential Vcc to sense amplifier circuits SA, and sense amplifier drive transistors 113NN turned on, in response to a sense amplifier drive signal SE1, to connect the P-source nodes of corresponding sense amplifiers to power supply line Vc. Sense amplifier drive transistor 113NN is formed of an n-channel MOS transistor. Sense amplifier drive signal SE is activated at the same or earlier timing relative to sense amplifier drive signal SE1.

For each common bit line pair, an equalize circuit (bit line equalize circuit) 116 is provided. Bit line equalize circuit 116 includes an equalize transistor EQ1 turned on to electrically short-circuit the corresponding common bit lines in response to activation of equalize instructing signal EQ, and precharge transistors EQ2 and EQ3 turned on to transmit a precharge voltage (not shown) at an intermediate voltage level to common bit lines BL and ZBL, respectively, when equalize instructing signal EQ is active.

Isolation gates 112L are arranged between the sense amplifier band and the memory block 111L. Isolation gates 112L are arranged to bit line pairs in the block 111L and are selectively turned on in accordance with a bit line isolation instructing signal BLIL. Bit line isolation gate 112L includes a pair of transfer gates 112L1 and 112L2 for connecting a corresponding bit line pair to a corresponding common bit line pair in accordance with bit line isolation instructing signal BLIL.

Likewise, isolation gates 112R, are arranged corresponding to the respective bit line pairs in the block 111R between the sense amplifier band and memory block 111R, and are selectively turned on in accordance with bit line isolation instructing signal BLIR. Isolation gate 112R includes a pair of transfer gates 112R1 and 112R2 for connecting a corresponding bit line pair to a corresponding common bit line pair in accordance with bit line isolation instructing signal BLIR.

As for column select gates, write column select gates 117 (WSG) which are selectively turned on in accordance with write source select signal line group WS are provided corresponding to the common bit line pairs, respectively. Write column select gates 117 each select one from four sense amplifier circuits SA to electrically connect the selected one to write data line pair 12w (not shown). Although read gate amplifiers (WGA) are also provided corresponding to the common bit line pairs, respectively, they are not shown in FIG. 33 for simplicity of illustration.

Since only a pair of sense drive transistors 113N and 113NN are provided for each sense amplifier circuit SA, increase in occupying area is suppressed. Sense amplifier circuit SA is coupled to power source lines Vs and Vc via corresponding sense amplifier drive transistors 113N and 113NN, respectively. Therefore, the N- and P-source nodes of sense amplifier circuit SA attain the voltage levels of ground voltage Vss and power supply voltage Vcc, respectively, so that the sense amplifier circuit SA is stably supplied with the sense power supply voltage for performing the sensing operation. The plurality of sense amplifier circuits have source nodes interconnected via common source nodes SN and SP. Therefore, the sense power source voltage does not distribute, and stable and fast sensing operation can be achieved. In particular, the sense power source voltages are constant in individual sense amplifier circuits, and the sensing operations can be performed at the same sensing speed.

In this sense amplifier band, there is arranged a charge control circuit 100 for selectively making a short-circuit between sense amplifier drive signal lines SE and SE1 and between bit line isolation instructing signal lines BLIL and BLIR, to control the voltage level of the bit line isolation instructing signals. Signals and signal lines transmitting the signals are indicated by the same reference numerals or characters.

In a standby state and a selected state, bit line isolation instructing signal lines BLIL and BLIR are at a level of a boosted voltage Vpp higher than power supply voltage Vcc. In an unselected state, bit line isolation instructing signal lines BLIL and BLIR are discharged to the ground voltage level. Since sense amplifier drive transistor 13NN is formed of n-channel MOS transistor, sense drive signal SE1 is likewise at the boosted voltage Vpp level.

Charge control circuit 100 selectively short-circuits the bit line isolation instructing signal lines and the sense amplifier drive signal lines, to lower the voltage level of the bit line isolation instructing signal in the selected state, to raise the sense amplifier drive signal rapidly, to increase the on-resistance of isolation gate 112L or 112R, and to activate the sense drive signals SE and SE1 at a faster timing for implementing fast sensing operation.

Figure 34:
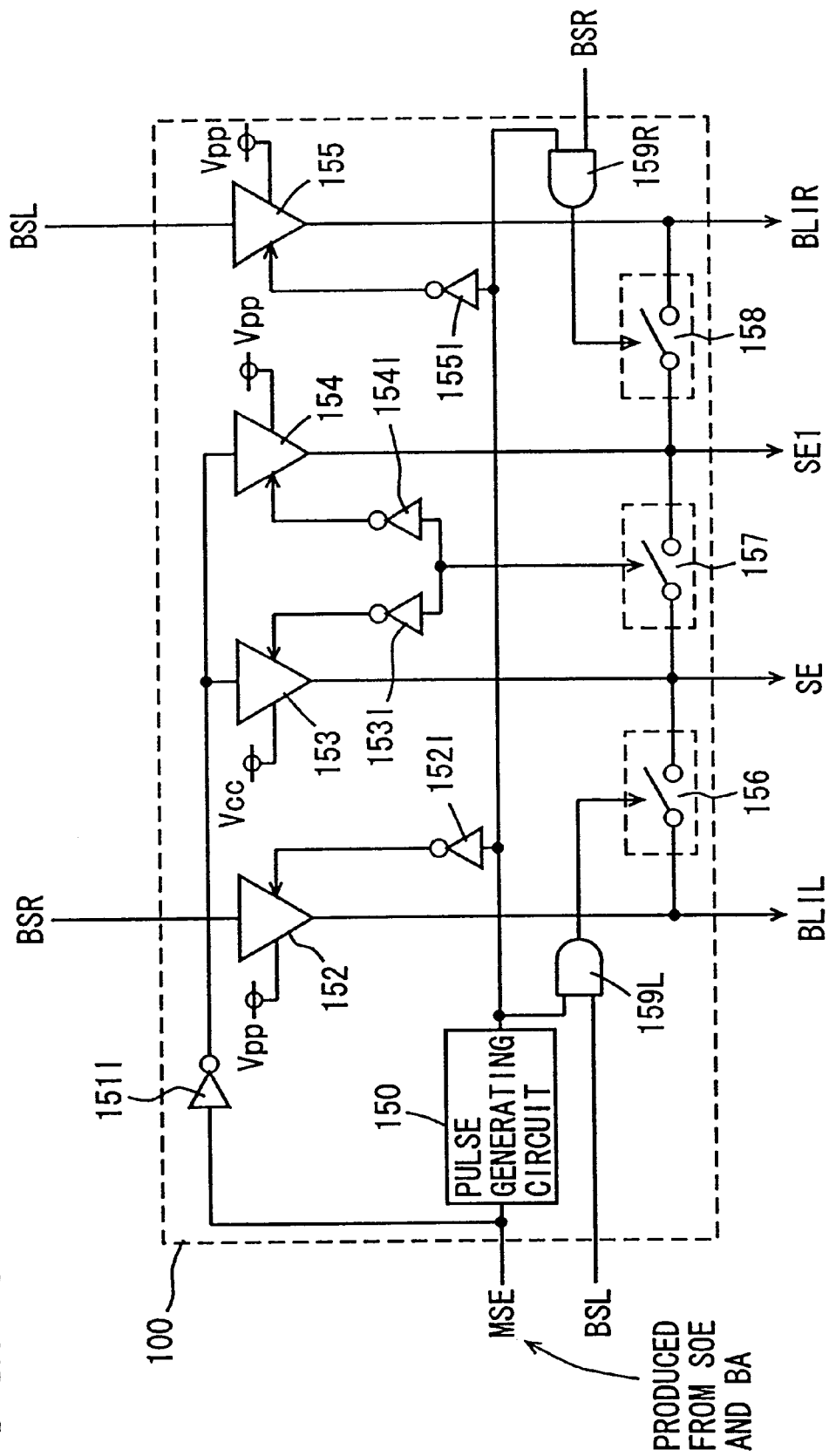
FIG. 34 schematically shows a structure of a charge control circuit shown in FIG. 33.

FIG. 34 shows by way of example a structure of charge control circuit 100 shown in FIG. 33. In FIG. 34, charge control circuit 100 includes an inverter 151I inverting a main sense amplifier drive signal MSE, a pulse generating circuit 150 generating, in response to activation of main sense amplifier drive signal MSE, a pulse signal at H-level for a predetermined period, a tristate buffer 152 receiving a memory block designating signal BSR designating memory block 111R, tristate buffers 153 and 154 receiving the output signal of inverter 151I, and a tristate buffer 155 receiving memory block designating signal BSL designating memory block 111L. Each of memory block designating signals BSR and BSL is produced by a combination of a bank designating signal and a row block designating signal, if one bank includes a plurality of row blocks, and internally the shared sense amplifier structure is utilized. If the memory bank is formed of one row block, memory block designating signals BSR and BSL are produced in accordance with bank address signal BA.

Main sense amplifier drive signal MSE is activated in accordance with a sense amplifier activation trigger signal SOE and a bank designating signal (or a combination of the bank designating signal and the row block designating signal). More specifically, main sense amplifier drive signal MSE is activated in response to sense amplifier activation trigger signal SOE only in a selected row block of a selected bank. Tristate buffer 152 generates bit line isolation instructing signal BLIL, and tristate buffer 155 generates bit line isolation instructing signal BLIR. Tristate buffer 153 generates sense amplifier drive signal SE, and tristate buffer 154 generates sense amplifier drive signal SE1. Each of tristate buffers 152, 154 and 155 operates using boosted voltage Vpp as one operation power supply voltage. Tristate buffer 153 operates using power supply voltage Vcc as one operation power supply voltage.

Charge control circuit 100 further includes inverters 152I, 153I, 154I and 155I for setting tristate buffers 152, 153, 154 and 155, respectively, to the output high-impedance state in accordance with the pulse signal from one-shot pulse generating circuit 150, an AND circuit 159L receiving the pulse signal from pulse generating circuit 150 and memory block designating signal BSL, an AND circuit 159R receiving memory block designating signal BSR and the pulse signal generated from pulse generating circuit 150, a switch circuit 156 turned on to short-circuit the outputs of tristate buffers 152 and 153 when the output signal of AND circuit 159L is at H-level, a switch circuit 157 for short-circuiting the outputs of tristate buffers 153 and 154 in accordance with the pulse signal generated from pulse generating circuit 150, and a switch circuit 158 turned on to short-circuit the outputs of tristate buffers 154 and 155 when the output signal of AND circuit 159R is at H-level. When turned on, these switch circuits 156, 157 and 158 set the corresponding signals to the same voltage level.

Figure 35:
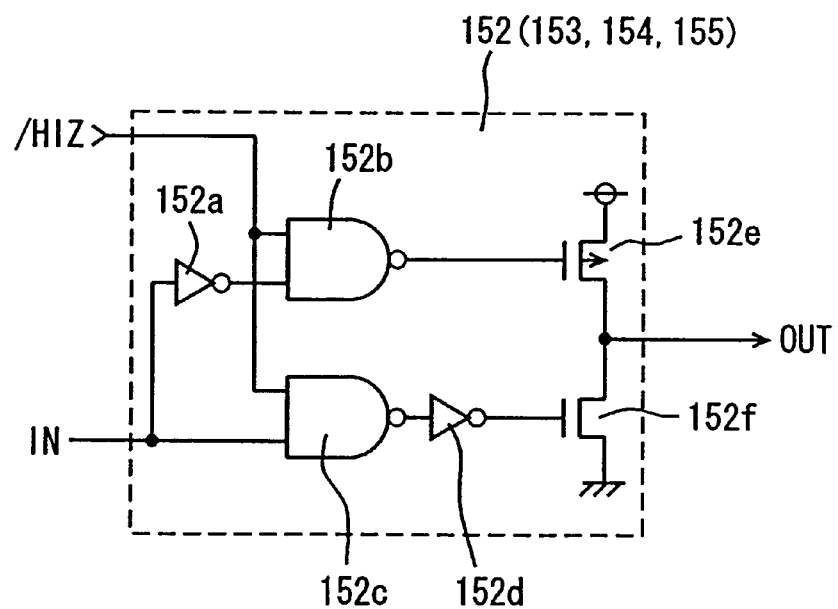
FIG. 35 shows a structure of a tristate buffer shown in FIG. 34.

FIG. 35 shows an example of the structure of tristate buffers 152–155 shown in FIG. 34. Since these tristate buffers 152–155 have the same structures, FIG. 35 shows only tristate buffer 152 representatively.

In FIG. 35, tristate buffer 152 (153, 154 and 155) includes an inverter 152*a* receiving input signal IN, an NAND circuit 152*b* receiving the output signal of inverter 152*a* and an output control signal /HIZ, an NAND circuit 152*c* receiving output control signal /HIZ and input signal IN, an inverter 152*d* inverting the output signal of NAND circuit 152*c*, a p-channel MOS transistor 152*e* turned on, when the output signal of NAND circuit 152*b* is at L-level, to drive output signal OUT to the level of voltage on the power supply node (boosted voltage Vpp), and an n-channel MOS transistor 152*f* turned on, when output signal of inverter 152*d* is at H-level, to discharge output signal OUT to the ground voltage level.

Output control signal /HIZ is generated from the inverter receiving the pulse signal from pulse generating circuit 150, and corresponds to the output signals of inverters 152I–155I. The power supply voltage applied to the source of p-channel MOS transistor 152*e* is boosted voltage Vpp or power supply voltage Vcc. The operation for data writing in the fourth embodiment shown in FIGS. 33 to 35 will now be described with reference to a signal waveform diagram of FIG. 36.

A row access command is applied to designate memory block 111L. During standby, bit line isolation instructing signals BLIR and BLIL are at the level of boosted voltage Vpp, and bit line equalize instructing signal EQ and data line equalize signal IOEQ are also at H-level. The data line equalize signal IOEQ is driven to the level of boosted voltage Vpp because the n-channel MOS transistors are used in data line equalize circuit.

When memory block 111L is designated, memory block designating signal BSR maintains L-level, and memory block designating signal BSL rises to H-level. In charge control circuit 100 shown in FIG. 34, therefore, bit line isolation instructing signal BLIL from tristate buffer 152 maintains the level of boosted voltage Vpp, and the bit line isolation instructing signal BLIR lowers to L-level.

Then, bit line equalize instructing signal EQ and data line equalize signal IOEQ are driven to L-level, and equalizing of the bit line pair and the equalizing of the data lines are completed. In data writing, the write data line pair is electrically floated at the precharge voltage level, and the common bit line is electrically floated at the intermediate voltage level. In accordance with this row access command, the word line selecting operation is performed in memory block 111L so that the voltage level of a selected word line WL rises to the boosted voltage Vpp level.

The date of memory cell MC connected to selected word line WL is transmitted to the common bit lines BL and ZBL (BL0 and ZBL0) via the corresponding bit lines. When the voltage levels on common bit lines BL0 and ZBL0 are sufficiently developed, main sense drive signal MSE is activated. In response to activation of main sense amplifier drive signal MSE, pulse generating circuit 150 produces the pulse signal of one shot having a pulse width of Tp. In response to activation of main sense drive signal MSE, the output signal of inverter 151I lowers to L-level. The output signals of inverters 152I–155I attain L-level in accordance with the pulse signal generated from pulse generating circuit 150, and tristate buffers 152–155 attain the output high-impedance state. This is achieved by such a situation that output control signal /HIZ in FIG. 35 attains L-level, the output signal of NAND circuit 152*b* attains H-level, the output signal of inverter 152*d* attains L-level, and both MOS transistors 152*e* and 152*f* are turned off.

In accordance with the pulse signal generated from pulse generating circuit 150, the output signal of AND circuit 159L attains H-level to turn on switch circuit 156, and switch circuit 157 is turned on in accordance with the pulse signal applied from pulse generating circuit 150. Since memory block designating signal BSR is at L-level, the output signal of AND circuit 159R is at L-level, and switch circuit 158 maintains the off state.

Since tristate buffers 152–154 are in the output high-impedance state, signals BLIL, SE and SE1 are equalized to the same voltage level. Thus, the voltage level of bit line isolation instructing signal BLIL lowers from the level of boosted voltage Vpp, and the voltage levels of sense amplifier drive signals SE and SE1 rise from the ground voltage level. The equalized voltage level of signals BLIL, SE and SE1 is determined in accordance with the ratio between load capacitance of these signal lines as well as the voltage levels of these signals immediately before pulse generating circuit 150 generates the pulse. This equalized voltage Va satisfies at least a relationship of Vss<Va<Vpp.

When the voltage level of bit line isolation instructing signal BLIL lowers, the on-resistances of transfer gates 112L1 and 112L2 included in isolation gate 112L shown in FIG. 33 increase, so that the bit line of memory block 111L is electrically isolated from the common bit line. Consequently, the load on sense amplifier circuit SA is reduced. At substantially the same time as the voltage lowering of bit line isolation instructing signal BLIL, the voltage levels of sense amplifier drive signals SE and SE1 rise so that sense amplifier circuit SA starts the sensing operation. Although sense amplifier drive signals SE and SE1 are at low voltage levels, the sensing operation is executed relatively fast because the load on sense amplifier circuit SA is small.

Subsequently, the pulse signal generated from pulse generating circuit 150 falls to L-level. Responsively, the output signal of AND circuit 159L attains L-level, and the switch circuit 156 is turned off. Also, switch circuit 157 is turned off in accordance with the output signal of pulse generating circuit 150. At the same time, the output signals of inverters 152I–155I attain H-level, and tristate buffers 152–155 return from the output high-impedance state to the active state.

Since the output signal of inverter 151I is at L-level, sense amplifier drive signals SE and SE1 generated from tristate buffers 153 and 154 rapidly rise to power supply voltage Vcc level and boosted voltage Vpp level, respectively. Also, bit line isolation instructing signal BLIL returns to boosted voltage Vpp level. In the waveform diagram of FIG. 36, sense amplifier drive signals SE and SE1 as well as bit line isolation instructing signal BLIL are driven to H-level at different timings, respectively. This can be achieved by providing a fall-delaying function in NAND circuit 152*b* in the structure of the tristate buffer shown in FIG. 35. In the sensing operation of sense amplifier circuit SA performed in response to sense drive signals SE and SE1, bit line isolation instructing signal BLIL is at an intermediate voltage level, and the load on the sense amplifier circuit is small so that the sensing operation is performed fast. When this sense amplifier circuit SA sufficiently develops the voltage levels on the sense nodes (common bit lines), bit line isolation instructing signal BLIL attains boosted voltage Vpp level, and each bit line in memory block 111L is driven fast via isolating gate 112L which in turn is in a low on-resistance state.

After the operation of raising the voltage on bit line isolation instructing signal BLIL, data writing is performed as follows. First, the write driver transmits the write voltages onto the write data line pair, and then the write pulse (write source select signal) WS is driven to H-level for a predetermined period. Owing to this write pulse, a selected column select gate is turned on so that the write data is transmitted to sense amplifier circuit SA and the memory cell. When the write pulse (write source select signal) WS attains L-level, select gate 117 is turned off so that the data writing is completed, and the write data line pair returns to the precharging voltage level.

Figure 36:
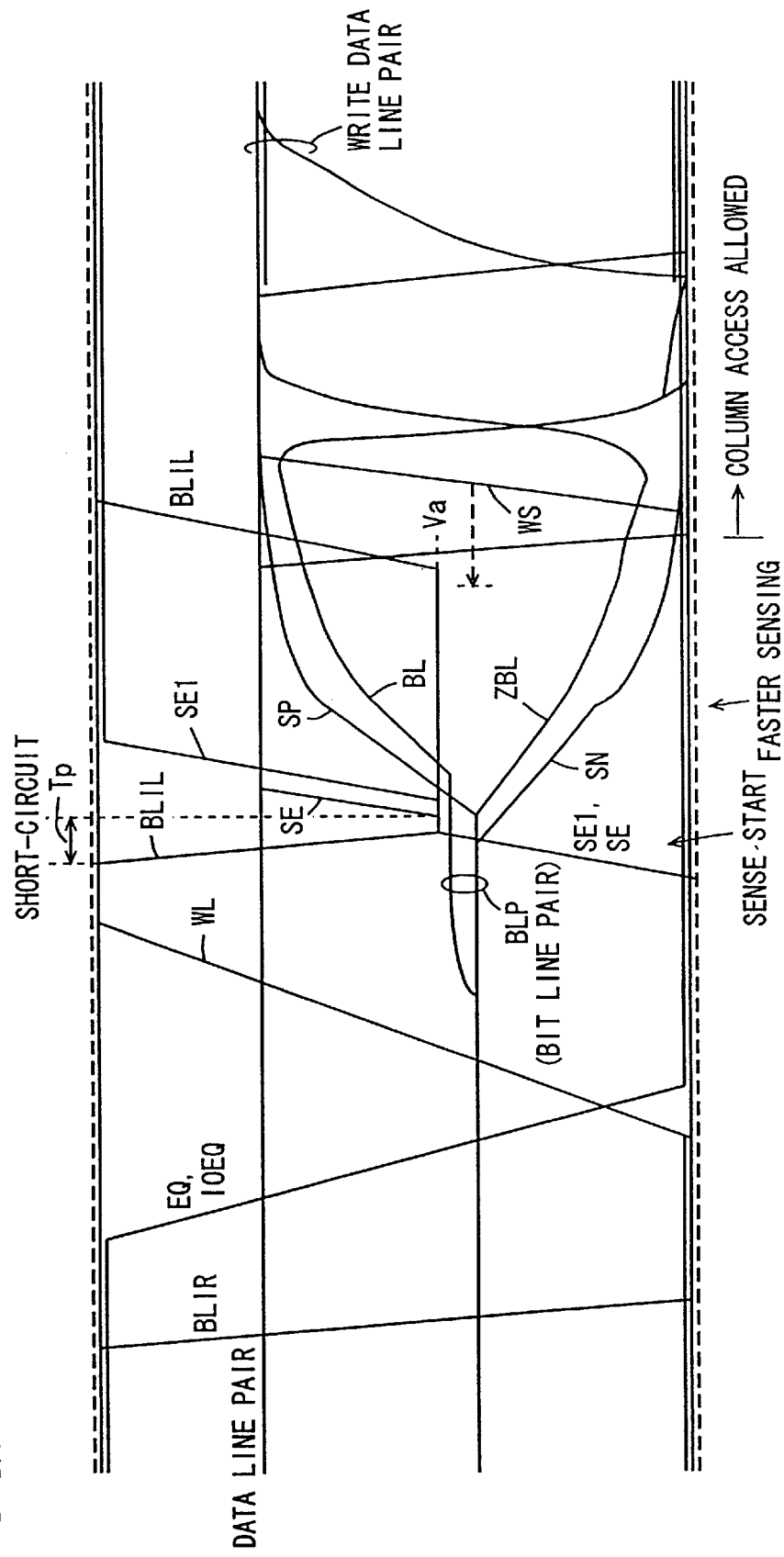
FIG. 36 is a signal waveform diagram representing an operation of the circuits shown in FIGS. 33 through 35 in data writing.

As shown in FIG. 36, the data write timing can be set within a period of the sensing operation of sense amplifier circuit SA so that the data writing can be performed fast.

In the signal waveforms shown in FIG. 36, the activation timing of write pulse WS may be set earlier than the timing of voltage rising of bit line isolation instructing signal BLIL.

By lowering bit line isolation instructing signal BLIL to the intermediate voltage level to achieve the fast sensing operation of the sense amplifier, the time required for the sensing operation can be reduced, and the data writing can be reliably performed even in the case where the data writing is performed at an early timing after application of the row access command. Owing to this fast sensing operation, the data writing can be performed fast even if a voltage amplitude is large on the common bit lines provided with the sense amplifier circuit SA because the voltage amplitude on the sense nodes of the sense amplifier circuit is smaller than that in the subsequent write cycles if the data writing is performed during the sensing operation. By performing the data writing while bit line isolation instructing signal BLIL is at the intermediate voltage level, the write driver is not required to drive the bit line load so that the fast writing can be achieved.

Figure 37:
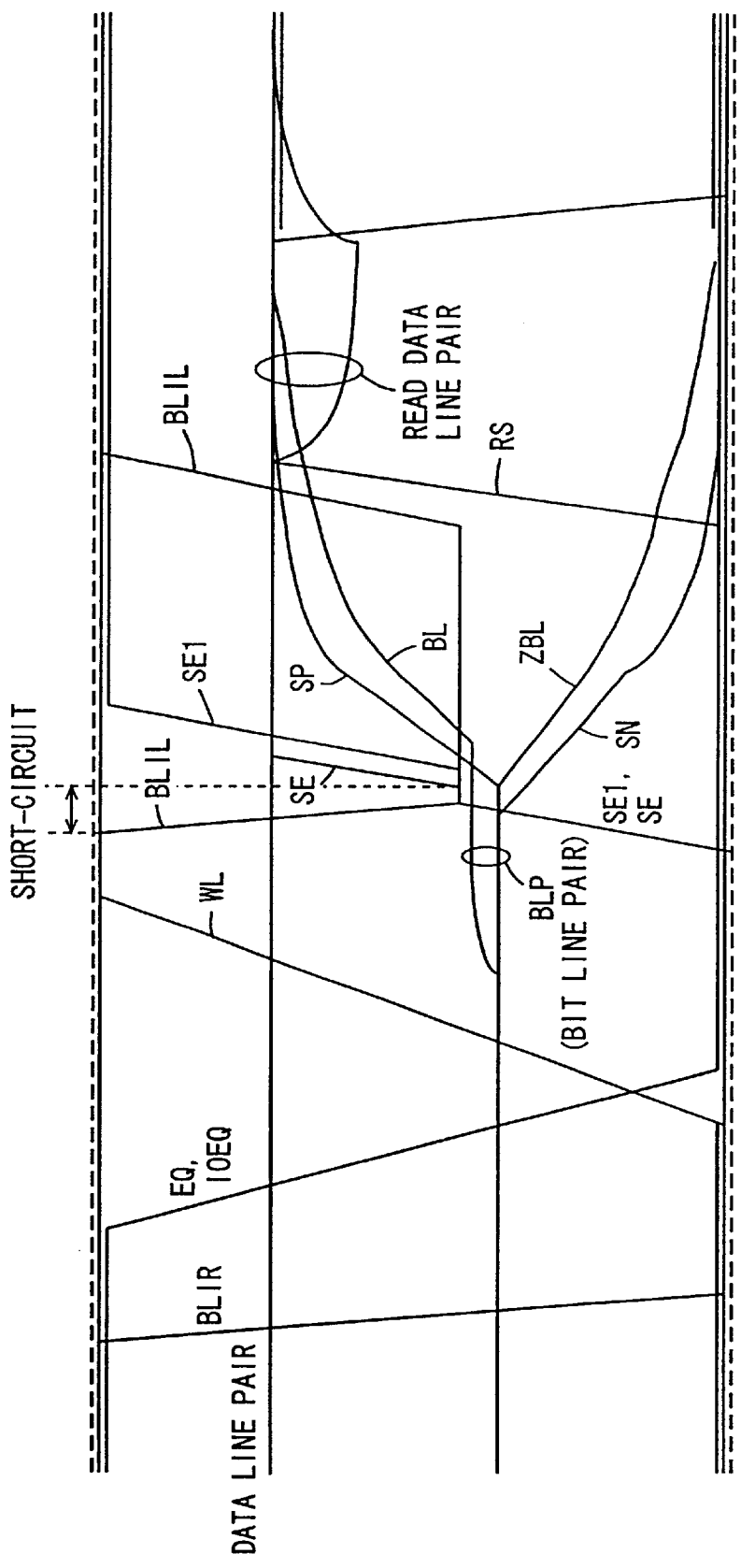
FIG. 37 is a signal waveform diagram representing an operation of the circuits shown in FIGS. 33 through 35 in data reading.

FIG. 37 shows signal waveforms in data reading in the fourth embodiment of the invention. In the signal waveform diagram of in FIG. 37, the operation similar to the operation shown in FIG. 36 is performed after bit line isolation instructing signal BLIL is held at the intermediate voltage level and before it is driven to boosted voltage Vpp level. After this bit line isolation instructing signal BLIL is driven to boosted voltage BIL, read pulse (read source select signal) RS is driven to the selected state for a predetermined period, and the signals on the common bit lines are transmitted onto the read data line pair via a read gate amplifier (not shown). In the read operation, read pulse RS has a pulse width larger than those in the subsequent read cycles, so that a sufficiently large voltage difference can occur on the read data line pair.

In this case, sense amplifier circuit SA performs the faster sensing operation, to provide a sufficiently large voltage amplitude on the common bit lines so that the data can be read accurately.

In the fourth embodiment, the read gate amplifier may be formed of a conventional transfer gate, and in other words, may not be formed of a differential transistor pair having gates connected to the bit lines. Even by such a structure, the data reading can be performed accurately, provided that the amplitudes of the voltages on common bit lines BL and ZBL are sufficiently increased so as to prevent the sense data of the sense amplifier circuit from inverting even at the time of connection of the common bit lines to the read data line pair at the time of generation of read pulse RS in the sensing operation of sense amplifier circuit SA,.

The fourth embodiment can be applied to the case where the transfer gate can be utilized for the read and write column select gates, and the case where the read and write data lines are formed of the common internal data lines.

In the fourth embodiment, if the pulse width and the activation timing of the read pulse and the write pulse are the same in all the column access cycles, the operation of the sense amplifier circuit is merely completed at an early timing after application of the row access command so that the column access can be performed at an early timing, and the fast access can be achieved. In this case, therefore, the fast access can be achieved even in such a case that the access timing in the first column access is not changed from that in the subsequent column access.

Further, the read pulse generation may be performed before the operation of raising the voltage of bit line isolation instructing signal BLIL.

According to the fourth embodiment of the invention, as described above, the gate for bit line isolation is set to a high on-resistance state at the time of start of the sensing operation, and is set to a low on-resistance state after the voltage levels on the common bit lines are sufficiently developed. Accordingly, the drive load of the sense amplifier circuit can be reduced at the time of start of the sensing operation, and the sensing operation can be performed fast.

Since the bit line isolation gate is set to a high on-resistance state by equalizing the bit line isolation instructing signal and the sense amplifier drive signal, complicated timing control is not required.

Since the sensing operation is performed fast, the column access can be executed at an early timing after application of a row access command, and therefore the semiconductor memory device allowing fast access is implemented.

[Modification]

Figure 38:
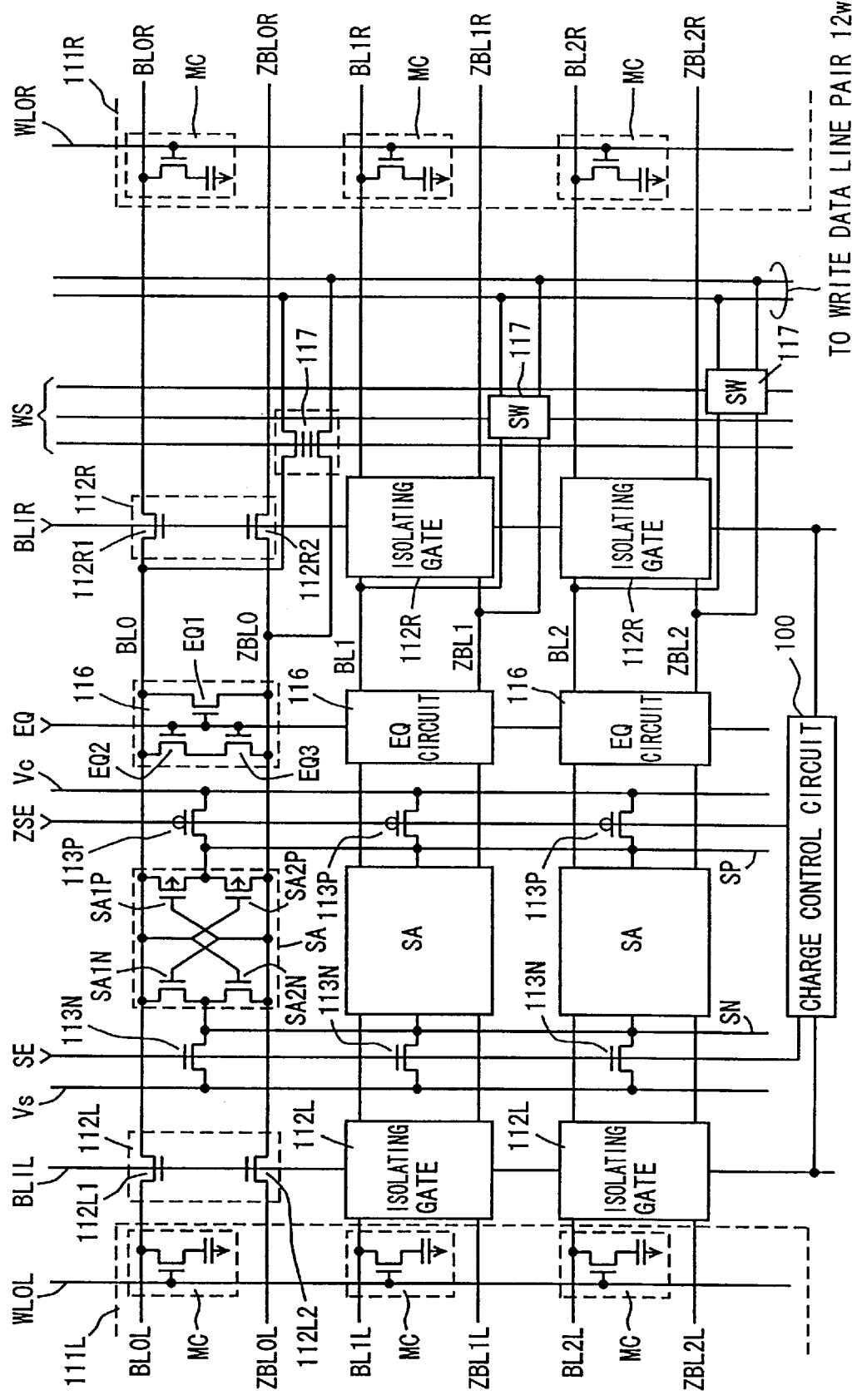
FIG. 38 shows a modification of the fourth embodiment of the invention.

FIG. 38 shows a structure of a modification of the fourth embodiment of the invention. In the structure shown in FIG. 38, p-channel MOS transistor 113P is used as a sense amplifier drive transistor for sense amplifier circuit SA. For driving sense amplifier drive transistors formed of the p-channel MOS transistors, a sense amplifier drive signal ZSE set to the level of power supply voltage Vcc during standby is used. Structures other than the above are the same as those shown in FIG. 33, and the corresponding portions bear the same reference numerals, and will not be described. FIG. 38 does not show the read gate amplifier.

Charge control circuit 100 has a structure similar to that shown in FIG. 34. When the sense amplifier is made active, bit line isolation instructing signal BIL in the selected state is set to the electrically floating state, and bit line isolation instructing signal BIL in the selected state and the sense amplifier drive signals SE and ZSE are all short-circuited to attain the equalized voltage level. The operation of the structure shown in FIG. 38 will now be described with reference to a signal waveform diagram of FIG. 39.

During standby, bit line isolation instructing signals BLIR and BLIL are at boosted voltage Vpp level, and equalize instructing signals EQ and IOEQ are at H-level. Sense amplifier drive signal SE is at ground voltage Vss level, and sense amplifier drive signal SE is at power supply voltage Vcc level. Common source nodes SN and SP are equalized to the intermediate voltage level by an equalize circuit (not shown) during standby.

Bit line isolation instructing signal BIR for the unselected memory block falls from H-level to L-level, and sense amplifier circuit SA is isolated from memory block 111R (the bank designating signal and the row block designating signal determine the selected and unselected memory blocks).

Then, the row selection is performed in accordance with the address signal, and the potential on a selected word line WL rises to boosted voltage Vpp level. In accordance with this voltage rising of the selected word line WL, data of the memory cells connected to the selected word line is read onto the corresponding bit lines.

Then, main sense amplifier drive signal MSE is activated at the predetermined timing. Responsively, sense amplifier drive signals SE and ZSE as well as bit line isolation instructing signal BLIL are equalized under the control of charge control circuit 100. Equalizing is performed by the pulse signal generated from pulse generating circuit 150 shown in FIG. 30. The voltage levels of bit line isolation instructing signal BLIL and sense amplifier drive signal ZSE lower, and the voltage level of sense amplifier drive signal SE rises. Equalized voltage Vb of these signals BLIL, ZSE and SE depends on the load capacitance of the signal lines transmitting these signals as well as the voltage levels of these signals at generation of the pulse signal. However, these signals satisfy a relationship of Vss<Vb<Vpp.

Figure 39:
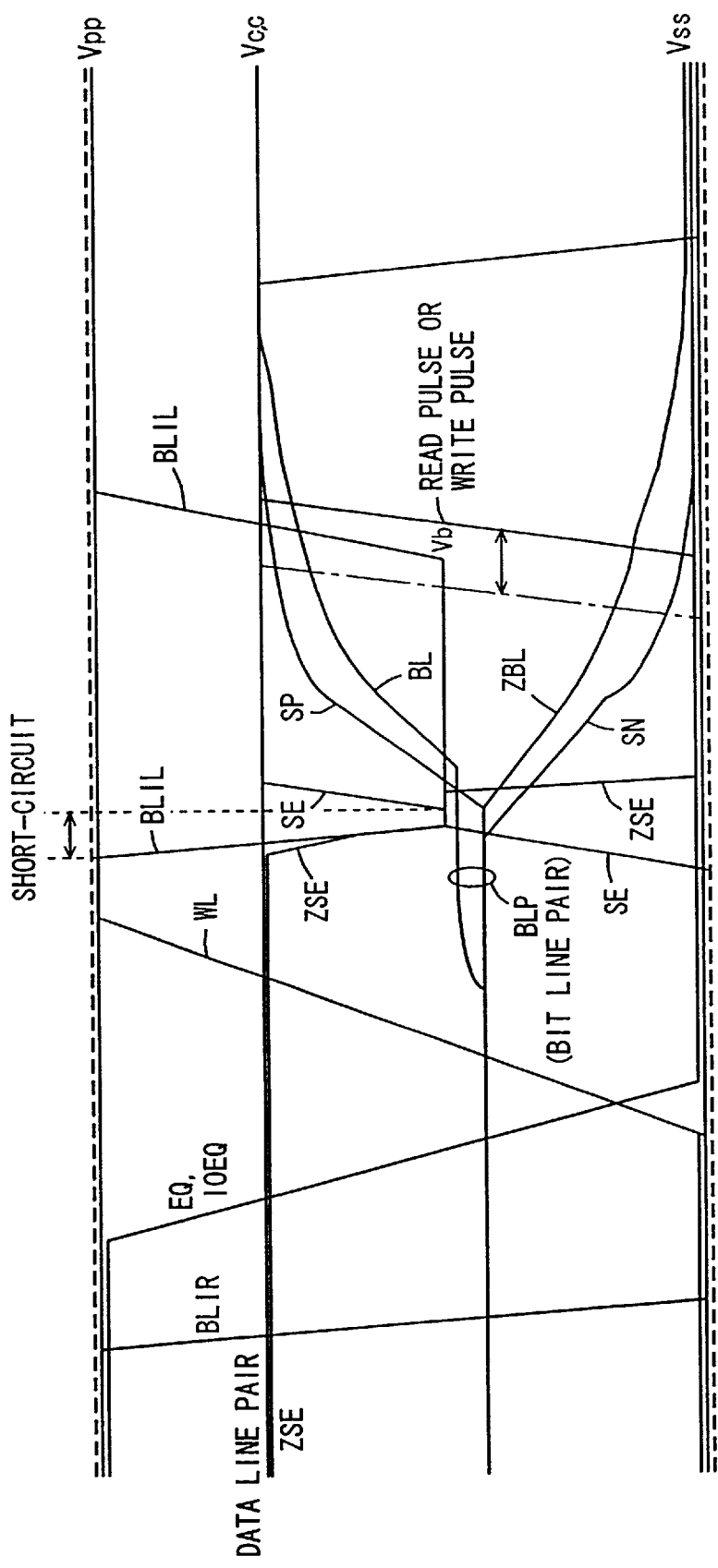
FIG. 39 is a signal waveform diagram representing an operation of the structure shown in FIG. 38.
Figure 40:
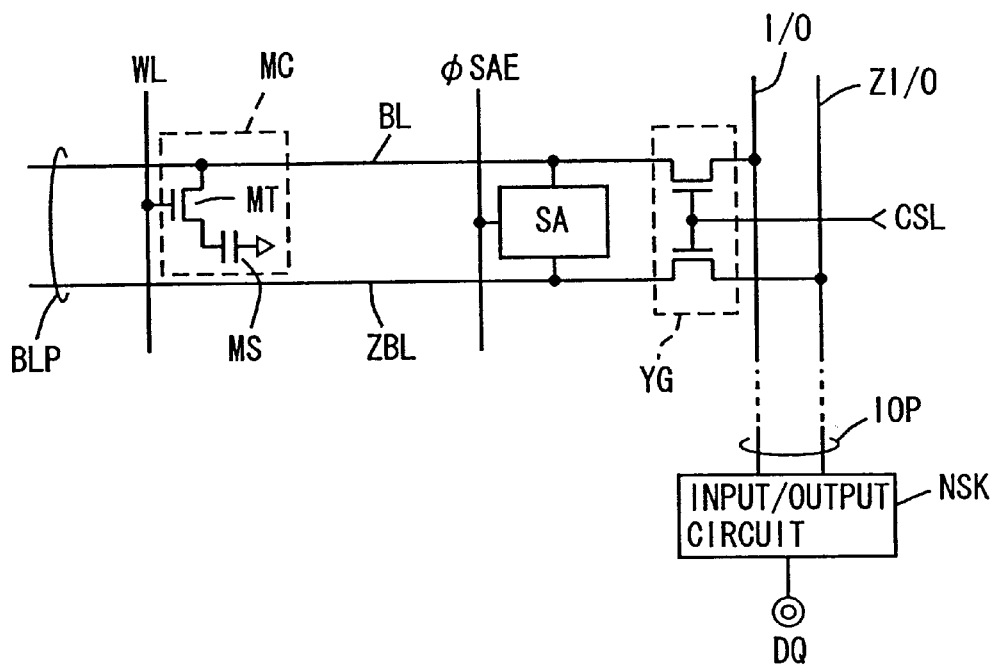
FIG. 40 schematically shows a structure of a main portion of a conventional dynamic semiconductor memory device.
Figure 41:
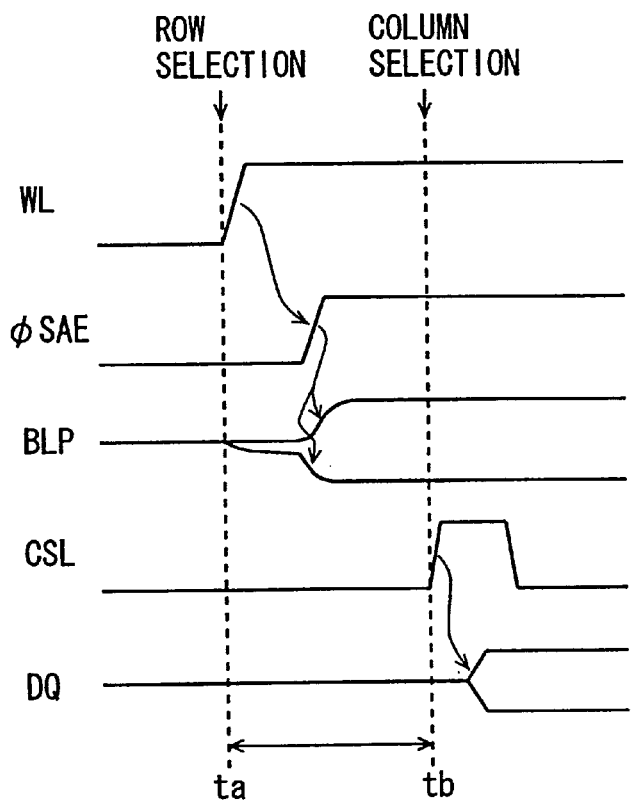
FIG. 41 is a signal waveform diagram representing an operation of the circuit shown in FIG. 40.
Figure 42:
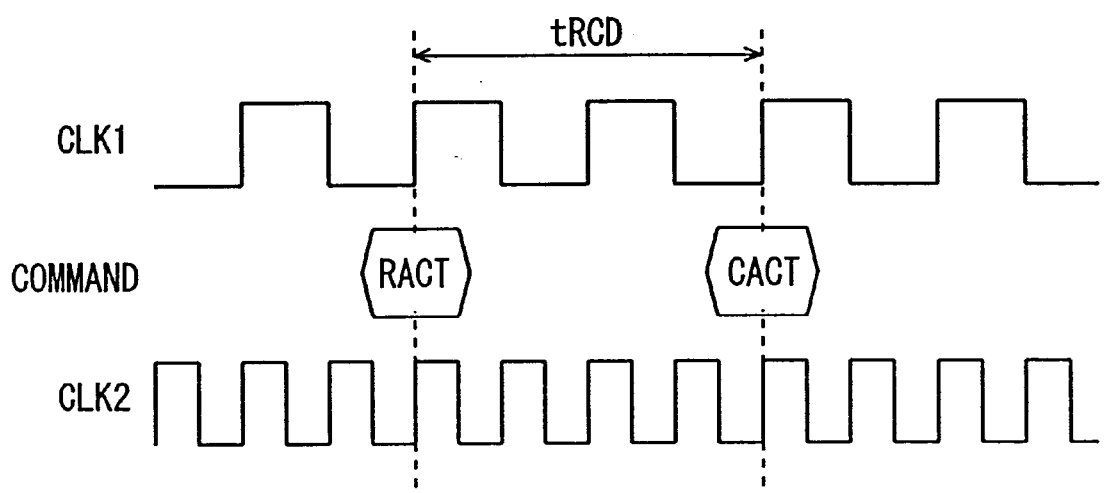
FIG. 42 shows command application sequence of a conventional clock synchronous semiconductor memory device.

The voltage level of sense amplifier drive signal SE rises, and the voltage level of sense amplifier drive signal ZSE lowers so that the sense amplifier circuit SA starts the sensing operation. In FIG. 39, the common P-source node SP is held at the intermediate voltage level during the equalizing period (short-circuit period) because sense amplifier drive transistor 113P does not attain a deep on state, compared with sense amplifier drive transistor 113N formed of an n-channel MOS transistor, even when the voltage level of sense amplifier drive signal ZSE lowers. This is because the equalized voltage Vb attains a level higher than the intermediate voltage.

In accordance with the lowering of voltage level of common N-source node SN, the N-sense amplifier formed of n-channel MOS transistors operates in sense amplifier circuit SA, and lowers the voltage level of bit line ZBL. During this equalizing period, the voltage level of equalized voltage Vb may turn on P-sense amplifier drive transistor 113P to raise the voltage level on P-common source node SP for raising the voltage level of bit line BL. Owing to lowering of the voltage level of bit line isolation instructing signal BLIL, the isolating gate 112L attains a high on-resistance state, and the drive load of sense amplifier circuit SA is reduced. In this state, sense amplifier activating signals SE and ZSE are driven to H- and L-level, respectively, so that sense amplifier circuit SA operates. Since the drive load of sense amplifier circuit SA is small, the sensing operation is performed fast, and the voltage levels between common bit lines BL and ZBL are rapidly developed.

When the sensing operation of sense amplifier circuit SA sufficiently enlarges the potential difference between common bit lines BL and ZBL, bit line isolation instructing signal BLIL returns to boosted voltage Vpp level. Thereby, sense amplifier circuit SA drives the bit lines fast, similarly to the foregoing embodiments.

The bit line isolation instructing signal BLIL rises to boosted voltage Vpp level at the time when increase in drive load of sense amplifier circuit SA does not cause a malfunction of sense amplifier circuit SA. Accordingly, the read or write pulse can be generated to perform the column access immediately after rising of bit line isolation instructing signal BLIL to boosted voltage Vpp level. The column selection can be performed for writing or reading data before completion of the sensing operation of sense amplifier circuit SA.

The read or write pulse may be generated before bit line isolation instructing signal BLIL is driven to boosted voltage Vpp level as shown by a chain line in FIG. 39. However, such a condition is required that the change in voltage on common bit lines BL and ZBL through increase in load of sense amplifier circuit SA by driving of bit line isolation instructing signal BLIL to boosted voltage Vpp level exert no disadvantageous effect on the read and write operations.

In the structure of the foregoing modification, the voltage level of bit line isolation instructing signal is lowered to reduce the drive load of sense amplifier circuit SA so that the fast sensing operation can be achieved. Accordingly, the column selection can be performed at early timing, and the column access can be performed at early timing after application of a row access command.

The scheme for fast sensing operation which is achieved in the fourth embodiment of the invention by short-circuiting and equalizing in voltage of the bit line isolating gate and the sense amplifier drive signal, can be applied to a conventional dynamic semiconductor memory device. Thus, the fourth embodiment can be applied to the structure where the read data and the write data are transmitted via the common data lines.

The fourth embodiment can be applied to a semiconductor memory device in which every column access is performed at the same timing with the same access period after application of a row access command. In this case, fast access is achieved. Accordingly, the fourth embodiment can be applied to various kinds of dynamic semiconductor memory devices, independently of the first to third embodiments.

However, the structure of the fourth embodiment may be combined with the structures of first to third embodiments, whereby the access time can be reduced in the clock synchronous semiconductor memory device operating in accordance with a faster clock signal, and a high speed dock synchronous semiconductor memory device can be achieved. This is owing to the fact that the faster sensing operation can advance the timing for generation of the read and write pulses.

According to the invention, as described above, the generation timing and/or pulse width of the internal control pulse signal determining an operation mode are made variable. Therefore, the internal operations can be performed in accordance with the internal control pulse signals at an optimum timing depending on an operation sequence so that the semiconductor memory device capable of fast operation can be implemented.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device comprising:
   a plurality of control signal lines each for transmitting a control signal for controlling a predetermined operation; and
   control circuitry for electrically shorting at least two control signal lines of said plurality of control signal lines for a predetermined time period upon starting said predetermined operation, said at least two control signal lines each transmitting its respective control signal to a control gate of a transistor performing said predetermined operation.

2. The semiconductor memory device according to claim 1, further comprising:
a memory array having a plurality of memory cells arranged in rows and columns;
sense amplifiers arranged corresponding to the columns of the memory cells, for sensing and amplifying data of corresponding columns when activated;
bit line isolation gates provided between said memory array and said sense amplifiers, for isolating the columns of the memory array and the sense amplifiers when activated; wherein
the control signal lines includes a sense amplifier activating signal transmitting line for transmitting a sense amplifier activation signal for activating the sense amplifiers, and a bit line isolation control signal transmitting line for transmitting a bit line isolation control signal for controlling operation of the bit line isolation gates; and
said control circuitry electrically short-circuits the sense amplifier activating signal transmitting line and the bit line isolation signal transmitting line.

3. The semiconductor memory device according to claim 1, further comprising:
first and second memory blocks each having a plurality of memory cells arranged in rows and columns;
sense amplifiers arranged corresponding to the columns of the memory cells of the first and second memory blocks and shared between the first and second memory blocks, for sensing and amplifying data of corresponding columns in response to a sense amplifier activating signal;
first bit line isolation gates provided between said first memory block and said sense amplifiers, for isolating the columns of the first memory block and the sense amplifiers in response to a first bit line isolation control signal;
second bit line isolation gates provided between the second memory block and said sense amplifiers, for isolating the columns of the second memory block and the sense amplifiers in response to a second bit line isolation control signal; wherein
the control signal lines includes a sense amplifier control signal line for transmitting the sense amplifier activating signal, a first bit line control signal line for transmitting the first bit line isolation control signal, and a second bit line isolation control signal line for transmitting the second bit line isolation control signal; and
said control circuitry electrically short-circuits the sense amplifier control signal line and either of the first and second bit line isolation control lines.

4. The semiconductor memory device according to claim 1, wherein said control circuitry drives each of said at least two control lines to a predetermined voltage level after elapse of a prescribed time period since the electrical short of said at least two control signal lines.

5. The semiconductor memory device according to claim 2, wherein said control circuitry drives the sense amplifier activating signal transmitting line to a logical high level after the electrical short-circuit, and drives the bit line isolation control signal transmitting line to the logical high level after the electrical short-circuit.

6. The semiconductor memory device according to claim 3, wherein said control circuitry drives the sense amplifier control line to a logical high level after elapse of a predetermined time period since the electrical short-circuit, and drives the either of the bit line isolation control signal line to the logical high level after elapse of a prescribed time period since the electrical short-circuit, the bit line isolation control signal being rendered conductive in response to the logical high level of the corresponding bit line isolation control signal.

7. The semiconductor memory device according to claim 2, wherein the sense amplifiers are activated in response to the sense amplifier activation signal when the bit line isolation control signal is at an intermediate voltage level after the electrical short-circuit.

8. The semiconductor memory device according to claim 3, wherein the sense amplifiers are activated in response to the sense amplifier activating signal on the sense amplifier control signal line when the bit line isolation control signal on the either of the first and second bit line isolation control lines is at an intermediate voltage level.

9. The semiconductor memory device according to claim 1, wherein said control circuitry electrically shorts said at least two control signal lines for the predetermined time period upon starting the control signals on said at least two control signal lines at predetermined voltage levels, and the control signals on said at least two control lines are each driven to each respective predetermined voltage level after completion of the shorting.

10. The semiconductor memory device according to claim 9, wherein said plurality of control signal lines includes a first control signal line for transmitting a first signal of a low level, and a second control signal line for transmitting a second signal of a high level, and said control circuitry electrically short-circuits the first and second control signal lines.

* * * * *